(12) United States Patent
Kajiyama

(10) Patent No.: US 8,503,216 B2
(45) Date of Patent: Aug. 6, 2013

(54) RESISTANCE CHANGE TYPE MEMORY

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 498 days.

(21) Appl. No.: 12/887,437

(22) Filed: Sep. 21, 2010

(65) Prior Publication Data

US 2012/0008367 A1 Jan. 12, 2012

(30) Foreign Application Priority Data

Jul. 8, 2010 (JP) .................................. 2010-156159

(51) Int. Cl.
*G11C 11/00* (2006.01)

(52) U.S. Cl.
USPC .......................................... 365/148; 365/149

(58) Field of Classification Search
USPC ............. 365/80–93, 148, 158, 163, 171, 173; 257/2–5, 9, 310, E21.35; 438/95, 96, 135, 438/166, 240, 365, 482, 486, 597, 785
See application file for complete search history.

(56) References Cited

U.S. PATENT DOCUMENTS

| 7,212,432 | B2 * | 5/2007 | Ferrant et al. ................. | 365/158 |
| 7,251,154 | B2 * | 7/2007 | Hush ............................. | 365/148 |
| 7,453,716 | B2 * | 11/2008 | Kim et al. ..................... | 365/148 |
| 2005/0070033 | A1 | 3/2005 | Kajiyama et al. | |

OTHER PUBLICATIONS

Background Art Information in 1 page.

* cited by examiner

*Primary Examiner* — Alexander Sofocleous
*Assistant Examiner* — Lance Reidlinger
(74) *Attorney, Agent, or Firm* — Knobbe, Martens, Olson & Bear LLP

(57) ABSTRACT

According to one embodiment, a resistance change type memory includes a memory cell and a capacitor which are provided on a semiconductor substrate. The memory cell includes a resistance change type memory and a select transistor. The resistance change type storage element changes in resistance value in accordance with data to be stored. The select transistor includes a first semiconductor region provided in the semiconductor substrate, and a gate electrode facing the side surface of the first semiconductor region via a gate insulating film. The capacitor includes a second semiconductor region provided in the semiconductor substrate, a capacitor electrode facing the side surface of the second semiconductor region, and a first capacitor insulating film provided between the second semiconductor region and the capacitor electrode.

20 Claims, 56 Drawing Sheets

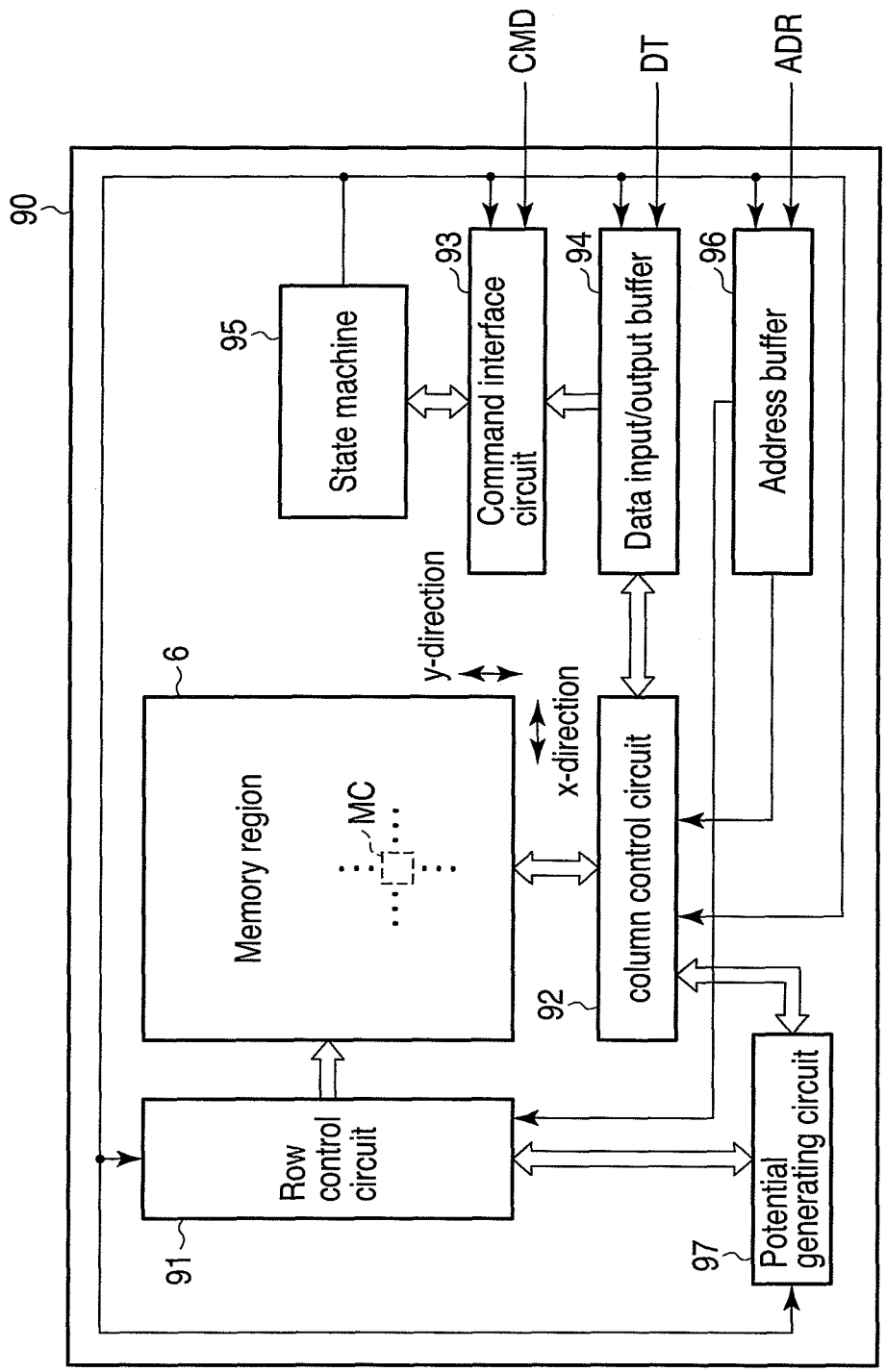
F I G. 1

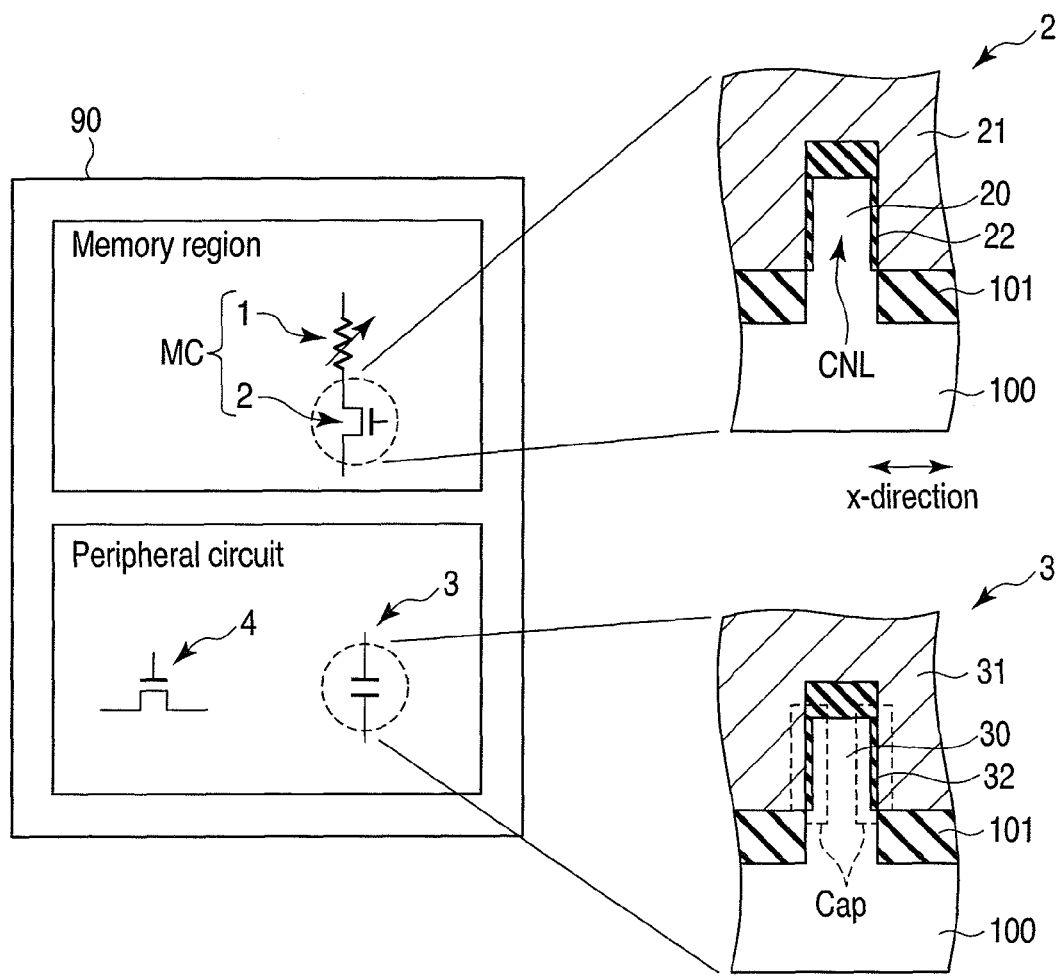
F I G. 2

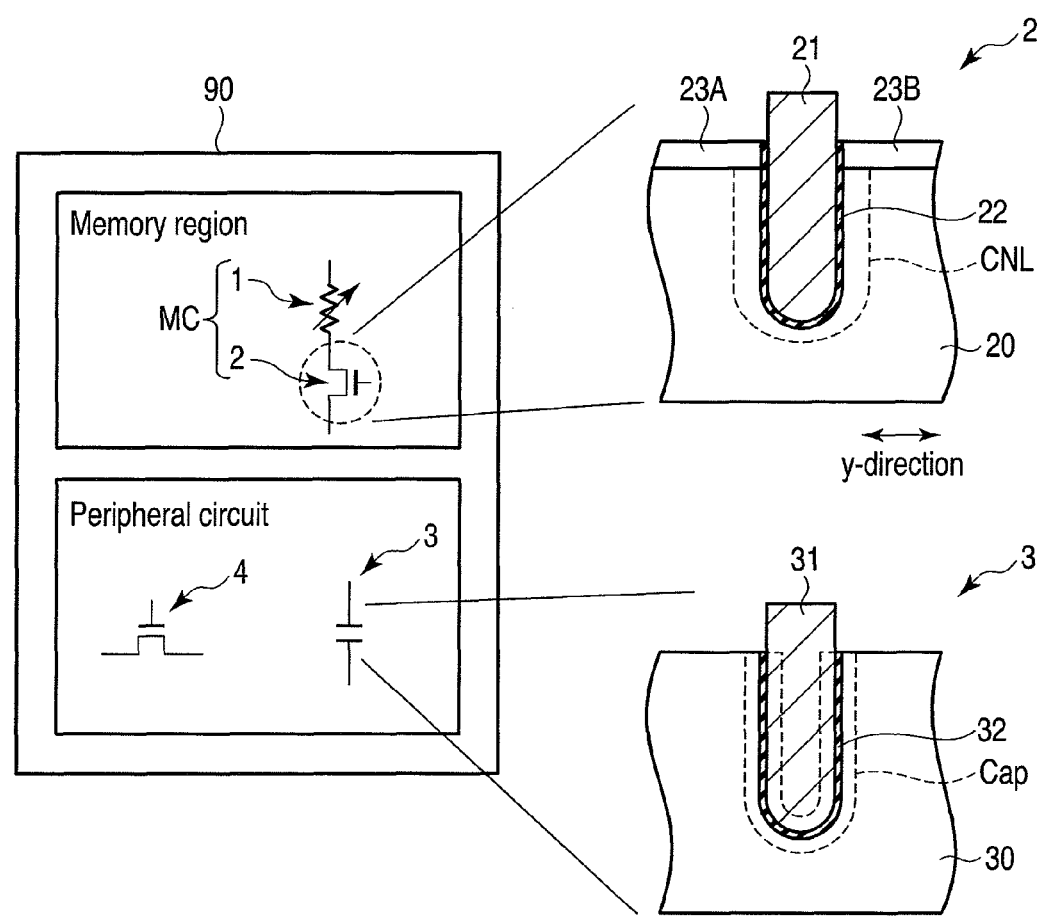
F I G. 3

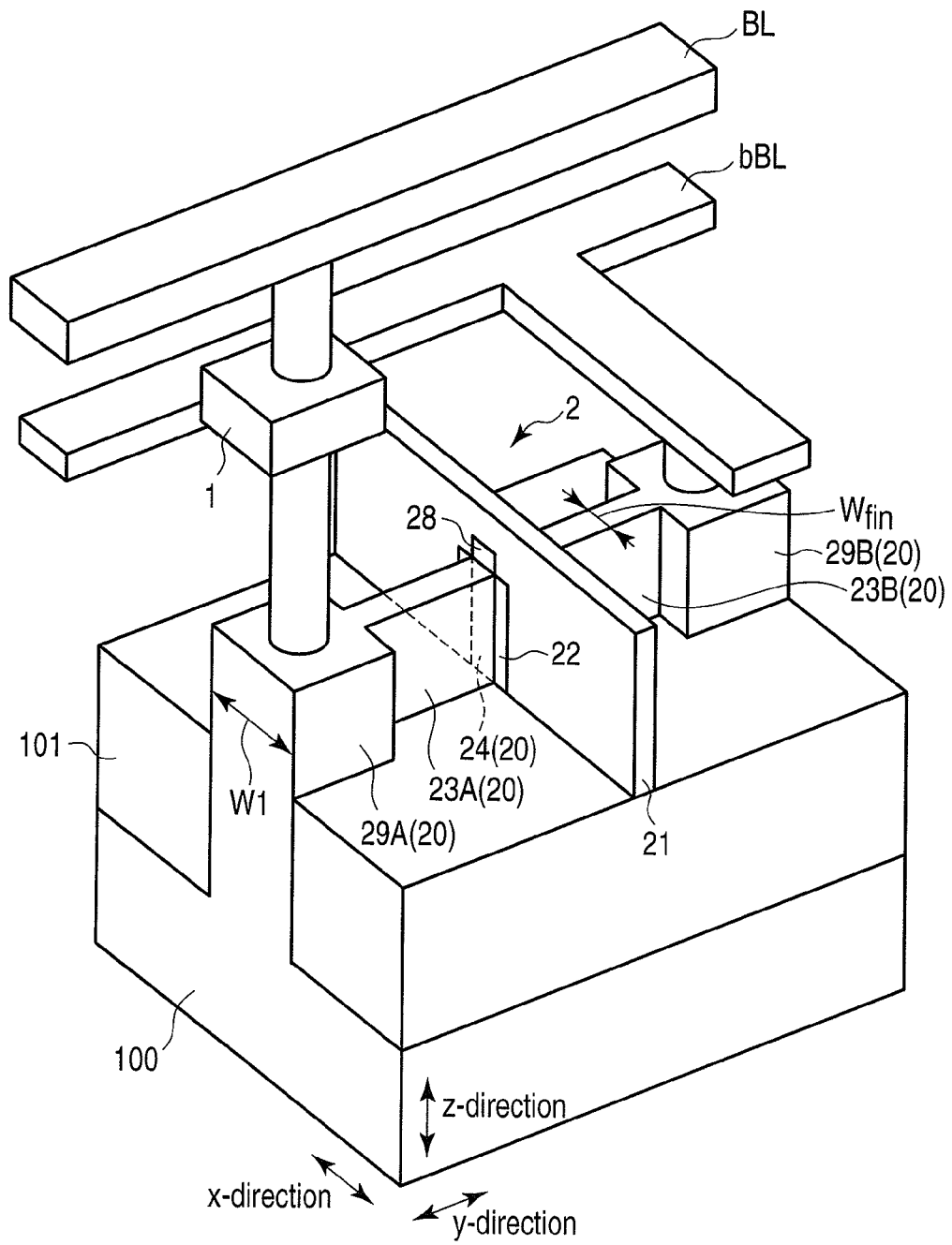
F I G. 5

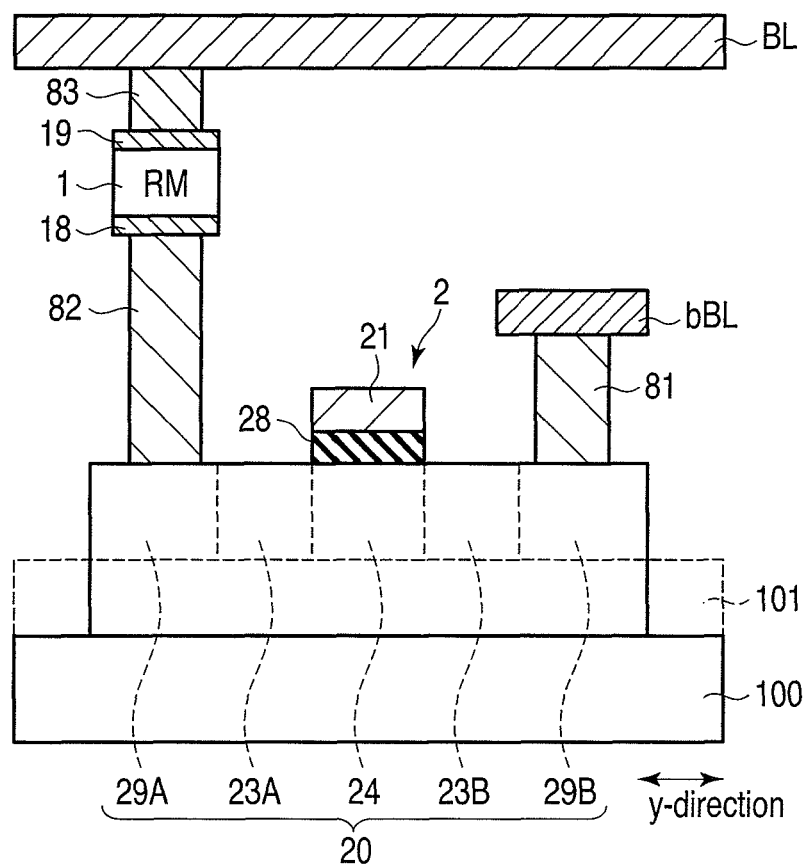
F I G. 6

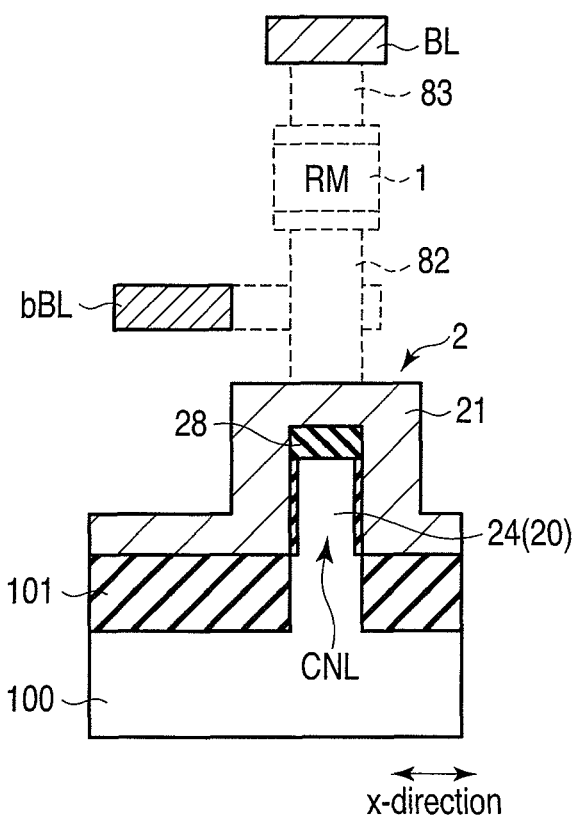
F I G. 7

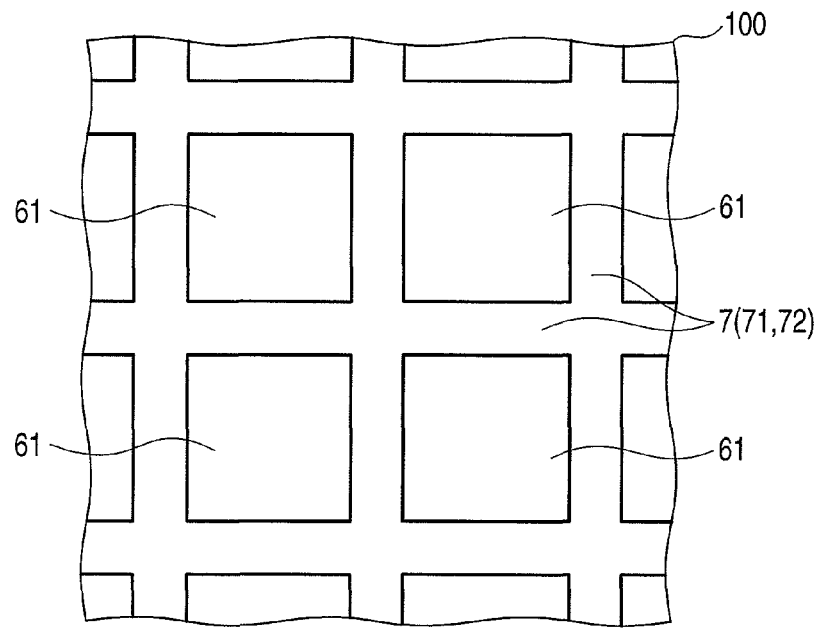
F I G. 11
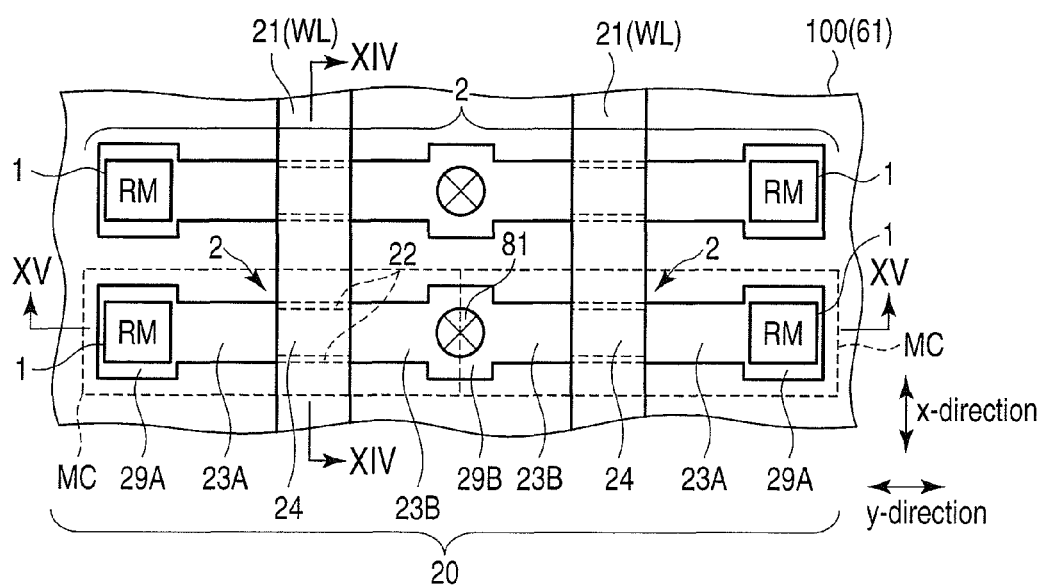
F I G. 12

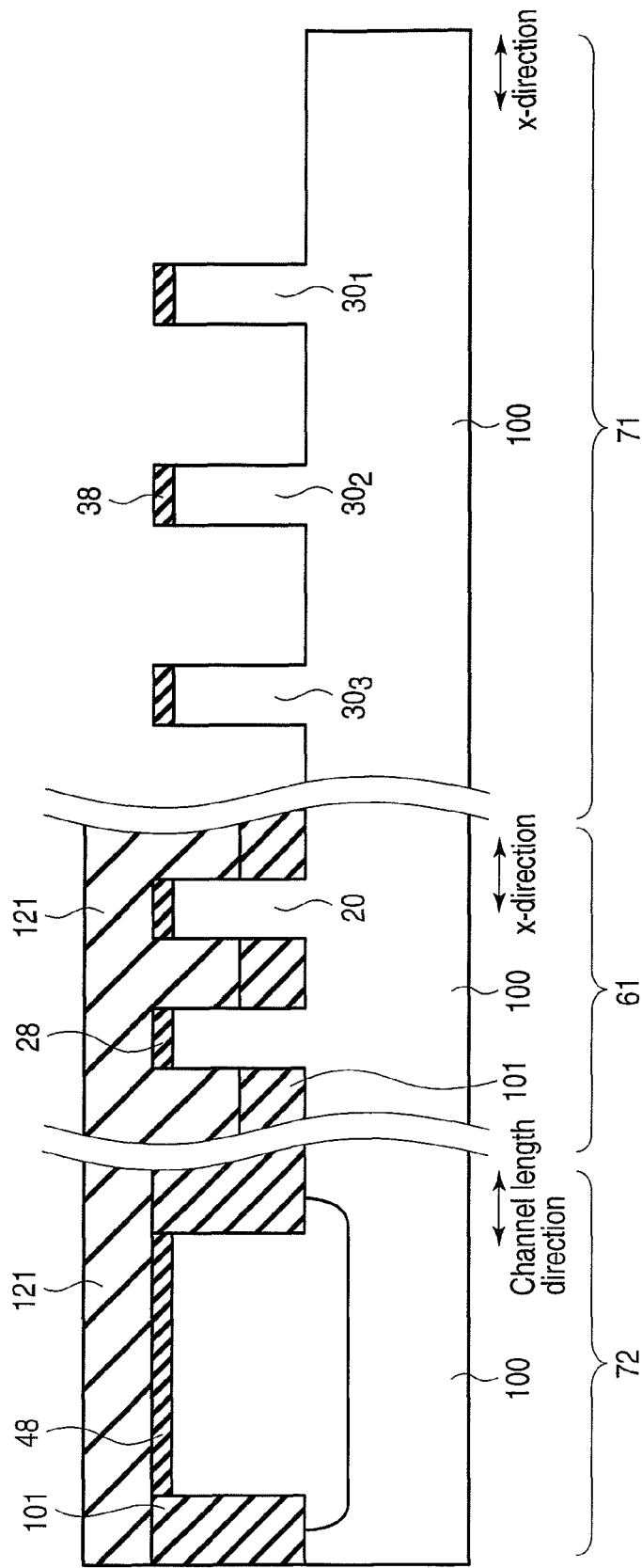
F I G. 20

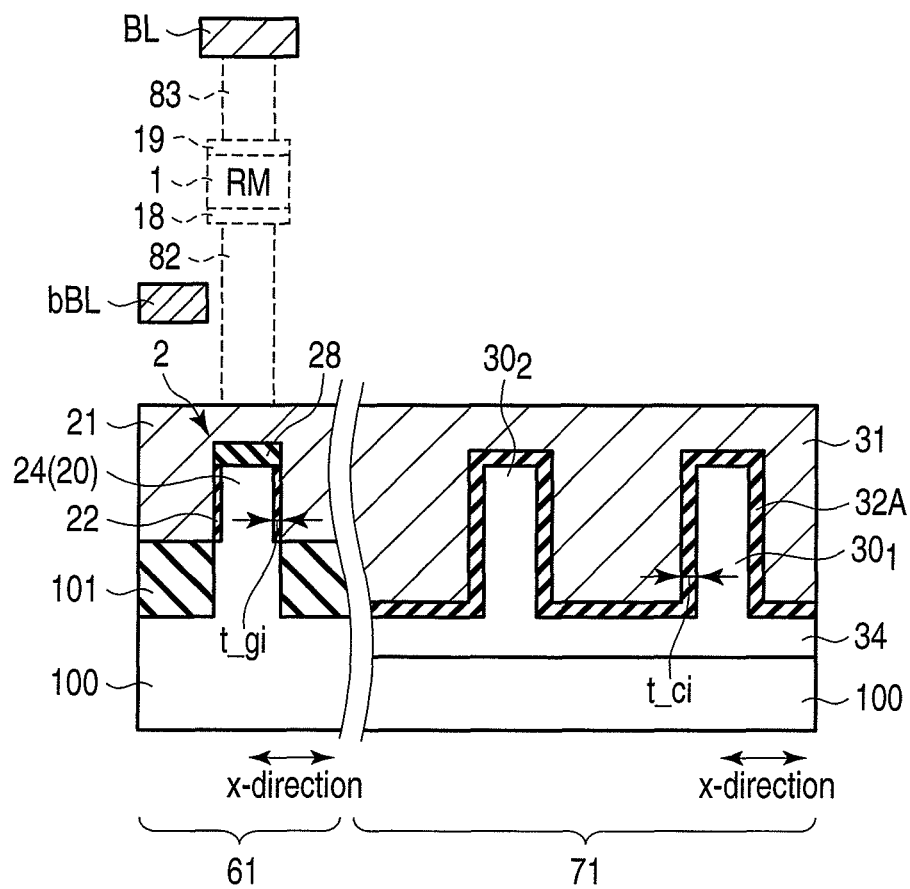
F I G. 25

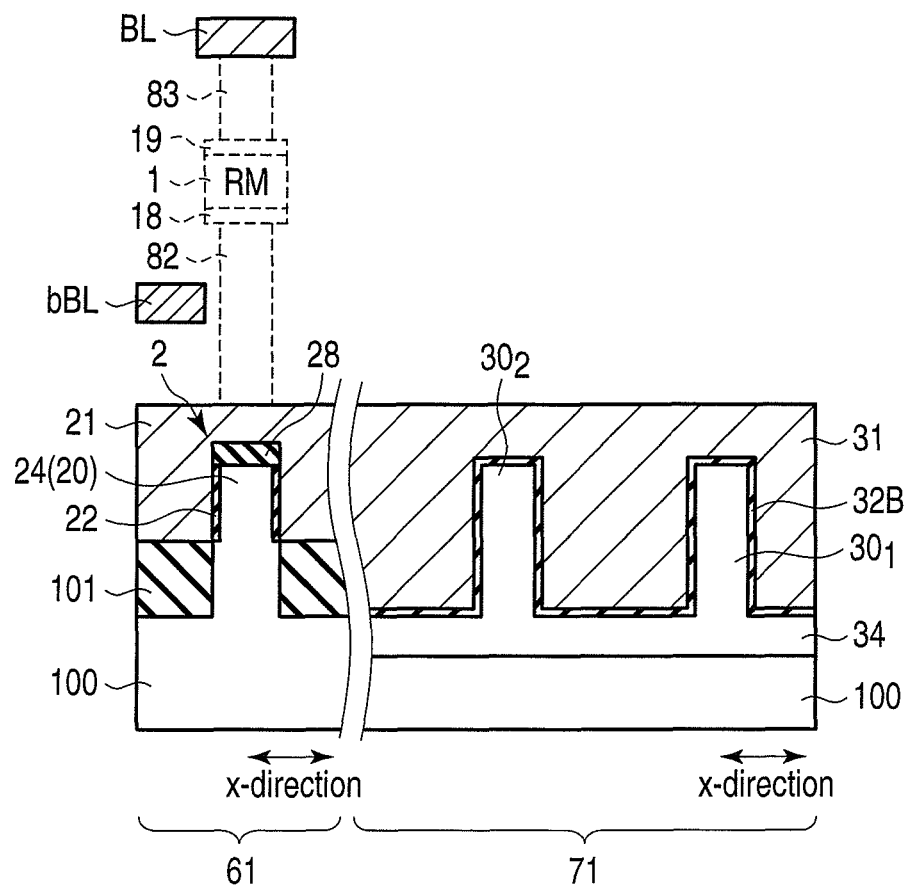
F I G. 26

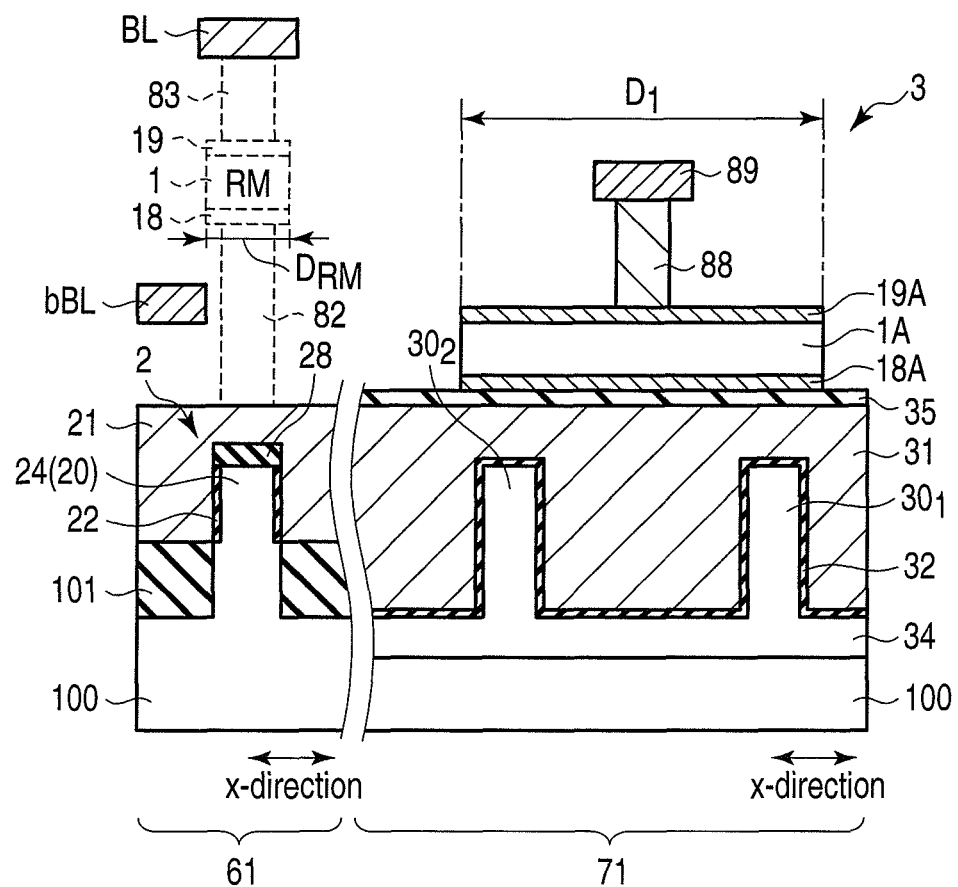
F I G. 29

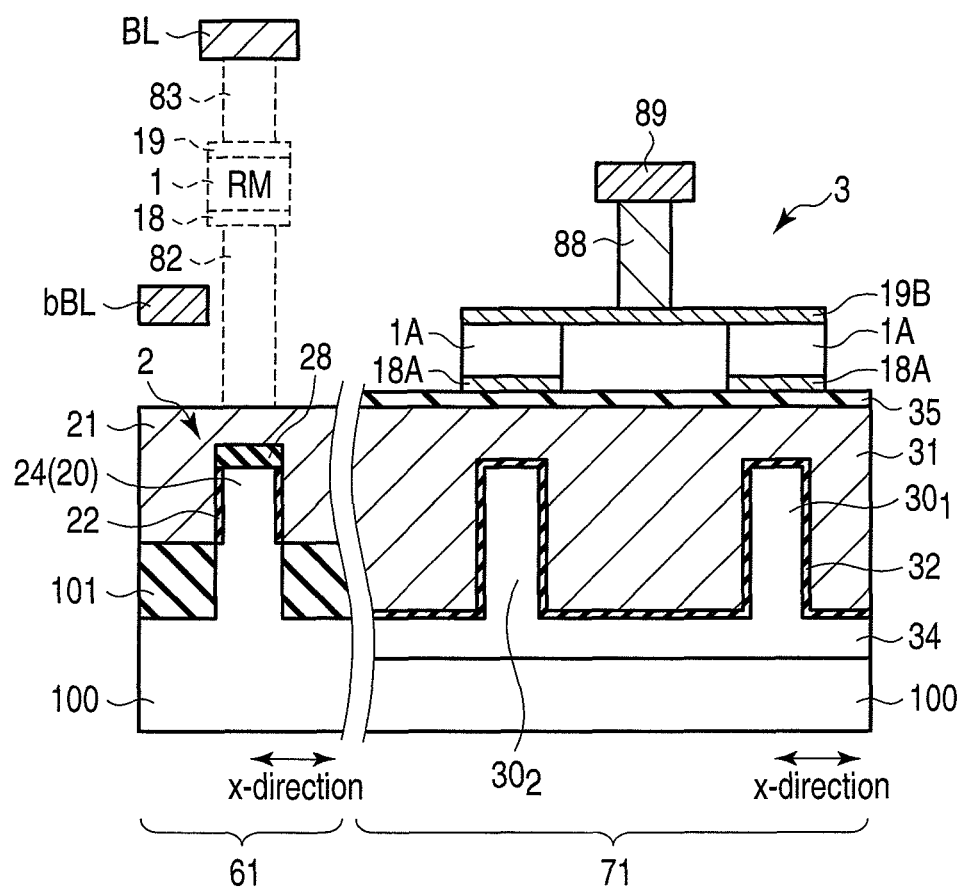
F I G. 30

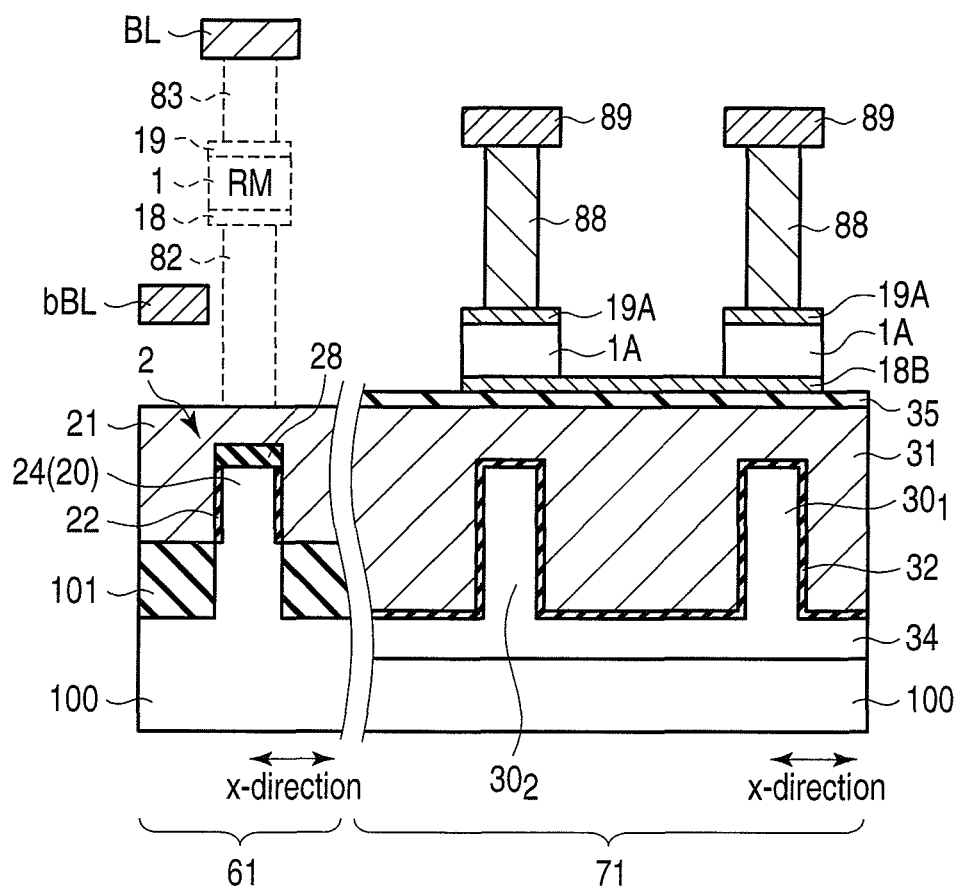
F I G. 31

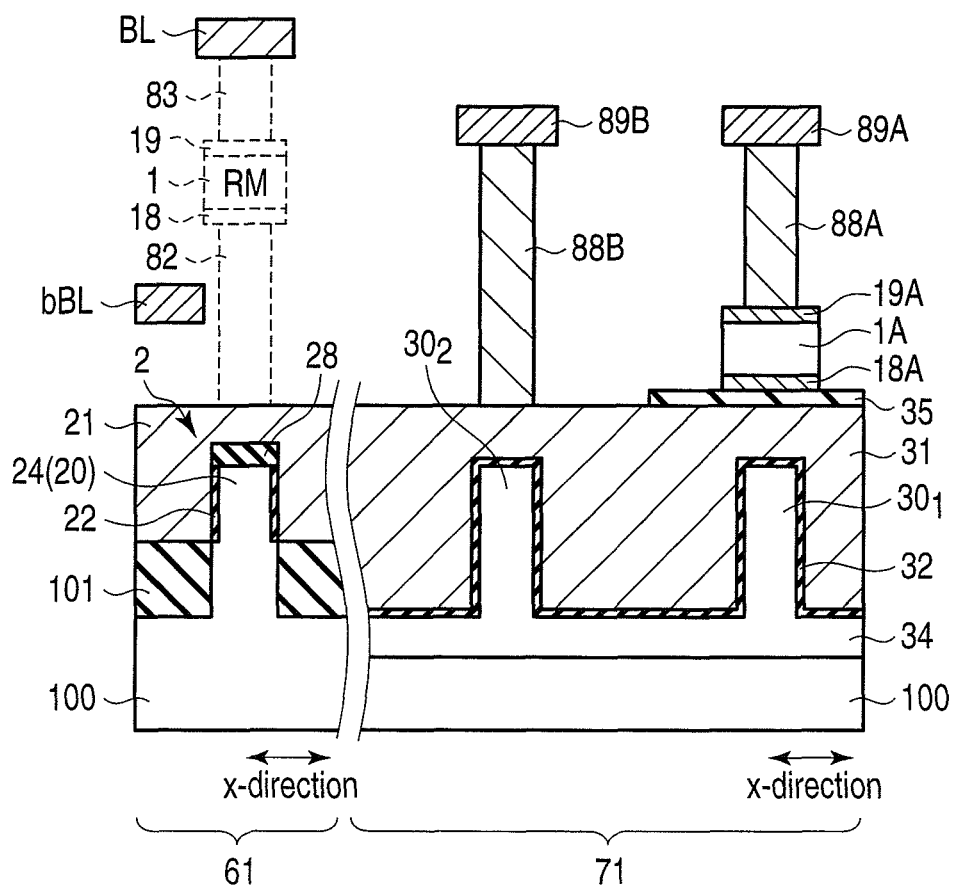
F I G. 32

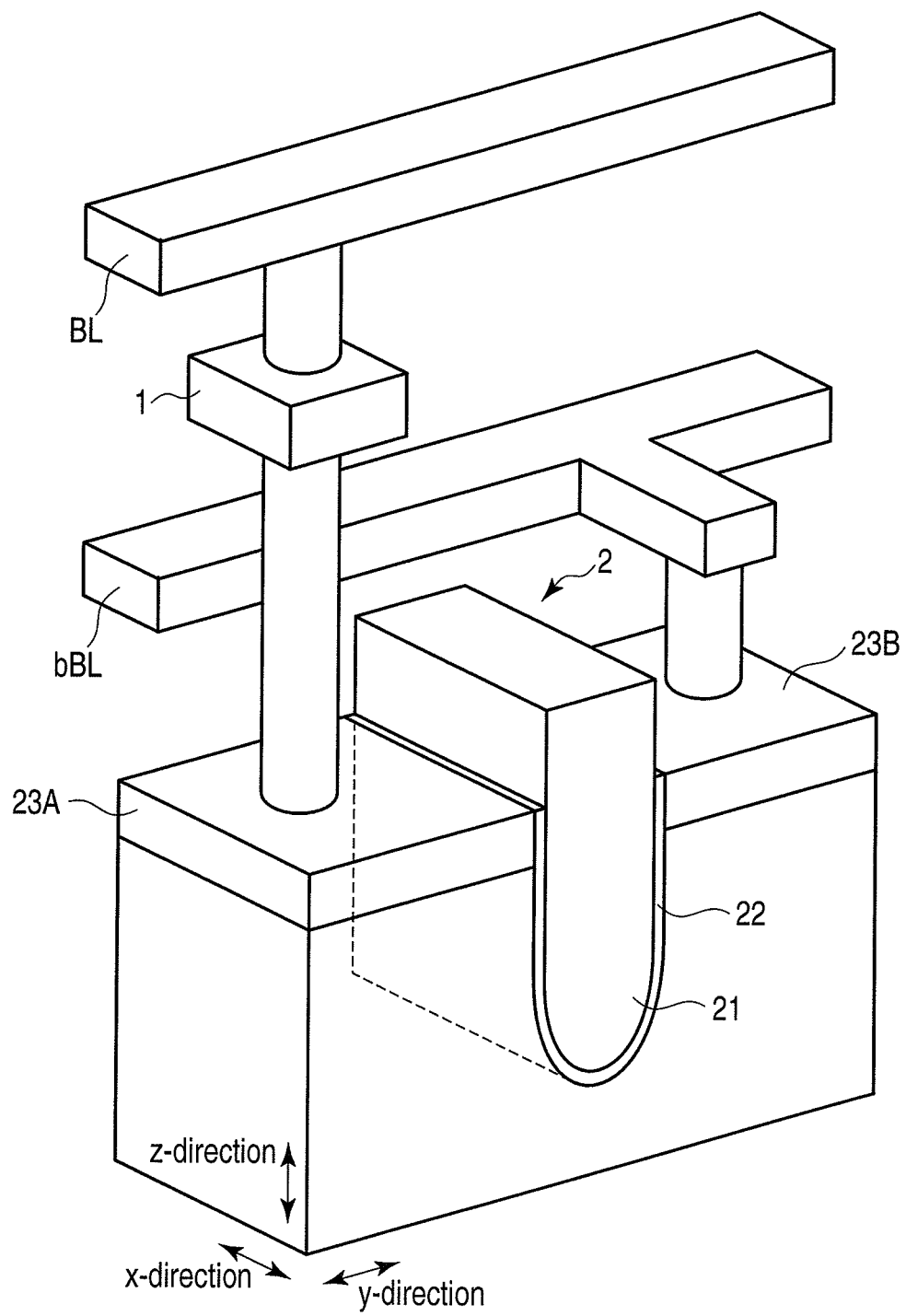
F I G. 34

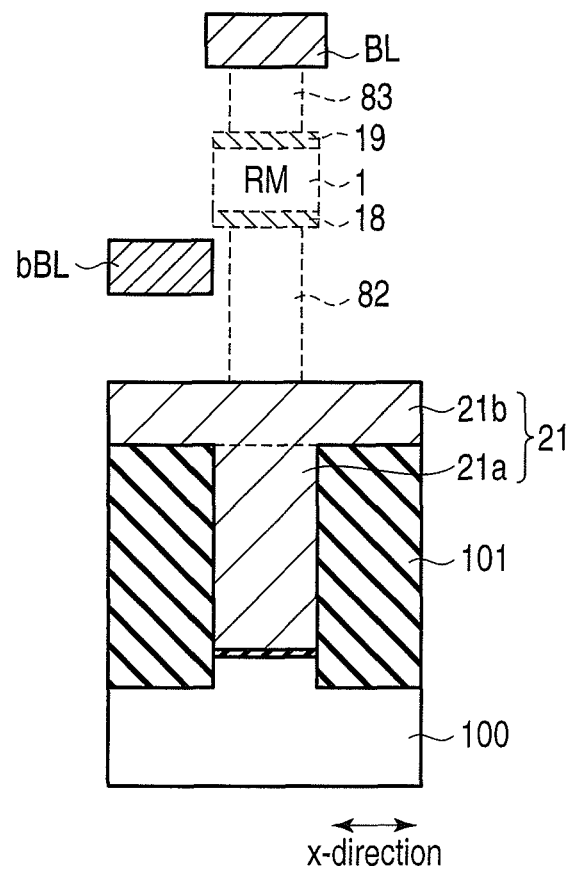
F I G. 36

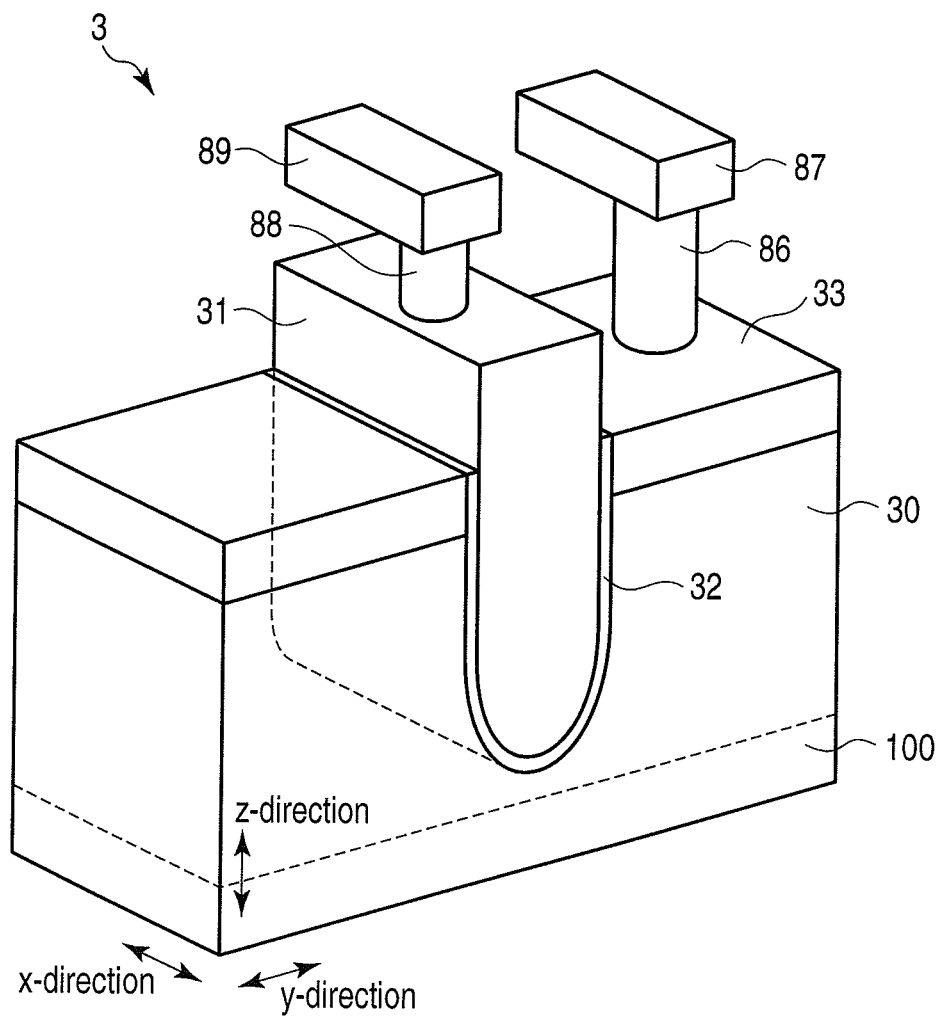
F I G. 37

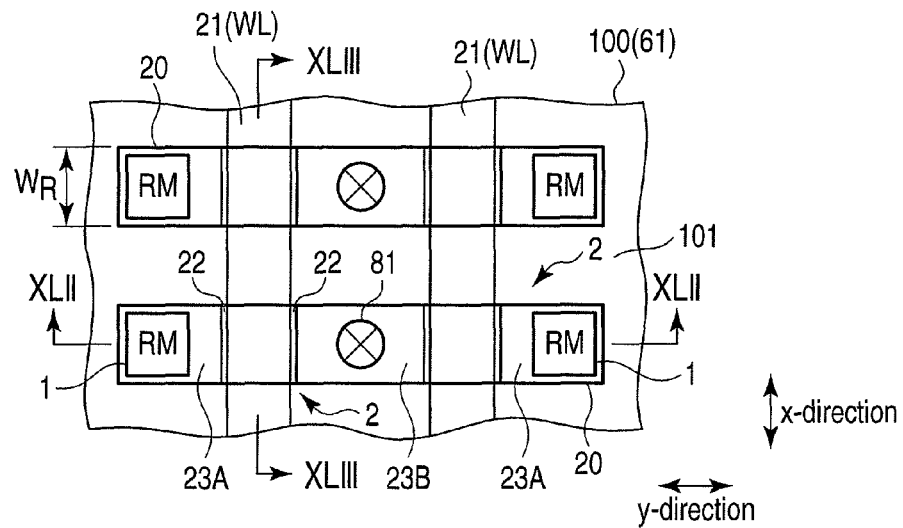
F I G. 40
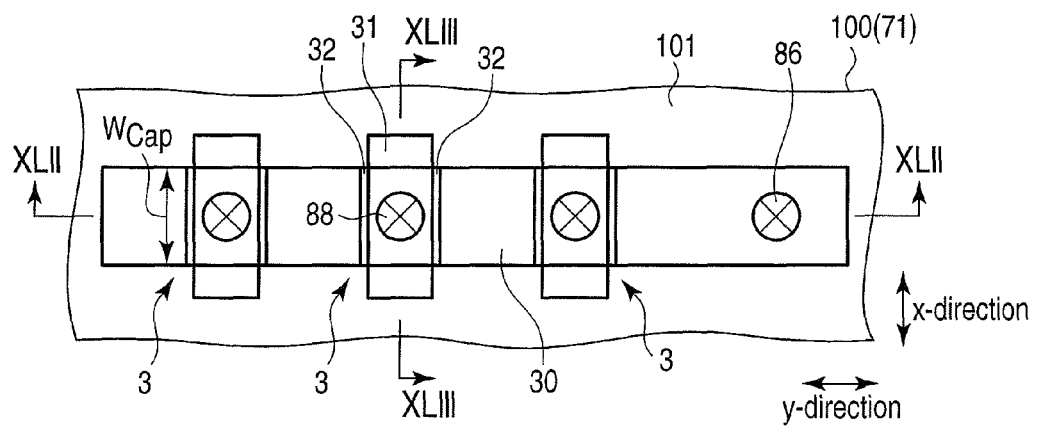
F I G. 41

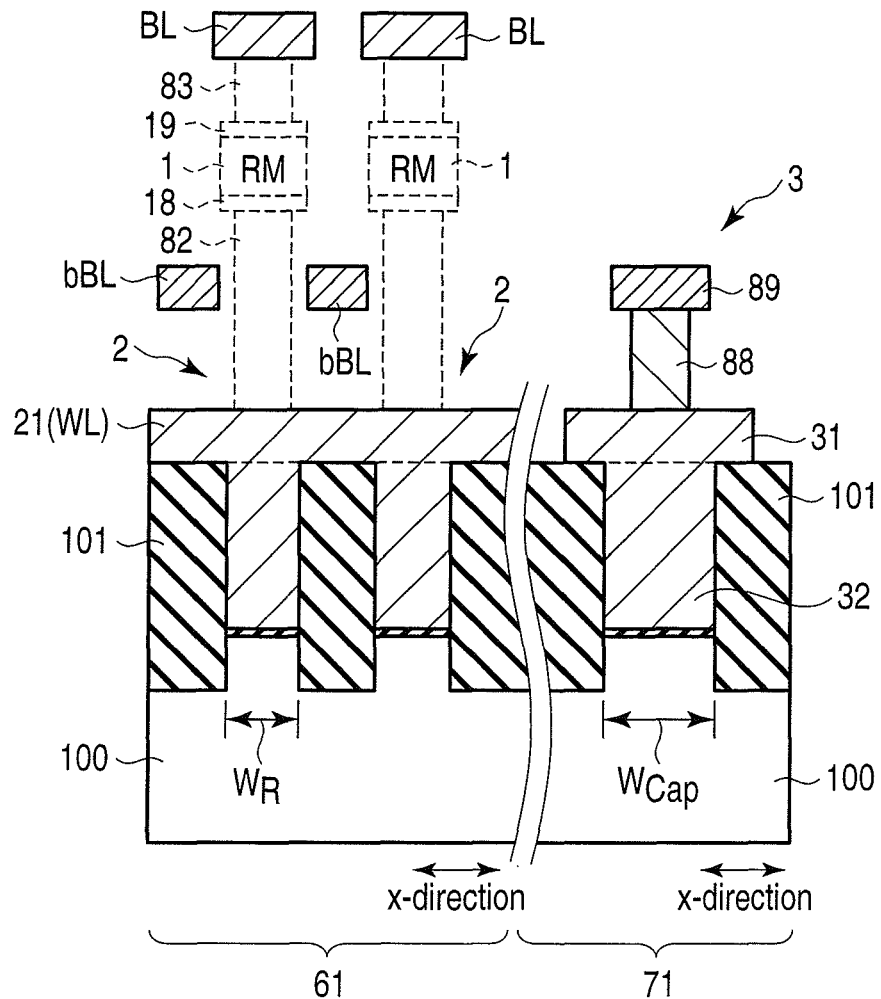
F I G. 43

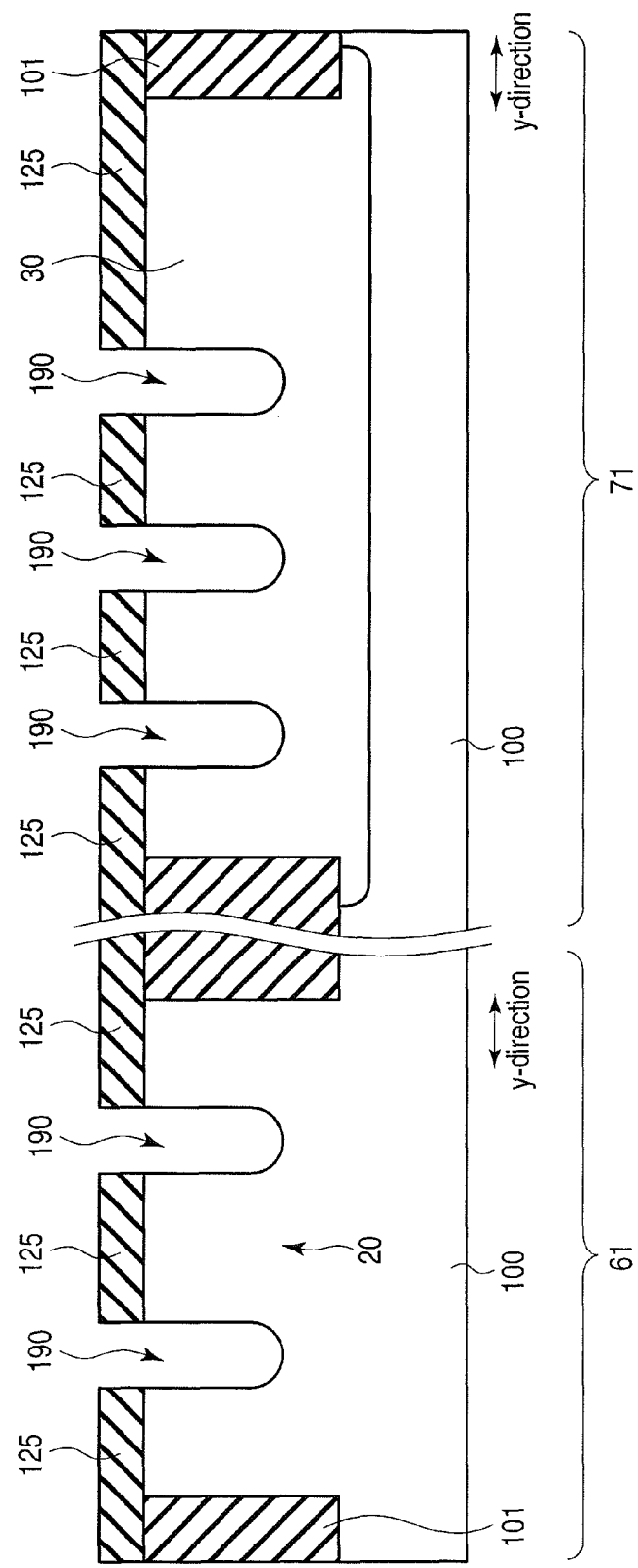
F I G. 44

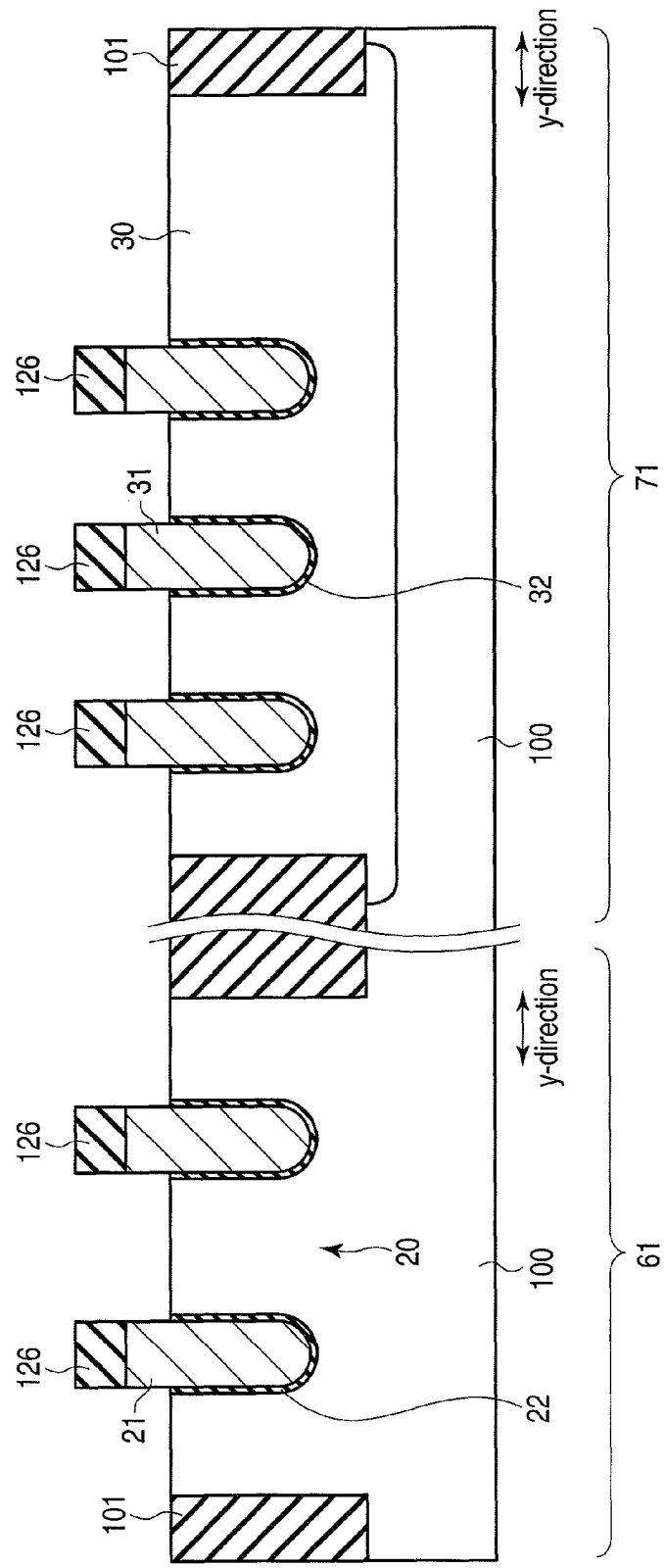
F I G. 46

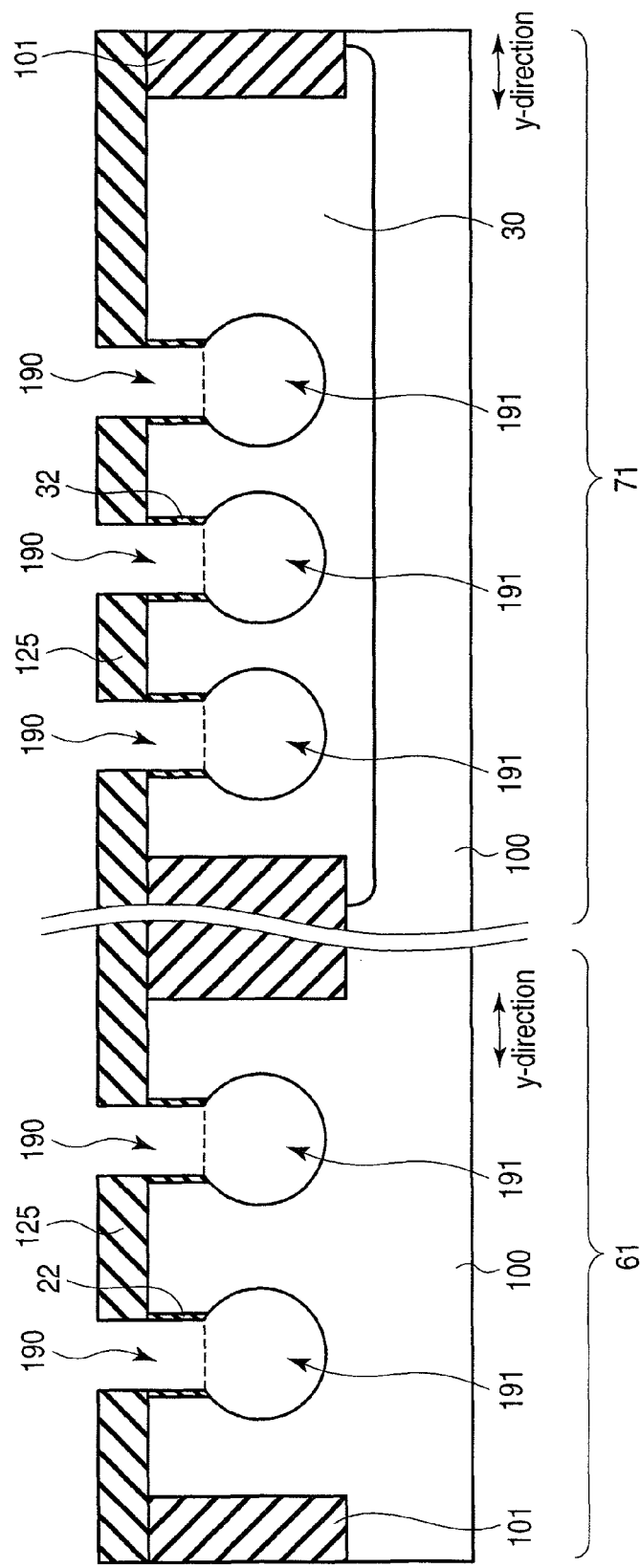
F I G. 48

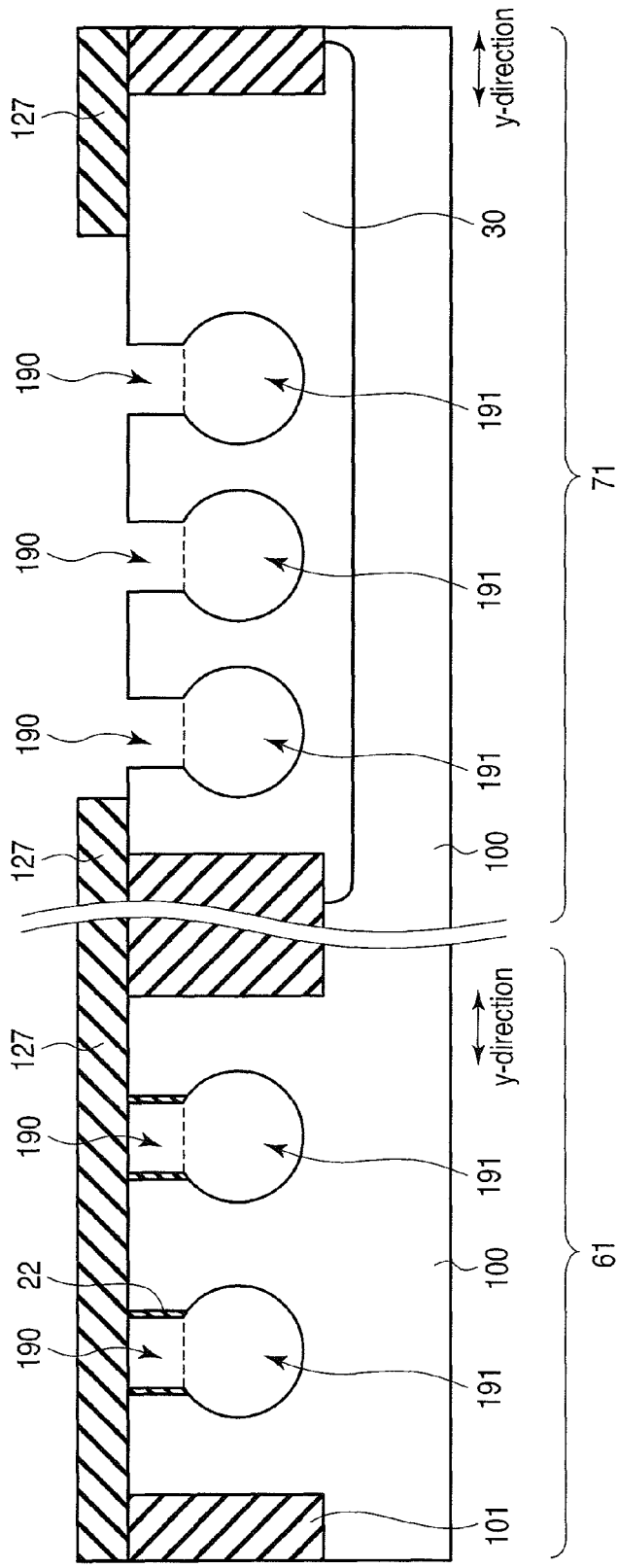
F I G. 49

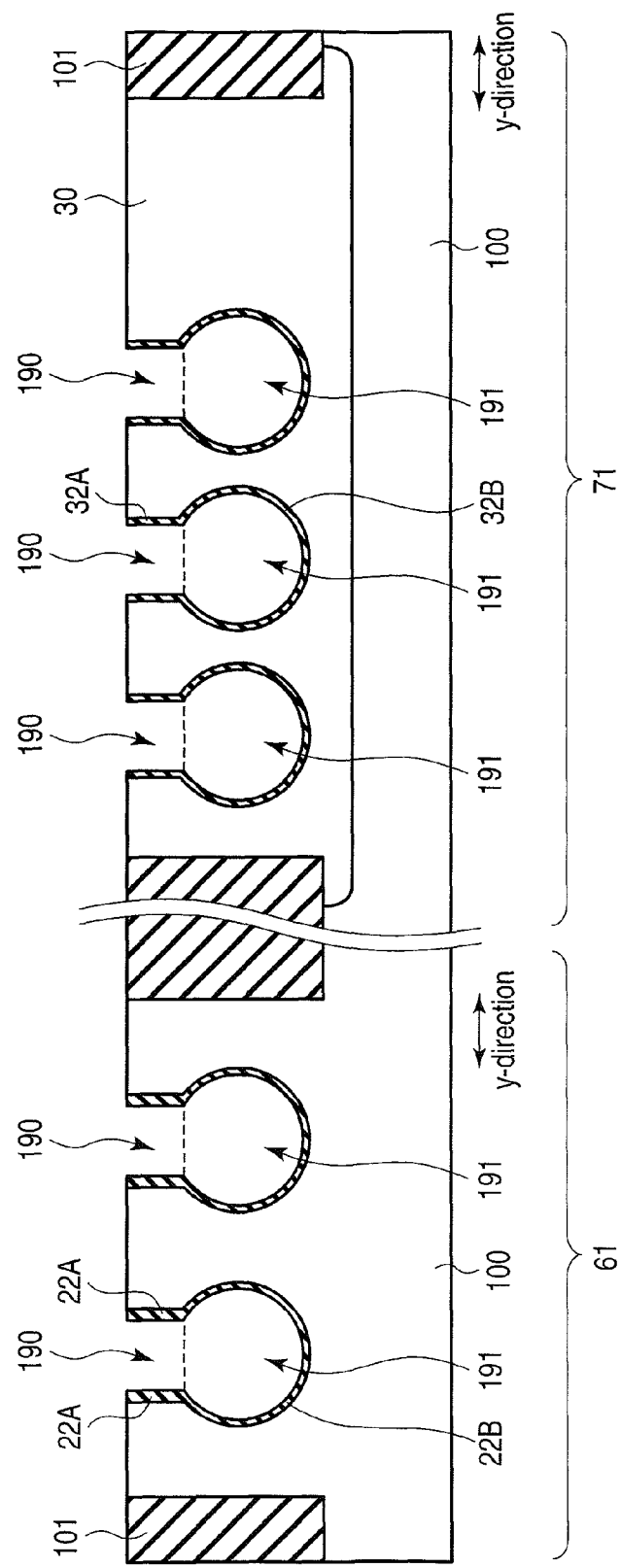
F I G. 50

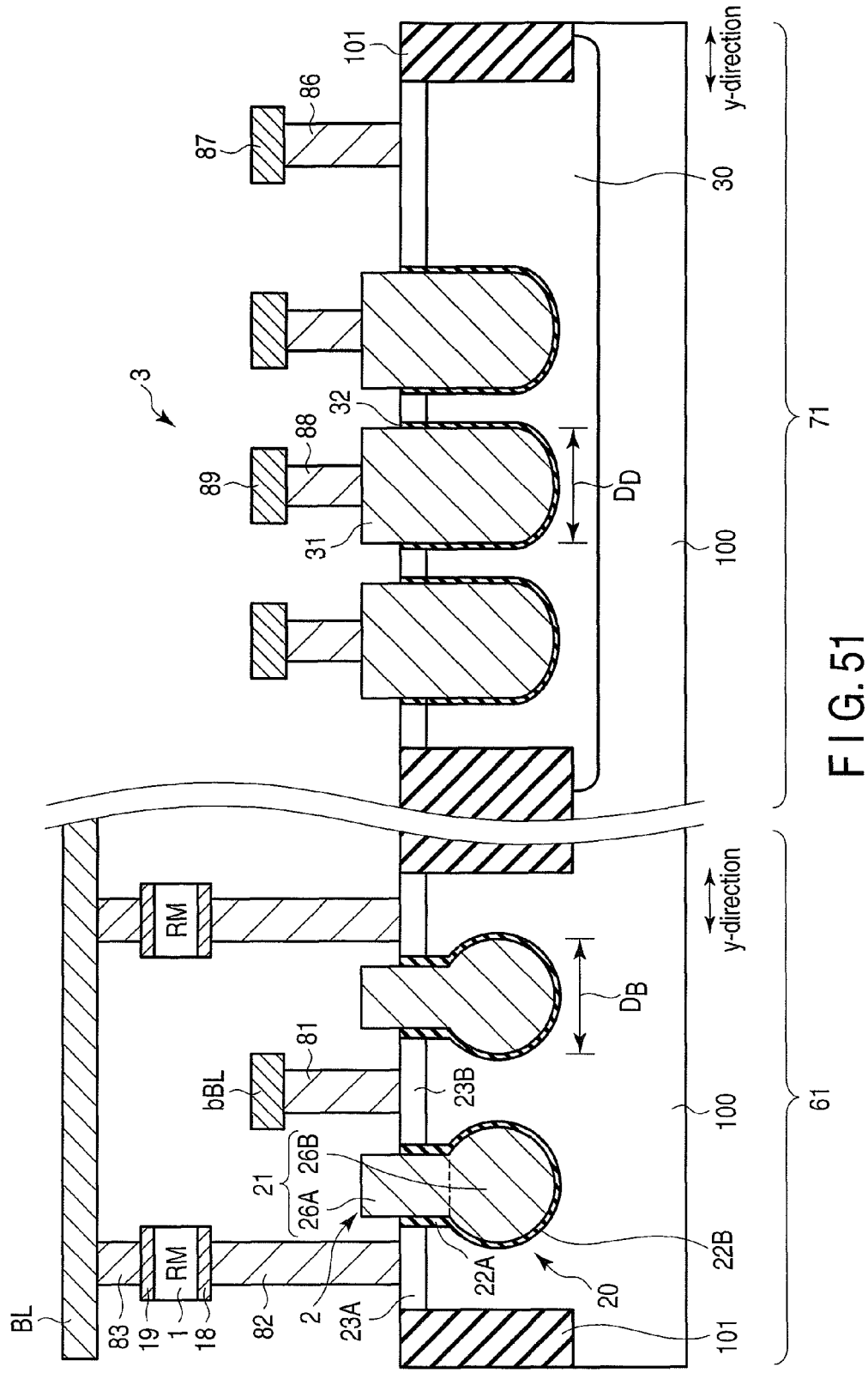
F I G. 51

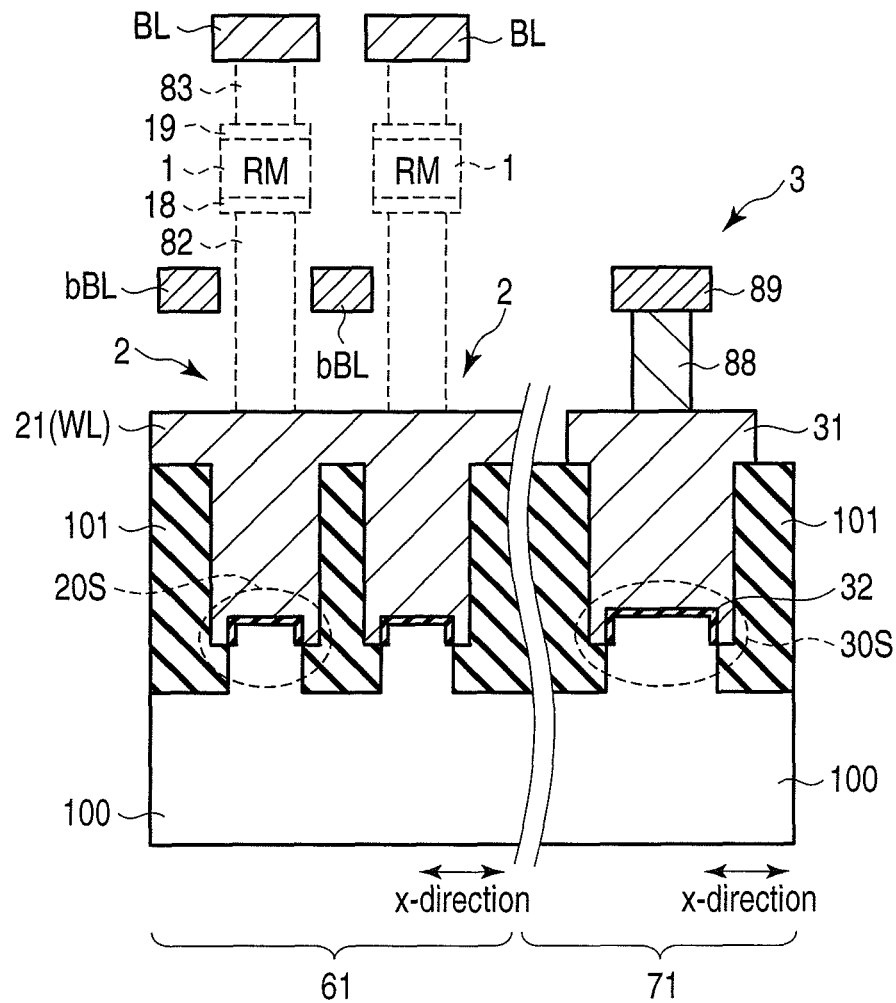
F I G. 52

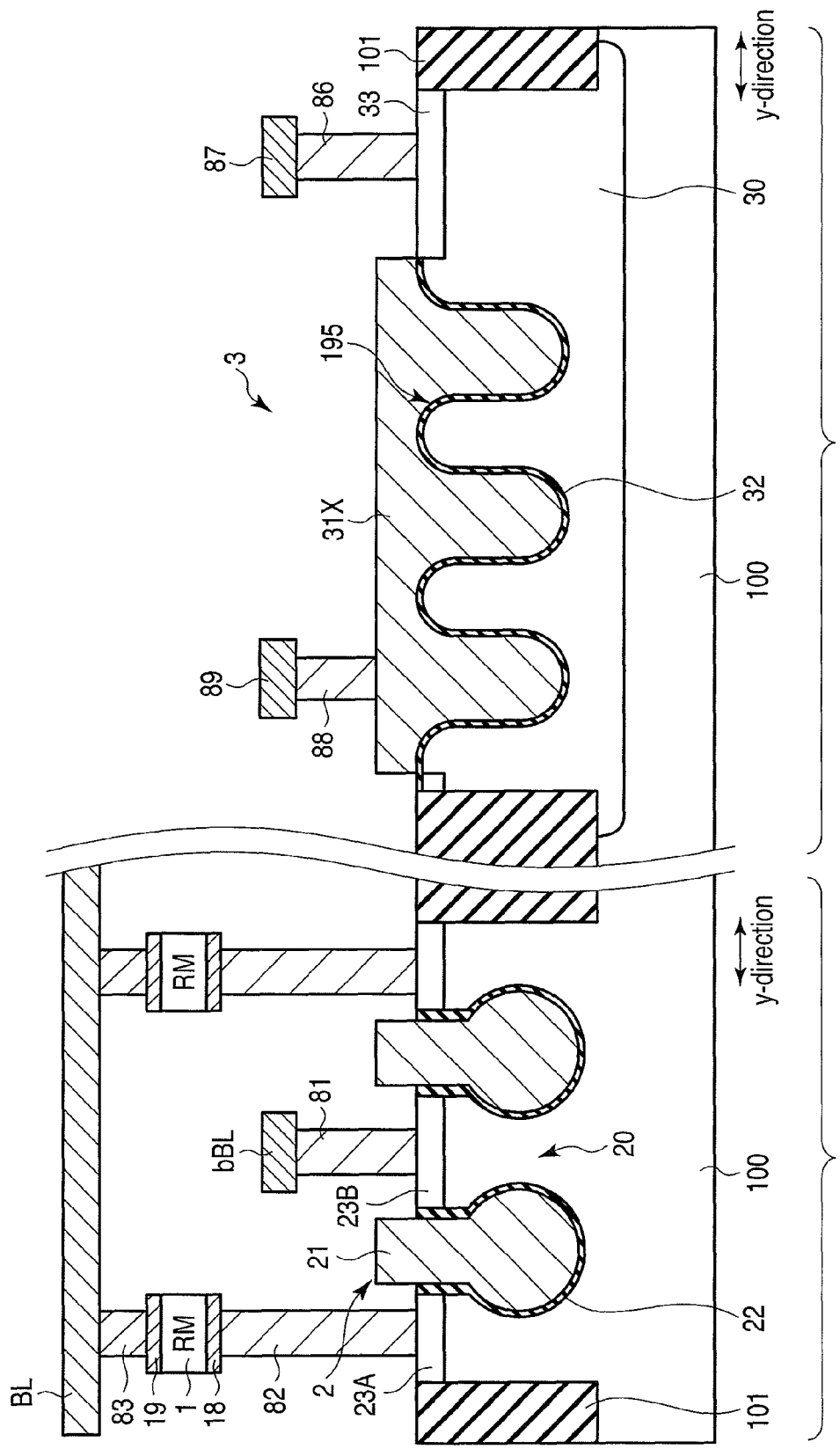
F I G. 54

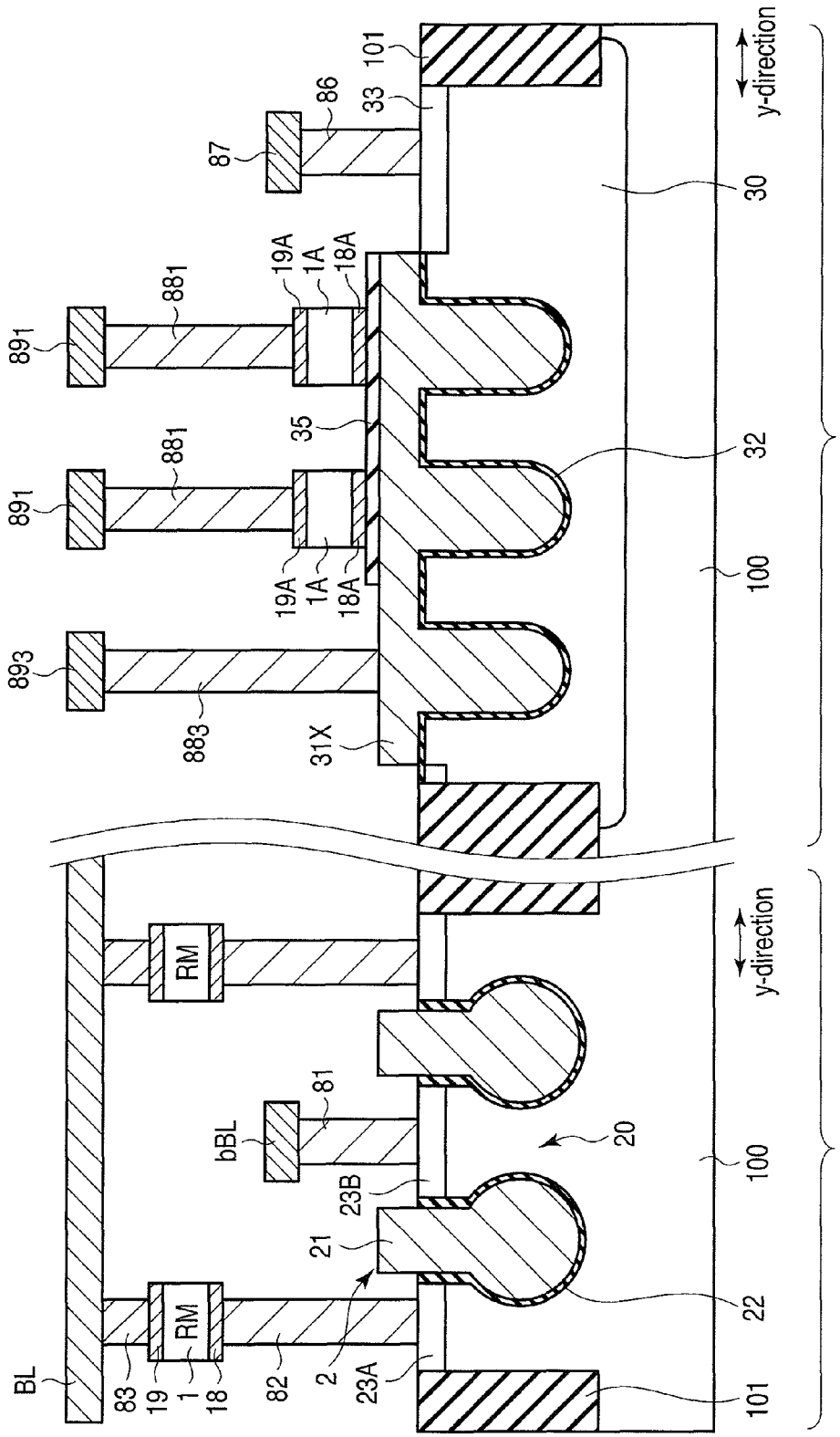
F I G. 55

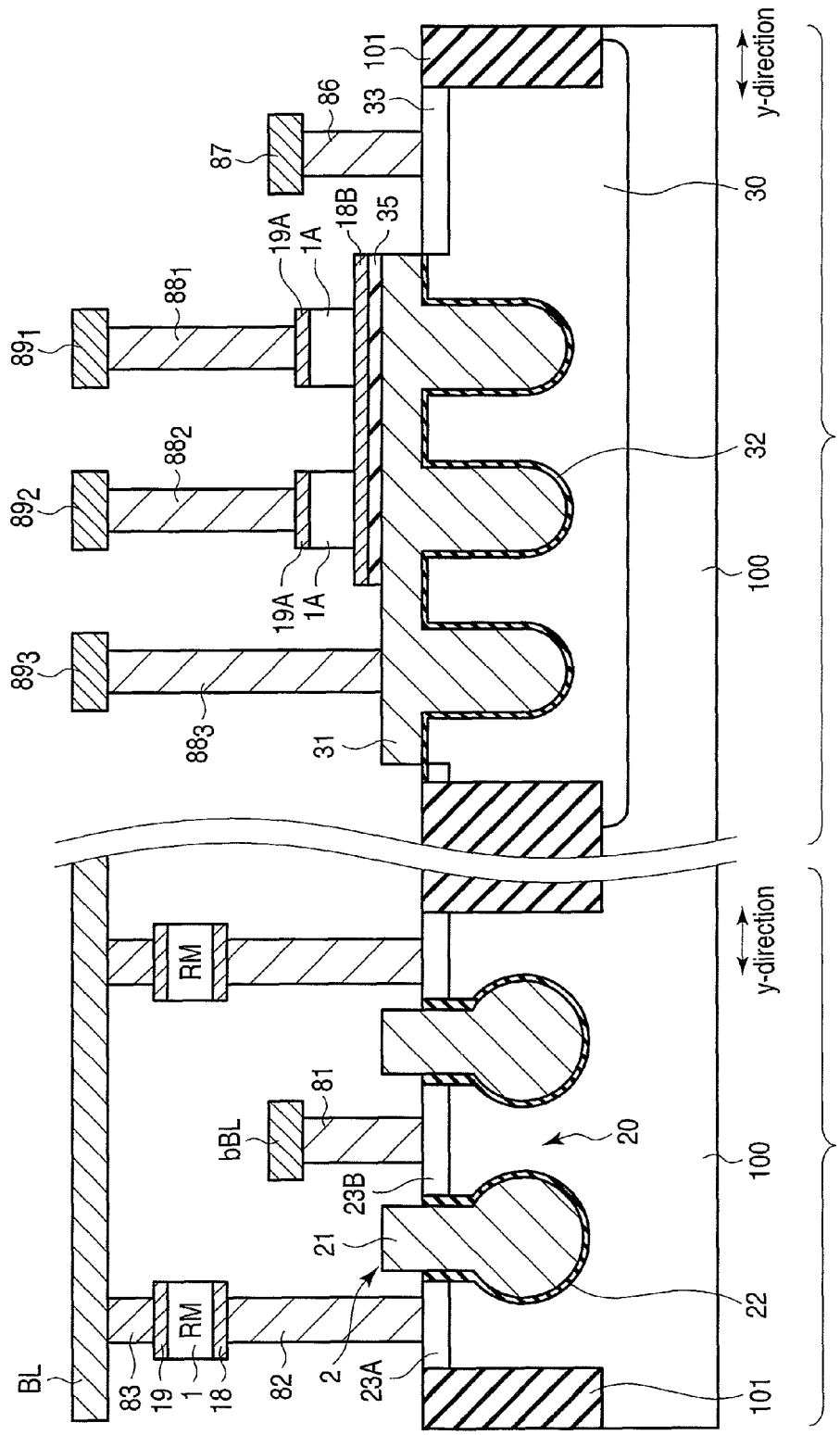
F I G. 59

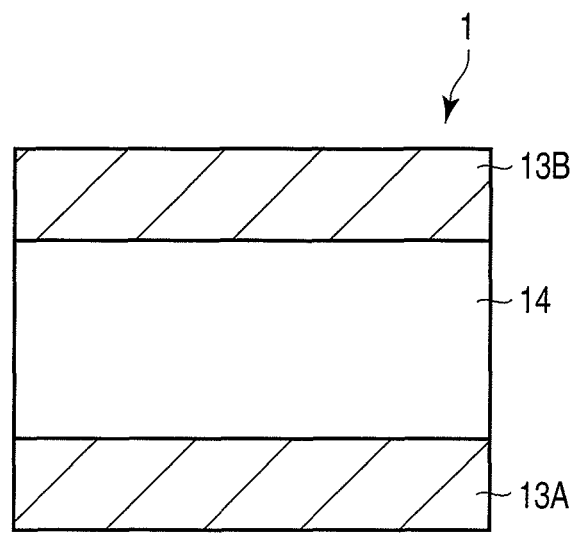
F I G. 61
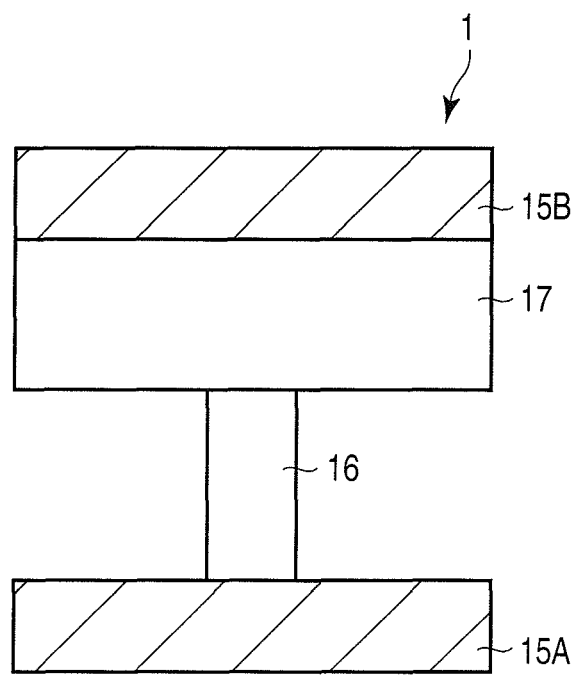
F I G. 62

RESISTANCE CHANGE TYPE MEMORY

CROSS-REFERENCE TO RELATED APPLICATIONS

This application is based upon and claims the benefit of priority from Japanese Patent Application No. 2010-156159, filed Jul. 8, 2010; the entire contents of which are incorporated herein by reference.

FIELD

Embodiments described herein relate generally to a resistance change type memory.

BACKGROUND

Recently, as next-generation nonvolatile semiconductor memories, resistive random access memories have been attracting attention, such as a magnetoresistive RAM (MRAM) in which a magnetoresistive effect element serves as a memory element, a resistive RAM (ReRAM) in which a variable resistive element serves as a memory element, and a phase change RAM (PCRAM) in which a phase change element serves as a memory element.

As an example of the application of the resistance change type memory, the use of this memory as an alternative memory to a DRAM is expected.

According to the specification of double data rate (DDR) DRAM, a capacitor having a large capacitance is formed in a DRAM chip to stabilize the operation of the DRAM chip. Since a memory cell of the DRAM includes a capacitor (e.g., a trench capacitor), the capacitor having the large capacitance for stabilized operation can be relatively easily formed in the chip.

However, in the resistance change type memory which is driven in accordance with the operation standard of the DRAM, the capacitor having the large capacitance has to be formed in the same chip as the memory cell by adding a formation step separate from the formation step of the memory cell.

BRIEF DESCRIPTION OF THE DRAWINGS

FIG. 1 is a block diagram showing a configuration example of a chip of a resistance change type memory;

FIG. 2 is a diagram schematically showing the structure of an element included in the resistance change type memory according to embodiments;

FIG. 3 is a diagram schematically showing the structure of the element included in the resistance change type memory according to the embodiments;

FIG. 5 is a bird's eye view showing the structure of a memory cell of the resistance change type memory according to the first embodiment;

FIG. 6 is a sectional view showing the structure of the memory cell of the resistance change type memory according to the first embodiment;

FIG. 7 is a sectional view showing the structure of the memory cell of the resistance change type memory according to the first embodiment;

FIG. 11 is a plan view showing an example of the layout of the chip of the resistance change type memory;

FIG. 12 is a plan view showing an example of the layout of the memory cell;

FIG. 20 is a sectional process view showing a step of the method of manufacturing the resistance change type memory according to the first embodiment;

FIG. 25 is a sectional view for illustrating Configuration example 3 of the resistance change type memory according to the first embodiment;

FIG. 26 is a sectional view for illustrating Configuration example 3 of the resistance change type memory according to the first embodiment;

FIG. 29 is a sectional view for illustrating Configuration example 4 of the resistance change type memory according to the first embodiment;

FIG. 30 is a sectional view for illustrating Configuration example 4 of the resistance change type memory according to the first embodiment;

FIG. 31 is a sectional view for illustrating Configuration example 4 of the resistance change type memory according to the first embodiment;

FIG. 32 is a sectional view for illustrating Configuration example 5 of the resistance change type memory according to the first embodiment;

FIG. 34 is a bird's eye view showing the structure of a memory cell of a resistance change type memory according to the second embodiment;

FIG. 36 is a sectional view showing the structure of the memory cell of the resistance change type memory according to the second embodiment;

FIG. 37 is a bird's eye view showing the structure of a capacitor of the resistance change type memory according to the second embodiment;

FIG. 40 is a plan view showing an example of the layout of the memory cell;

FIG. 41 is a plan view showing an example of the layout of the capacitor;

FIG. 43 is a sectional view for illustrating Configuration example 1 of the resistance change type memory according to the second embodiment;

FIG. 44 is a sectional process view showing a step of a method of manufacturing the resistance change type memory according to the second embodiment;

FIG. 46 is a sectional process view showing a step of the method of manufacturing the resistance change type memory according to the second embodiment;

FIG. 48 is a sectional process view showing a step of the method of manufacturing the resistance change type memory according to the second embodiment;

FIG. 49 is a sectional process view showing a step of the method of manufacturing the resistance change type memory according to the second embodiment;

FIG. 50 is a sectional process view showing a step of the method of manufacturing the resistance change type memory according to the second embodiment;

FIG. 51 is a sectional view for illustrating Configuration example 3 of the resistance change type memory according to the second embodiment;

FIG. 52 is a sectional view for illustrating Configuration example 4 of the resistance change type memory according to the second embodiment;

FIG. 54 is a sectional view for illustrating Configuration example 5 of the resistance change type memory according to the second embodiment;

FIG. 55 is a sectional view for illustrating Configuration example 6 of the resistance change type memory according to the second embodiment;

FIG. 59 is a sectional view for illustrating Configuration example 6 of the resistance change type memory according to the second embodiment;

FIG. 61 is a diagram showing an example of a resistance change type storage element; and FIG. 62 is a diagram showing an example of the resistance change type storage element.

DETAILED DESCRIPTION

Figure 4:
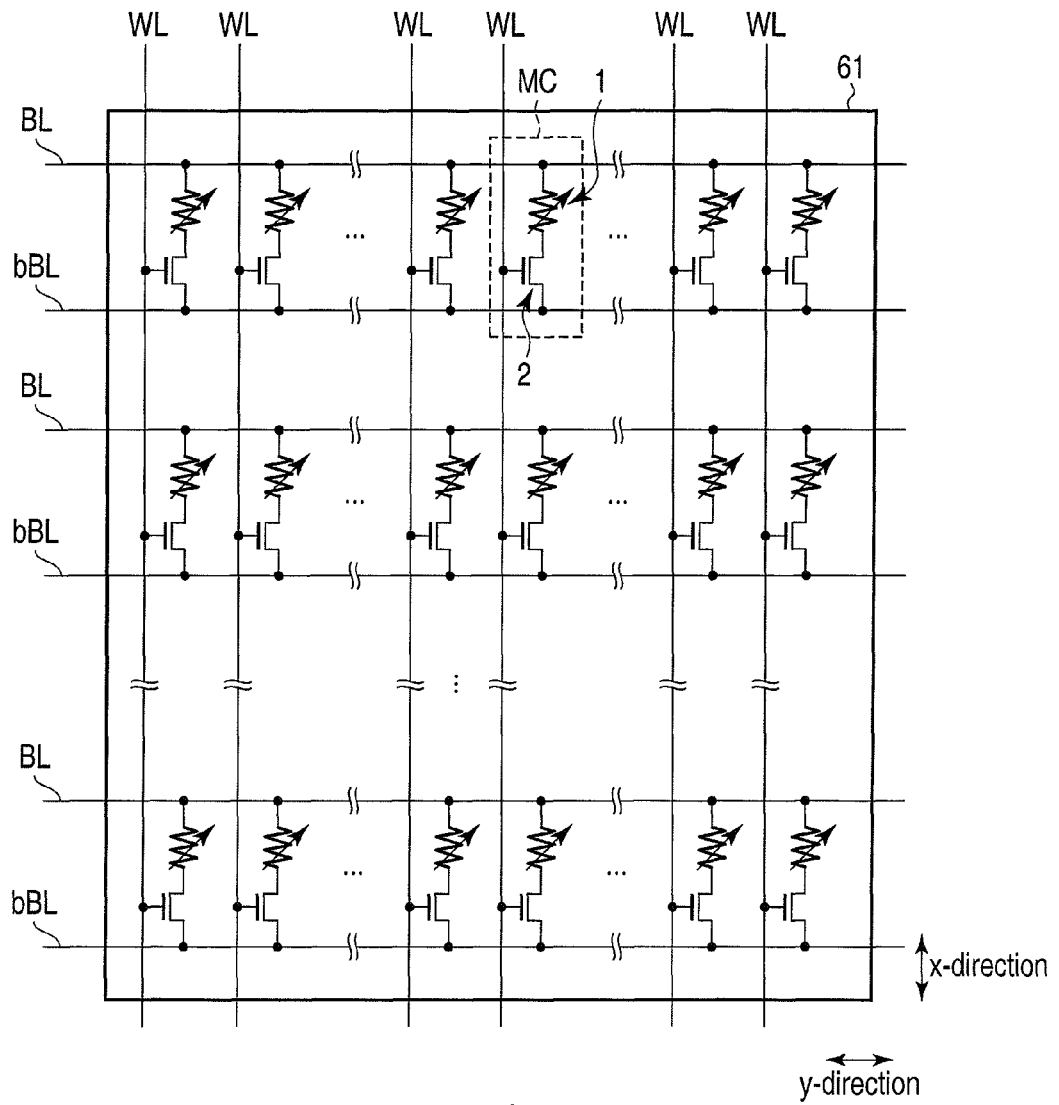
FIG. 4 is a diagram showing an example of circuit configurations of a storage element and a select transistor of the resistance change type memory.

Hereinafter, the present embodiments will be described in detail with reference to the drawings. In the following explanation, elements having the same function and configuration are provided with the same symbols and are repeatedly described when necessary.

In general, according to one embodiment, a resistance change type memory includes a memory cell and a capacitor which are provided on a semiconductor substrate. The memory cell includes a resistance change type memory and a select transistor. The resistance change type storage element changes in resistance value in accordance with data to be stored. The select transistor includes a first semiconductor region provided in the semiconductor substrate, and a gate electrode facing the side surface of the first semiconductor region via a gate insulating film. The capacitor includes a second semiconductor region provided in the semiconductor substrate, a capacitor electrode facing the side surface of the second semiconductor region, and a first capacitor insulating film provided between the second semiconductor region and the capacitor electrode.

[Embodiments]

A resistance change type memory according to embodiments is described with reference to FIG. 1 to FIG. 62.

<Overall Configuration>

The resistance change type memory according to the embodiments is described with reference to FIG. 1.

FIG. 1 shows a configuration example of a chip of the resistance change type memory.

A resistance change type memory (e.g., a chip) 90 has a memory region 6. The memory region 6 includes a plurality of memory cells MC.

A row control circuit 91 is disposed adjacent to the memory region 6 in an x-direction. A column control circuit 92 is disposed adjacent to the memory region 6 in a y-direction that intersects with the x-direction. The row control circuits 91 may be disposed at both ends of the memory region 6 in the x-direction. The column control circuits 92 may be disposed at both ends of the memory region 6 in the y-direction.

The row control circuit 91 selects a row of the memory region 6 in accordance with, for example, a row address signal. The column control circuit 92 selects a column of the memory region 6 in accordance with, for example, a column address signal. The row and column control circuits 91, 92 control writing, erasing and reading of data in a memory element of the memory region 6.

A control signal and data for the chip are supplied from, for example, a controller (not shown) provided outside the chip. A control signal CMD is input to a command interface circuit 93. Data DT is input to a data input/output buffer 94. The controller may be disposed within the chip 90.

The command interface circuit 93 judges whether external data is command data in accordance with the control signal CMD. When the data is the command data, the command interface circuit 93 transfers the command data to a state machine 95 from the data input/output buffer 94.

The state machine 95 manages the operation of the whole chip. The state machine 95 manages writing, erasing and reading of data in the resistance change type memory 90 in accordance with the command data.

In writing, erasing and reading of data, an address signal ADR is supplied to the resistance change type memory 90. The address signal ADR is input to the row and column control circuits 91, 92 via an address buffer 96.

A potential generating circuit 97 outputs, for example, a voltage pulse or current pulse used in writing, erasing and reading of data to the row and column control circuits 91, 92 by predetermined timing in response to an instruction from the state machine 95. The voltage/current pulse is applied, via the row and column control circuits 91, 92, to a word line or bit line to which the memory cell is connected.

Circuits for controlling the operation of the memory region 6 (hereinafter referred to as peripheral circuits) such as the row and column control circuits 91, 92, the state machine 95 and the potential generating circuit 97 are formed by a field effect transistor, a resistive element and a capacitor.

Constituent elements of the memory cells MC and peripheral circuits are formed on the same semiconductor substrate.

FIG. 2 and FIG. 3 are schematic diagrams for illustrating the structure of the memory cell and the capacitor of the peripheral circuit in the resistance change type memory according to the embodiments.

The memory cell MC includes at least one resistance change type storage element 1 and at least one select switch element 2. The select switch element 2 is a field effect transistor (FET). Hereinafter, the field effect transistor as the select switch element 2 is called a select transistor.

In one memory cell, one end of the resistance change type storage element 1 is connected to one end of the current path (source/drain) of the select transistor.

As shown in FIG. 2 and FIG. 3, in the resistance change type memory according to the embodiments, the select transistor 2 is a field effect transistor having its gate electrode 21 that faces the side surface of a semiconductor region 20 in a semiconductor substrate 100.

FIG. 2 shows an example of a FinFET used as the select transistor 2. FIG. 2 shows a section along the channel width direction of the FinFET.

The FinFET 2 as the select transistor has the rectangular semiconductor region (hereinafter referred to as a fin portion) 20 cut out of the semiconductor substrate 100, and the gate electrode 21 formed across the fin portion 20. Both side surfaces of the fin portion 20 face the gate electrode 21 via a gate insulating film 22. At the intersection of the gate electrode 21 and the fin portion 20, a channel region CNL is formed in the fin portion 20.

The gate electrode 21 covers the fin portion 20, and is provided on the semiconductor substrate 100 via an isolation insulating film 101.

FIG. 3 shows an example of a recess channel array transistor (hereinafter referred to as an RCAT) used as the select transistor 2. FIG. 3 shows a section along the channel length direction of the RCAT 2.

The RCAT 2 as the select transistor has the gate electrode 21 embedded in a trench (recess) which is formed in the semiconductor substrate 100. The gate electrode 21 faces a semiconductor region 20 on the side surface and bottom of the trench via the gate insulating film 22. The channel region CNL of the RCAT 2 is formed along the shape of the trench in such a region that two side surfaces of the semiconductor region 20 are connected to the side surfaces of the channel region CNL at the bottom of the trench.

The peripheral circuit includes a field effect transistor 4, a resistive element (not shown) and a capacitor 3. As shown in FIG. 2 and FIG. 3, the capacitor 3 in the peripheral circuit includes a semiconductor region 30, an electrode (hereinafter referred to as a capacitor electrode) 31 facing the semiconductor region 30, and an insulating film (hereinafter referred to as a capacitor insulating film) 32 intervening between the semiconductor region 30 and the capacitor electrode 31.

The capacitor 3 used in the resistance change type memory according to the embodiments has a structure closely resembling that of the select transistor 2. The capacitor 3 is, for example, a metal-oxide-semiconductor (MOS) capacitor.

The capacitor 3 according to the embodiments includes the semiconductor region 30 within the semiconductor substrate 100.

In the capacitor of the example shown in FIG. 2, the semiconductor region 30 is configured by a rectangular semiconductor region 30 projecting from the semiconductor substrate 100, similarly to the fin portion 20 of the FinFET as the select transistor 2.

The capacitor electrode 31 extends across the rectangular semiconductor region (fin portion) 30 via the capacitor insulating film 32, in the same manner as the structure of the gate electrode 21 and the fin portion 20 of the FinFET 2 as the select transistor. The capacitor electrode 31 faces both side surfaces of the semiconductor region (capacitor electrode) 30 via the capacitor insulating film 32.

A capacitance Cap of the capacitor 3 shown in FIG. 2 is formed between the side surface of the semiconductor region 30 and the capacitor electrode 31 that covers the semiconductor region 30.

In the capacitor 3 of the example shown in FIG. 3, the semiconductor region 30 is configured by a semiconductor region having a trench similarly to the semiconductor region in which the RCAT of the memory cell MC is formed. The capacitor electrode 31 is embedded in the trench within the semiconductor region 30, similarly to the gate electrode 21 of the RCAT. The capacitor electrode 31 faces the semiconductor region 30 along the side surface and bottom surface of the trench via the capacitor insulating film 32.

A capacitance Cap of the capacitor 3 shown in FIG. 3 is formed between the semiconductor region 30 and the capacitor electrode 31 embedded in the trench.

In FIG. 2, the isolation insulating film 101 covering the surface of the semiconductor substrate can be detached to form a capacitance between the upper surface of the semiconductor substrate 100 and the capacitor electrode 31 across the capacitor insulating film. A sufficient impurity may be added to the semiconductor region 30 to degenerate the semiconductor region 30 and use the semiconductor region 30 as a capacitor electrode.

As described above, in the resistance change type memory according to the embodiments, the select transistor 2 in the memory cell MC is configured so that the side surface of the semiconductor region 20 and the gate electrode 21 face each other across the gate insulating film 22 in a direction parallel to the surface of the substrate. Moreover, in the resistance change type memory according to the embodiments, the capacitor 3 in the peripheral circuit is configured so that the side surface of the semiconductor region 30 and the capacitor electrode 31 face each other across the capacitor insulating film 32 in a direction parallel to the surface of the substrate.

In the select transistor 2, the channel region CNL is formed in a part where the semiconductor region 20 and the gate electrode 21 face each other.

In the capacitor 3, the capacitance Cap is formed between the semiconductor region 30 and the capacitor electrode 31.

In the resistance change type memory according to the embodiments, the capacitor 3 allows the area in which the semiconductor region 30 and the capacitor electrode 31 face each other to be increased without the increase of the occupancy area by using a step of the semiconductor substrate (semiconductor region) originating from the projection or groove.

Consequently, according to the embodiments, it is possible to provide a resistance change type memory including a capacitor with a large capacitance.

<First Embodiment>

A resistance change type memory according to the first embodiment is described with reference to FIG. 4 to FIG. 33.

In the case described in the first embodiment, a select transistor in a memory cell is a FinFET.

(Basic Example)

Basic structures of a memory cell MC and a capacitor 3 included in the resistance change type memory according to the first embodiment are described with reference to FIG. 4 to FIG. 10.

FIG. 4 is an equivalent circuit diagram showing an example of a circuit configuration of a memory region 6 of the resistance change type memory.

The memory region 6 includes one or more memory cell arrays 61.

In the memory cell array 61 of the memory region 6, the memory cells MC are arrayed along the x-direction and y-direction.

In the memory region 6, a plurality of bit lines BL, bBL extending in the y-direction and a plurality of word lines WL extending in the x-direction are provided. One word line WL and two bit lines BL, bBL are connected to one memory cell MC. The two bit lines BL, bBL make one bit line pair.

The memory cells MC arranged along the y-direction are connected to one common bit line pair BL, bBL. The memory cells MC arranged along the x-direction are connected to one common word line WL.

In the present embodiment, each of the memory cells MC is constituted of one resistance change type storage element 1 and one select transistor 2.

One end of the resistance change type storage element 1 is connected to one bit line BL of the bit line pair. The other end of the resistance change type storage element 1 is connected to one end of a current path (source/drain) of the select transistor 2. The other end of the current path (source/drain) of the select transistor 2 is connected to the other bit line bBL of the bit line pair. A control terminal (gate) of the select transistor 2 is connected to the word line WL.

Here, the resistance change type storage element 1 is an element which reversibly changes its resistance state (resistance value) when energy such as a current, a voltage or heat is applied thereto. The changed resistance state is maintained in a nonvolatile manner until any energy that changes the resistance state is applied again. The resistance change type storage element 1 stores data by matching data to be stored to a resistance value which changes to a value of 2 or more. The resistance change type storage element 1 may be, for example, a magnetoresistive effect element used for a magnetoresistive RAM (MRAM), a variable resistive element used for a resistive RAM (ReRAM) or a phase change element used for a phase change RAM (PCRAM).

Figure 8:
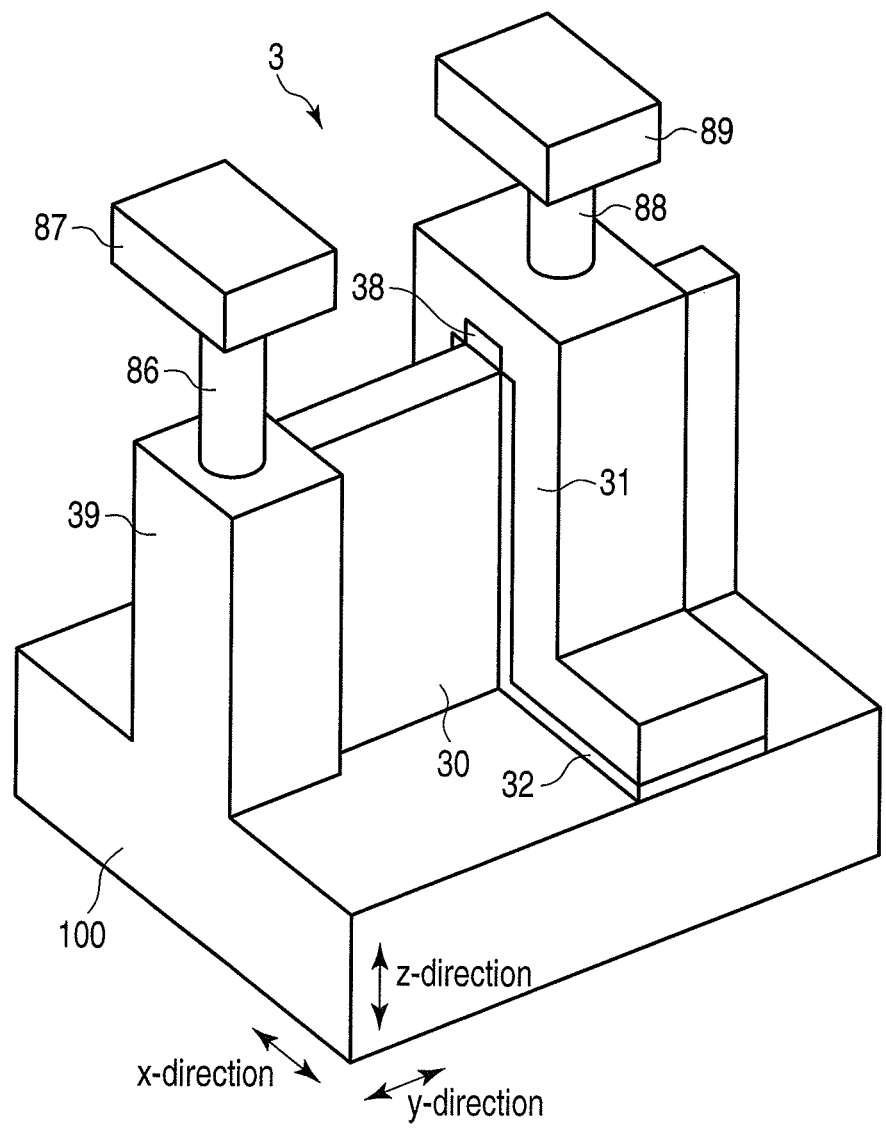
FIG. 8 is a bird's eye view showing the structure of a capacitor of the resistance change type memory according to the first embodiment.
Figure 9:
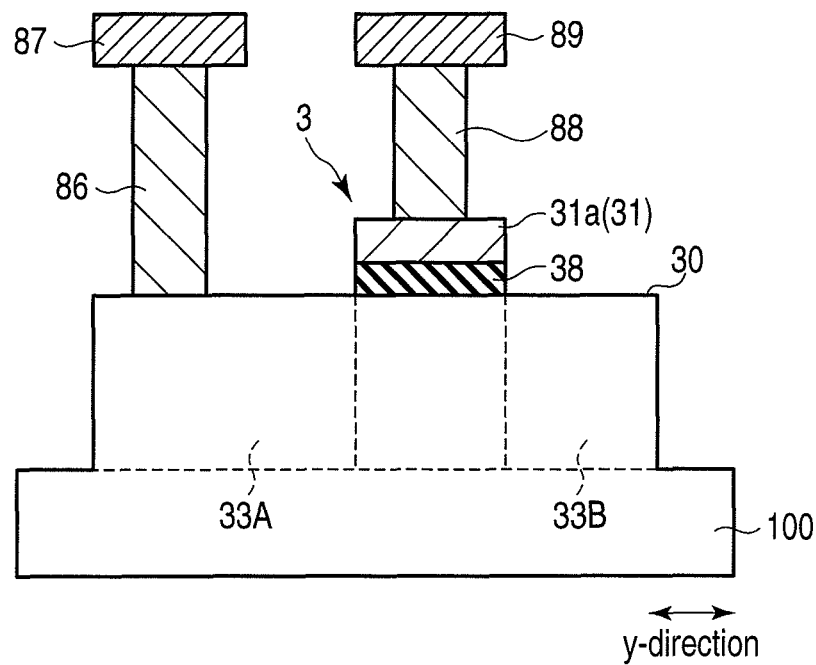
FIG. 9 is a sectional view showing the structure of the capacitor of the resistance change type memory according to the first embodiment.
Figure 10:
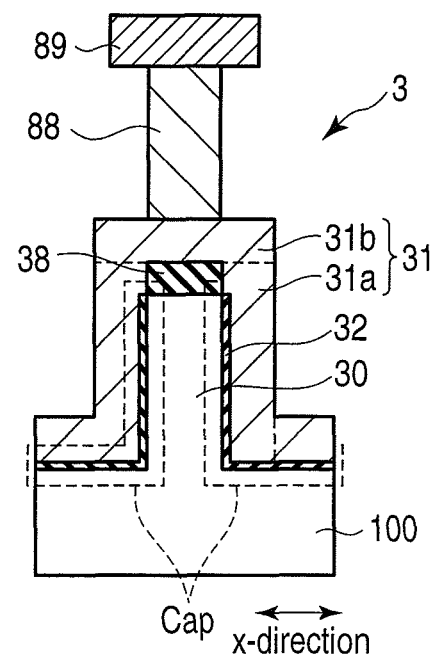
FIG. 10 is a sectional view showing the structure of the capacitor of the resistance change type memory according to the first embodiment.

FIG. 5 is a bird's eye view showing the structure of the memory cell included in the resistance change type memory according to the present embodiment. FIG. 6 and FIG. 7 show the sectional structure of the memory cell. FIG. 8 is a bird's eye view showing the structure of a capacitor included in the resistance change type memory according to the present embodiment. FIG. 9 and FIG. 10 show the sectional structure of the capacitor. In FIG. 5 to FIG. 10, interlayer insulating films covering the elements are not shown for clarity.

As shown in FIG. 5 to FIG. 7, the select transistor 2 of the memory cell is a FinFET. FIG. 6 shows the sectional structure along the channel length direction of the FinFET. FIG. 7 shows the sectional structure along the channel width direction of the FinFET. For example, the channel length direction of the FinFET corresponds to the y-direction, and the channel width direction of the FinFET corresponds to the x-direction.

The fin portion 20 of the FinFET 2 as the select transistor is a rectangular semiconductor region cut out of the semiconductor substrate 100. The fin portion 20 is continuous with the semiconductor substrate 100. The fin portion 20 is structured to project in a direction perpendicular to the substrate (z-direction) from the upper surface of the semiconductor substrate 100. The side surface of the lower part of the fin portion 20 is covered with the isolation insulating film 101 on the semiconductor substrate 100.

The fin portion 20 extends in the y-direction (extending direction of the bit lines). The gate electrode 21 of the FinFET extends in the x-direction that intersects with the y-direction. In the FinFET 2, the extending direction of the fin portion 20 corresponds to the channel length direction, and the extending direction of the gate electrode 21 corresponds to the channel width direction.

The gate electrode 21 makes a two-level crossing with respect to the fin portion 20. The gate electrode 21 is provided on the upper surface and side surface of the fin portion 20 via the insulating films 22, 28.

A channel region 24 of the FinFET 2 is provided in the fin portion 20 located at the intersection of the fin portion 20 and the gate electrode 21.

The gate electrode 21 covers both side surfaces of the fin portion 20 in the channel width direction via the gate insulating film 22. That is, the FinFET has a double gate structure.

The gate electrode 21 covers the upper part of the fin portion 20 via the insulating film 28. The insulating film (hereinafter referred to as a mask layer) 28 is used as, for example, a mask for forming the fin portion 20. The thickness of the mask layer 28 is sufficiently larger than the thickness of the gate insulating film 22. In this case, in the FinFET 2, the distribution of the intensity of an electric field between the upper part of the fin portion 20 and the facing gate electrode 21 is eased, and the operation of the FinFET 2 stabilizes. The thickness of the mask layer 28 is a dimension in a direction perpendicular to the surface of the substrate (z-direction). The thickness of the gate insulating film 22 is a dimension in a direction parallel to the surface of the substrate (x-direction).

Source/drain regions 23A, 23B of the FinFET 2 are provided in the fin portion 20 across the channel region 24 in the fin portion 20 in the y-direction. In the fin portion 20, the channel region 24 is provided between the two source/drain regions 23A, 23B.

Furthermore, in the extending direction of the fin portion 20, contact regions 29A, 29B are provided at one end of the fin portion 20 and the other. The contact regions 29A, 29B are parts of the fin portion 20. The contact regions 29A, 29B are continuous with the source/drain regions 23A, 23B.

Thus, the fin portion 20 is used as an active region (element formation region) of the FinFET 2.

The dimension of the fin portion 20 (hereinafter referred to as a fin width) in a direction (here, x-direction) that intersects with the extending direction of the fin portion 20 is set at "$W_{fin}$". For example, a dimension $W_1$ of the contact region 29A in the direction that intersects the extending direction of the fin portion 20 is larger than the fin width $W_{fin}$. This ensures, for the contact regions 29A, 29B and contact plugs 81, 82, a contact area therebetween, a margin for misalignment, and a reduction in contact resistance. However, the dimension $W_1$ of the contact regions 29A, 29B may be the same as $W_{fin}$.

The fin width $W_{fin}$ can be adjusted to provide a FinFET having a fully depleted type or partially depleted type operation mode.

The contact plugs (first and second contact portions) 82, 81 are provided on the upper surfaces of the contact regions 29A, 29B.

The resistance change type storage element 1 is provided on the contact plug 82. The resistance change type storage element 1 intervenes between a lower electrode layer 18 and an upper electrode layer 19 in the z-direction.

One end of the resistance change type storage element 1 is connected by the contact plug 82 to one end 23A, 29B of the current path of the FinFET as the select transistor.

A via plug 83 is provided on the resistance change type storage element 1. The via plug 83 is connected to the bit line BL. The contact plug 81 is connected to the bit line bBL.

The bit lines BL, bBL extend in the y-direction. The two bit lines BL, bBL make one bit line pair.

As shown in FIG. 5 to FIG. 7, the memory cell MC including one resistance change type storage element 1 and one select transistor (FinFET) 2 is connected between a pair of bit lines BL, bBL. The word line WL is connected to the gate electrode 21. For example, the gate electrode 21 extends in the x-direction and thereby functions as the word line WL. For example, the contact plug (not shown) is connected to one end of the gate electrode 21.

The FinFET is highly resistant to source-drain punch-through and can suppress a short channel effect even when the transistor is miniaturized. Therefore, the use of the FinFET for the select transistor 2 can contribute to the miniaturization of the select transistor (memory cell). Moreover, the FinFET is capable of reducing the impurity concentration in the channel region. Thus, the use of the FinFET for the select transistor 2 can inhibit the variation in the electric characteristics of the select transistor attributed to the variation of the impurity concentration of each element, caused by the element miniaturization.

Hence, as compared with the case where a general planar FET is used for the select transistor, the resistance change type memory that uses the FinFET for the select transistor can reduce a cell area and improve its operating characteristics.

FIG. 8 to FIG. 10 show the structure of the capacitor 3 included in the resistance change type memory according to the present embodiment. This capacitor 3 is provided in the same semiconductor substrate (chip) 100 as the memory cells MC shown in FIG. 5 to FIG. 7. The capacitor 3 in the present embodiment has a structure closely resembling that of the FinFET 2 as the select transistor. The capacitor 3 is, for example, a metal-oxide-semiconductor (MOS) capacitor.

For example, the semiconductor region 30 of the capacitor 3 is configured by a rectangular semiconductor region (fin portion) 30 cut out of the semiconductor substrate 100. The capacitor electrode 31 of the capacitor 3 makes a two-level crossing with respect to the fin portion 30 as a capacitor electrode, substantially similarly to the structure of the FinFET 2. The capacitor electrode 31 of the capacitor 3 is provided on the upper surface and side surface of the semiconductor region 30 via the insulating films 32, 38. The capacitor electrode 31 has a portion (hereinafter referred to as a parallel portion) 31b extending in a direction parallel to the surface of the substrate 100, and a portion (hereinafter referred to as a perpendicular portion) 31a extending in a direction perpendicular to the surface of the substrate 100.

The capacitor insulating film 32 is provided on the side surface of the semiconductor region 30. The insulating film 38 is provided on the upper surface of the semiconductor region 30 of the capacitor. The insulating film 38 is, for example, a mask layer for forming the semiconductor region 30 of the capacitor. The insulating film 38 is made of the same material as the mask layer for forming the fin portion 20 of the FinFET 2.

A portion (referred to as a capacitor portion) of the semiconductor region 30 that faces the capacitor electrode 31 intervenes between two diffusion regions 33A, 33B in the semiconductor region 30 in the extending direction of the semiconductor region 30. The diffusion region 33A, 33B contains, for example, an impurity as a donor or acceptor. The diffusion regions 33A, 33B are formed, for example, simultaneously with the source/drain regions 23A, 23B. For example, the diffusion regions 33A, 33B are n-type impurity regions.

The capacitance Cap of the capacitor 3 is mainly generated in the portion (capacitor portion) in which the semiconductor region 30 and the capacitor electrode 31 face each other across the capacitor insulating film 38. For example, the intensity of the capacitance of the capacitor 3 depends on the area in which the capacitor electrode 31 and the semiconductor region 30 face each other and on the thickness and dielectric constant of the insulating film 38.

However, the intensity of the capacitance is in inverse proportion to the distance between two electrodes facing each other. Therefore, if the thickness of the insulating film between the semiconductor region (channel) 30 and the capacitor electrode 31 increases, the capacitance of the capacitor decreases. For example, when the insulating film 38 on the upper surface of the semiconductor region 30 is the mask layer for forming the fin portion 20 similarly to the mask layer 28 for forming the fin portion of the FinFET 2, the thickness of the insulating film 38 as the mask layer is sufficiently large. In this case, the capacitance of the portion in which the semiconductor region 30 and the capacitor electrode 31 face each other across the insulating film (mask layer) 38 is lower than the capacitance of the part of the capacitor insulating film 32.

For example, in the region where the capacitor is formed (hereinafter referred to as a capacitor region), the isolation insulating film is removed from the upper surface of the semiconductor substrate 100 located in the vicinity of the semiconductor region 30, in contrast with the region where the memory cells are formed. Thus, the side surface of the lower part of the semiconductor region (fin portion) 30 and the upper surface of the semiconductor substrate 100 that have been covered with the isolation insulating film can be used as regions for forming the capacitance of the capacitor.

Here, the insulating film 32 on the side surface of the semiconductor region 30 and on the upper surface of the semiconductor substrate 100 functions as the capacitor insulating film 32.

For example, when the fin portion (semiconductor region) 30 is a P-type semiconductor region, a channel is formed in the capacitor portion. Formed channel functions a capacitor electrode, the capacitor is driven by the channel as the electrode. For example, when the fin portion (semiconductor region) 30 is an N-type semiconductor region, the capacitor is driven by the functioning of the fin portion 30 as the capacitor electrode even if no channel is formed.

As shown in FIG. 8 to FIG. 10, if not only the side surface of the rectangular semiconductor region 30 but also the upper surface of the semiconductor substrate 100 is used for the capacitor electrode, the area in which the semiconductor region and the capacitor electrode for a formation of the capacitance face each other can be increased. Thus, when the isolation insulating film is not provided in the capacitor region, the capacitance of the capacitor 3 can be larger.

The semiconductor region 30 included in the capacitor 3 is formed, for example, simultaneously with the fin portion 20 of the FinFET. The capacitor electrode (conductor) 31 is formed simultaneously with the gate electrode 21 of the FinFET. In this case, the capacitor electrode 31 is made of, for example, the same material as the gate electrode 21 of the transistor 2.

The capacitor insulating film 32 is formed, for example, simultaneously with the gate insulating film 22 of the FinFET. In this case, the capacitor insulating film 32 is made of the same material as the gate insulating film 22, and the thickness of the capacitor insulating film 32 is the same as the thickness of the gate insulating film 22.

In the capacitor 3, the impurity concentration of the semiconductor region 30 is preferably higher than the impurity concentration of the channel region 24 of the fin portion 20. In the semiconductor region 30 of the capacitor, a portion facing the capacitor electrode 31 (referred to as a capacitor portion) intervenes in the y-direction between, for example, the diffusion regions 33A, 33B formed in the semiconductor region 30. The impurity concentration of the diffusion regions 33A, 33B is higher than the impurity concentration of the capacitor portion. The diffusion regions 33A, 33B are formed, for example, simultaneously with the source/drain regions 23A, 23B of the FinFET.

For example, a contact region 39 is provided at one end of the semiconductor region 30 of the capacitor 3. A contact plug 86 is provided on the contact region 39. A contact plug 88 is provided on the capacitor electrode 31.

These contact plugs 86, 88 are used as input/output terminals of the capacitor 3. The contact plugs 86, 88 are connected to other elements via interconnects 87, 89. As a result, a predetermined circuit including the capacitor 3 according to this embodiment is formed.

The positions at which the contact plugs 86, 88 as the terminals of the capacitor 3 are formed are not limited to the positions shown in FIG. 8 to FIG. 10. The contact plugs 86, 88 have only to be connected to the semiconductor region 30 and the capacitor electrode 31 so that predetermined potentials may be supplied to the semiconductor region 30 and the capacitor electrode 31, respectively.

As described above, in the resistance change type memory according to the first embodiment, the FinFET is used as the select transistor 2 of the memory cell. In the FinFET 2 as the select transistor 2, the fin portion 20 as the active region makes a two-level crossing with respect to the gate electrode 21. Thus, the side surface of the fin portion 20 and the gate electrode 21 face each other, and the channel region 24 is provided in the fin portion 20 along the side surface of the fin portion 20 in the channel width direction.

The resistance change type memory according to the present embodiment includes the capacitor 3 of a structure closely resembling that of the FinFET. The capacitor 3 in the resistance change type memory according to the present embodiment has the semiconductor region 30, the capacitor electrode 31, and the capacitor insulating film 32 located between the semiconductor region 30 and the capacitor electrode 31. The capacitor 3 is, for example, a MOS capacitor.

The semiconductor region 30 of the capacitor is a rectangular semiconductor region cut out of the semiconductor substrate, similarly to the fin portion 20. The capacitor electrode 31 makes a two-level crossing with respect to the semiconductor region 30 of the capacitor 3. Thus, the capacitor electrode 31 is provided on the side surface of the semiconductor region 30 via the capacitor insulating film 32.

The capacitor electrode 31 faces the side surface of the rectangular semiconductor region 30, and a capacitance is thereby formed between the capacitor electrode 31 and the semiconductor region 30.

Thus, in the first embodiment, a step extending from the upper end of the rectangular semiconductor region (fin portion) to the lower end (the upper surface of the semiconductor substrate 100) is used to form a large area in which the semiconductor region 30 and the capacitor electrode 31 face each other. That is, the capacitor 3 in the resistance change type memory according to the present embodiment includes a part where the semiconductor region 30 and the capacitor electrode 31 are perpendicular to the surface of the substrate.

As a result, when the area in which the semiconductor region and the capacitor electrode face each other is the same, the capacitor 3 in the resistance change type memory according to the present embodiment can reduce the area occupied by the capacitor (capacitor region) in the semiconductor substrate 100, as compared with the capacitor which is parallel to the surface of the semiconductor substrate and in which a capacitance is formed between the surface of the semiconductor substrate and the capacitor electrode.

In the present embodiment, the semiconductor region 30 as a component of the capacitor 3 is formed in substantially the same process as and simultaneously with the fin portion 20 of the FinFET 2. Therefore, even if the capacitor electrode has a rectangular structure cut out of the semiconductor substrate, the whole manufacturing process of the resistance change type memory is inhibited from being complex or the number of manufacturing steps is inhibited from excessively increasing due to the manufacturing process of the capacitor.

Consequently, according to the first embodiment, it is possible to provide a resistance change type memory including a capacitor with a large capacitance.

CONFIGURATION EXAMPLE 1

Configuration example 1 of the resistance change type memory according to the first embodiment is described with reference to FIG. 11 to FIG. 22.

(a) Structure

The structure of the resistance change type memory according to Configuration example 1 of the present embodiment is described with reference to FIG. 11 to FIG. 17.

Here, an MRAM is described as an example of the resistance change type memory. In configuration examples other than this configuration example, an MRAM is shown by way of example to describe the resistance change type memory according to the present embodiment.

FIG. 11 is a plan view showing an example of the chip layout of the MRAM. For example, a plurality of memory cell arrays 61 are provided in one chip. A region (hereinafter referred to as a peripheral region) 7 where constituent elements of the peripheral circuit are formed is provided between the memory cell arrays 61 adjacent in the x-direction and y-direction.

The memory cells MC are formed in the memory cell array 61, and the capacitor 3 is formed in a capacitor region 71 within the peripheral region 7. The capacitor and the memory cell are thus provided in different regions, so that the operation of the whole chip is stabilized.

In the peripheral region 7, a region 72 where peripheral elements other than the capacitor are formed is also provided. Hereinafter, the region (hereinafter referred to as a peripheral transistor region) 72 where peripheral transistors are formed is shown by way of example.

Figure 13:
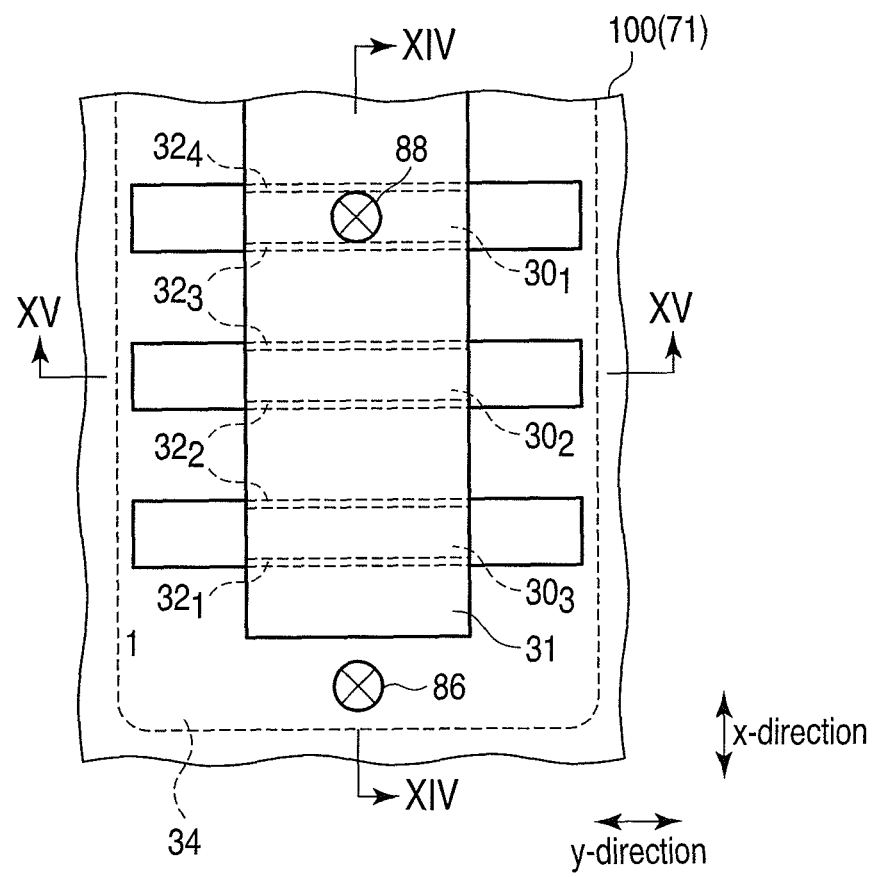
FIG. 13 is a plan view showing an example of the layout of the capacitor.
Figure 14:
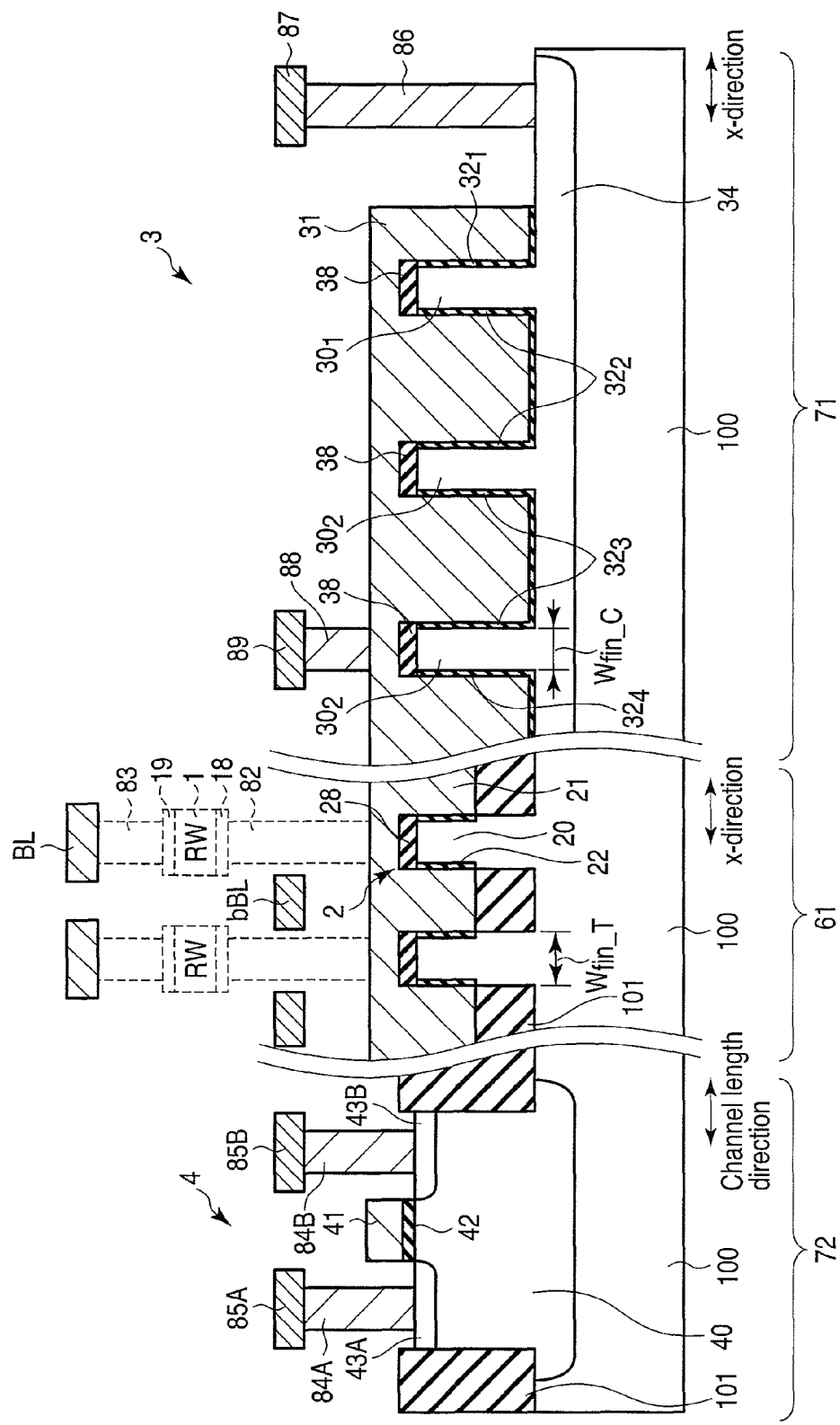
FIG. 14 is a sectional view for illustrating Configuration example 1 of the resistance change type memory according to the first embodiment.
Figure 15:
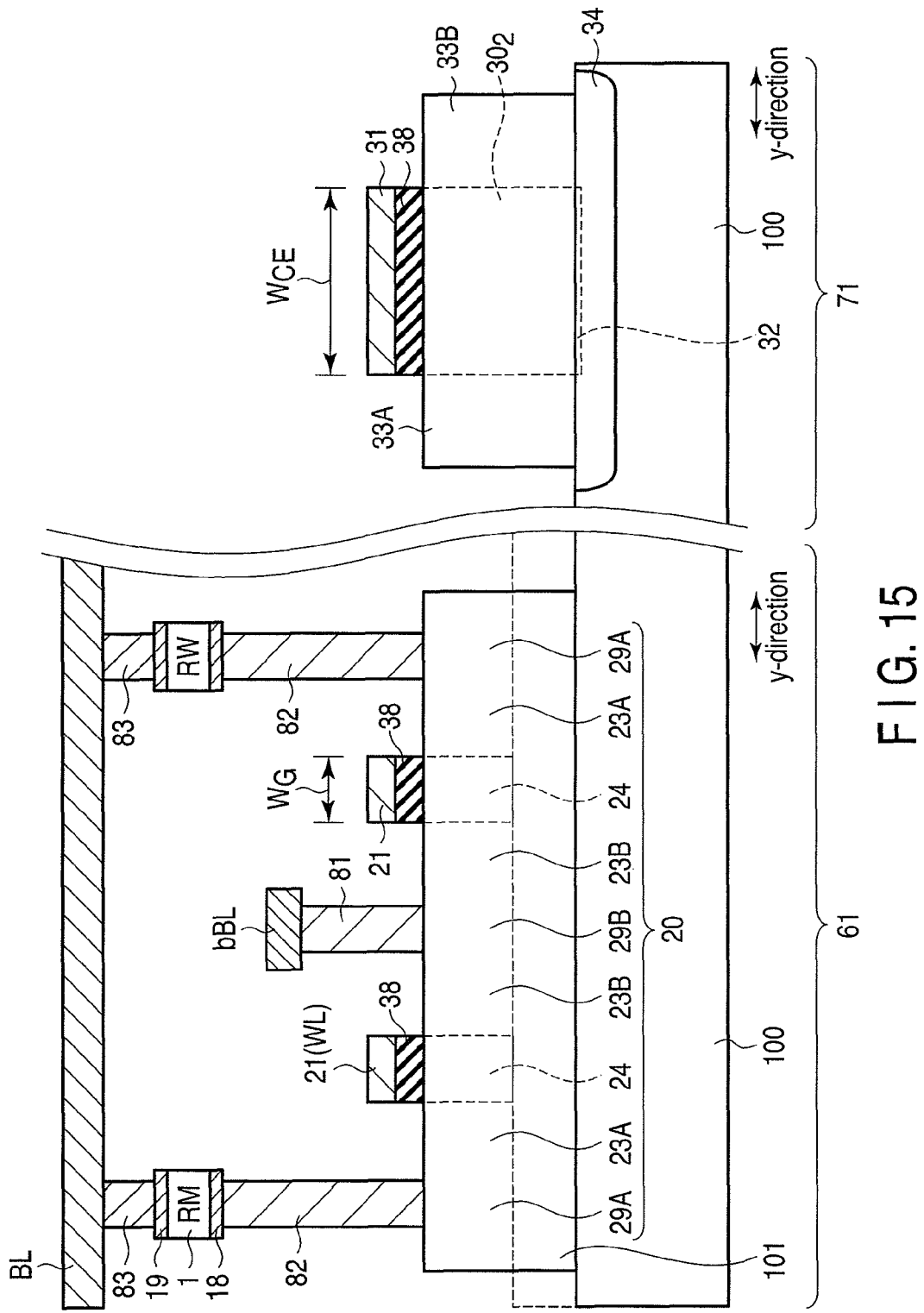
FIG. 15 is a sectional view for illustrating Configuration example 1 of the resistance change type memory according to the first embodiment.

FIG. 12 shows an example of the layout in the memory cell array 61. FIG. 13 shows an example of the layout in the capacitor region 71. FIG. 14 and FIG. 15 show the sectional structures of the memory cell and capacitor in the MRAM according to this configuration example.

FIG. 14 shows the sectional structure along the line XIV-XIV in FIG. 12 and FIG. 13. In FIG. 14, the sectional structure of the peripheral transistor in the channel length direction is shown. In FIG. 15, the sectional structure along the line XV-XV in FIG. 12 and FIG. 13 is shown. In FIG. 14 and FIG. 15, the interlayer insulating films covering the elements on the chip are not shown. In FIG. 14 and FIG. 15, members located far or near in the depth direction of the diagram are indicated by broken lines.

As shown in FIG. 12, FIG. 14 and FIG. 15, the fin portions 20 are arranged in the memory cell array 61 along the x-direction. Although not shown in FIG. 12, it should be understood that the fin portions 20 are arranged in the memory cell array 61 along the y-direction.

As shown in FIG. 12, the fin portion 20 of the select transistor (FinFET) 2 extends in the y-direction, and the gate electrode 21 of the select transistor 2 extends in the x-direction.

The gate electrode 21 of the FinFET 2 extends in the x-direction across a plurality of fin portions 20. One gate electrode 21 is shared by the plurality of fin portions 20. The gate electrode 21 is used as the word line WL of the MRAM. The gate electrode 21 is made of, for example, silicide, polysilicon or a metal. The side surface and upper surface of the gate electrode 21 are covered with, for example, a sidewall insulating film (not shown).

Two gate electrodes 21 form a two-level crossing with respect to one fin portion 20. Thus, two FinFETs 2 are formed by use of one fin portion 20. The channel region 24 of the FinFET is provided at the intersection of each of the gate electrodes 21 and the fin portion 20. The gate electrode 21 faces both side surfaces of the fin portion 20 in the x-direction across the gate insulating film 22. The mask layer 28 is provided between the upper part of the fin portion 20 (channel region 24) and the gate electrode 21. The thickness of the gate insulating film 22 is, for example, about 1 nm to 5 nm.

Between two gate electrodes 21 which make a two-level crossing with respect to the same fin portion 20, the contact region 29B is provided in the fin portion 20. This contact region 29B is shared by two FinFETs 2.

The source/drain regions 23B are provided between the contact region 29B and the channel region 24.

The contact plug 81 is provided in the contact region 29B. The contact plug 81 is connected to the bit line bBL.

The contact regions 29A are provided at one end of the fin portion 20 and the other in the y-direction. The source/drain regions 23A are provided between the contact region 29A and the channel region 24.

The resistance change type storage element 1 is disposed in the contact region 29A. The electrode layers 18, 19 are provided on the bottom surface and upper surface of the resistance change type storage element, respectively.

The resistance change type storage element 1 is connected to the contact region 29A via the contact plug 82. Thus, one end of the resistance change type storage element 1 is connected to one end of the current path of the FinFET 2 as the select transistor 2.

The via plug 83 is provided on the resistance change type storage element 1. The via plug 83 is connected to the bit line BL. The bit lines BL, bBL extend in the y-direction.

Thus, the memory cell is connected to the two bit lines BL, bBL that make a bit line pair.

The fin width $W_{fin\_T}$ of the channel region 24 in the fin portion 20 is, for example, about 20 nm to 100 nm. The impurity concentration of the channel region 24 is set at, for example, about $10^{17}/cm^3$. The impurity concentration of the source/drain regions 23A, 23B and the contact regions 29A, 29B may be equal to or more than the impurity concentration of the channel region 24. Moreover, the source/drain regions 23A, 23B and the contact regions 29A, 29B may include silicide layers.

One fin portion 20 is thus used as an active region to form two memory cells MC, leading to the miniaturization of the memory cell (the reduction of the occupancy area).

In the present embodiment, two bit lines BL, bBL that make a bit line pair are provided at different wiring levels. However, two bit lines BL, bBL may be provided at the same wiring level. Although two bit lines BL, bBL that make a bit line pair extend in the same direction in the present embodiment, two bit lines that make a bit line pair may extend in different directions. Moreover, although the memory cell MC is constituted of one resistance change type storage element and one select transistor in the present embodiment, the present embodiment is not limited to this. One memory cell MC may be constituted of one resistance change type storage element and two select transistors. The layout of the memory cells and interconnects in the memory cell array 61 may be properly changed in accordance with such modifications.

In the MRAM, the resistance change type storage element 1 is a magnetoresistive effect element. In the MRAM, a magnetic tunnel junction (MTJ) element that utilizes a magnetoresistance change caused by a spin-polarized tunneling effect is used.

The structure of the magnetoresistive effect element (MTJ element) as the resistance change type storage element 1 is described with reference to FIG. 16 and FIG. 17. The magnetoresistive effect element will hereinafter be referred to as an MTJ element.

The MTJ element 1 has a stack structure in which a reference layer (also referred to as a magnetization invariable layer or fixed layer) 10A, 10B, an intermediate layer (nonmagnetic layer) 11A, 11B and a storage layer (also referred to as a magnetization free layer or free layer) 12A, 12B are stacked in order. The reference layer 10A, 10B and the storage layer 12A, 12B may be stacked in reverse order.

Figure 16:
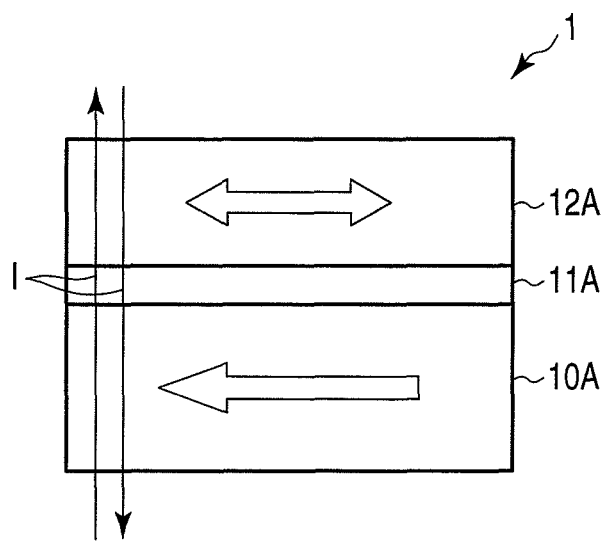
FIG. 16 is a diagram showing an example of a resistance change type storage element.

In the MTJ element 1 shown in FIG. 16, the easy magnetization directions of the reference layer 10A and the storage layer 12A are parallel to a film plane. The MTJ element 1 shown in FIG. 16 is called an in-plane magnetization type MTJ element.

Figure 17:
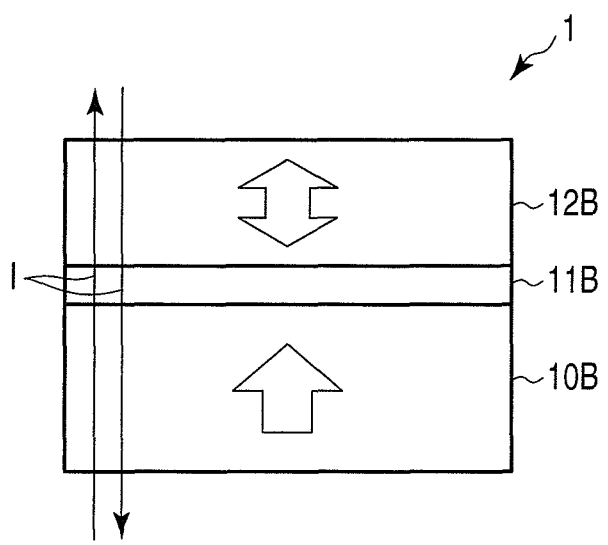
FIG. 17 is a diagram showing an example of the resistance change type storage element.

In the MTJ element 1 shown in FIG. 17, the easy magnetization directions of the reference layer 10B and the storage layer 12B are perpendicular to the film plane (or a stack surface). The MTJ element 1 shown in FIG. 16 is called a perpendicular magnetization type MTJ element.

The in-plane magnetization magnetic layer has a magnetic anisotropy in an in-plane direction. The perpendicular magnetization magnetic layer has a magnetic anisotropy in a direction perpendicular to the film plane. In contrast with the in-plane magnetization type, the advantage of using a perpendicular magnetization type for the MTJ element 1 is that there is no need to control the element shape to decide a magnetization direction, which is suitable for miniaturization.

The magnetization (or spin) direction of the storage layer 12A, 12B is variable (invertible). The magnetization of the reference layer 10A, 10B is fixed (invariable) in direction.

"That the magnetization direction of the reference layer 10A, 10B is fixed (invariable)" means that the magnetization direction of the reference layer 10A, 10B does not change when a magnetization inverting current (inversion threshold) used to invert the magnetization direction of the storage layer 12A, 12B is passed through the reference layer 10A, 10B. Therefore, in the MTJ element 1, a magnetic layer with a high inversion threshold is used as the reference layer 10A, 10B, and a magnetic layer with an inversion threshold lower than that of the reference layer 10A, 10B is used as the storage layer 12A, 12B. This allows the MTJ element 1 to have the storage layer 12A, 12B variable in magnetization direction and the reference layer 10A, 10B fixed in magnetization direction.

In order to fix the magnetization of the reference layer 10A, 10B, an antiferromagnetic layer (not shown) is provided adjacent to the reference layer 10A, 10B. The magnetization direction of the reference layer 10A, 10B can be fixed by the exchange coupling of the reference layer 10A, 10B and the antiferromagnetic layer. However, the magnetization direction of the reference layer 10A, 10B can be fixed without providing any antiferromagnetic layer (not shown) in the case of the perpendicular magnetization type MTJ element. The planar shape of the MTJ element 1 is not particularly limited, and may be, for example, circular, elliptic, square or rectangular.

Alternatively, the MTJ element 1 may have a square or rectangular shape with rounded corners or without corners.

The reference layer 10A, 10B and the storage layer 12A, 12B are made of a magnetic material having high coercive force. For example, the reference layer 10A, 10B and the storage layer 12A, 12B preferably have a high magnetic anisotropy energy density of $1 \times 10^6$ erg/cc or more.

The intermediate layer 12A, 12B is made of a nonmagnetic material such as an insulator, semiconductor or metal. When the insulator or semiconductor is used for the intermediate layer 13, the intermediate layer 13 is referred to as a tunnel barrier layer.

Each of the reference layer 10A, 10B and the storage layer 12A, 12B is not exclusively a single layer as shown, and may have a stack structure of ferromagnetic layers. Otherwise, each of the reference layer 10A, 10B and the storage layer 12A, 12B may have an antiferromagnetically coupled structure or a ferromagnetically coupled structure.

The MTJ element 1 may have a double junction structure. The MTJ element 1 of the double junction structure has a stack structure including a first reference layer, a first intermediate layer, a storage layer, a second intermediate layer and a second reference layer that are stacked in order. The advantage of such a double junction structure is that the magnetization inversion of the storage layer 12A, 12B caused by spin transfer is easily controlled.

The low-resistance state and high-resistance state of the MTJ element 1, writing of data by spin transfer, and reading of data are described below.

A parallel state (low-resistance state) is described wherein the magnetization directions of the reference layer 10A, 10B and the storage layer 12A, 12B are parallel.

The majority of electrons which have passed through the reference layer 10A, 10B have a spin parallel to the magnetization direction of the reference layer 10A, 10B. The spin angular momentum of the majority of electrons moves to the storage layer 12A, 12B. As a result, spin torque is applied to the storage layer 12A, 12B, and the magnetization direction of the storage layer 12A, 12B becomes parallel to the magnetization direction of the reference layer 10A, 10B. In this parallel arrangement, the resistance value of the MTJ element 1 is the lowest. This condition is treated as, for example, data "0".

An antiparallel state (high-resistance state) is described next wherein the magnetization directions of the reference layer 10A, 10B and the storage layer 12A, 12B are antiparallel.

The majority of electrons which have been reflected by the reference layer 10A, 10B have a spin antiparallel to the magnetization direction of the reference layer 10A, 10B. The spin angular momentum of the majority of electrons moves to the storage layer 12A, 12B. As a result, spin torque is applied to the storage layer 12A, 12B, and the magnetization direction of the storage layer 12A, 12B becomes antiparallel to the magnetization direction of the reference layer 10A, 10B. In this antiparallel arrangement, the resistance value of the MTJ element 1 is the highest. This condition is treated as, for example, data "1".

Data is read by supplying a read current $I_{read}$ to the MTJ element 1. A value defined by "(R1−R0)/R0" is called a magnetoresistance ratio (MR ratio), wherein R0 is a resistance value in the parallel state, and R1 is a resistance value in the antiparallel state. The magnetoresistance ratio varies depending on the material forming the MTJ element 1 and on process conditions, and can take a value of about several ten percent to several hundred percent.

A variation of the read current (potential of the bit line) attributed to the MR ratio is detected to read information stored in the MTJ element 1.

As shown in FIG. 13 to FIG. 15, fin portions $30_1$, $30_2$, $30_3$ as the components of the capacitor 3 extend in the y-direction. The capacitor electrode 31 of the capacitor 3 extends in the x-direction. In this configuration example, the fin portion 30 in the capacitor region 71 extends in the x-direction similarly to the fin portion 20 in the memory cell array for clearer explanation. It should be understood that the fin portions $30_1$, $30_2$, $30_3$ of the capacitor region 71 may extend in the y-direction depending on the layout of the capacitor 3. Similarly, the capacitor electrode 31 may also extend in the x-direction or y-direction as long as this extending direction intersects with the extending direction of the fin portion.

In this configuration example, one capacitor electrode 31 makes a two-level crossing with respect to the fin portions $30_1$, $30_2$, $30_3$.

Furthermore, in this configuration example, the isolation insulating film is removed between the capacitor electrode 31 and the semiconductor substrate 100. The bottom surface of the capacitor electrode 31 and the upper surface of the semiconductor substrate 100 face each other via capacitor insulating films $32_1$, $32_2$, $32_3$, $32_4$ that cover the upper surface of the semiconductor substrate 100. As a result, the capacitance of the capacitor 3 is formed not only between the capacitor electrode 31 and the side surfaces of the fin portions (capacitor electrodes) $30_1$, $30_2$, $30_3$ but also between the capacitor electrode 31 and the upper surface of the semiconductor substrate 100.

The capacitor insulating film $32_2$ is continuous between the side surfaces of the fin portions $30_1$, $30_2$ facing each other, via the upper surface of the semiconductor substrate 100.

The mask layer 38 is provided between the upper parts of the fin portions $30_1$, $30_2$, $30_3$ and the capacitor electrode 31.

In the capacitor 3, a channel (inversion layer) formed in the fin portions $30_1$, $30_2$, $30_3$ or fin portion functions as, for example, the other capacitor electrode to pair with the capacitor electrode 31. Therefore, the impurity concentration of the fin portions $30_1$, $30_2$, $30_3$ as the components of the capacitor 3 is preferably higher than the impurity concentration of the channel region 24 of the fin portion 20 of the FinFET 2. The impurity concentration of the fin portions $30_1$, $30_2$, $30_3$ as the components of the capacitor 3 is set at, for example, a value of about $10^{19}/cm^3$ to $10^{21}/cm^3$. The resistance value of the fin portions $30_1$, $30_2$, $30_3$ is preferably low.

For example, in the capacitor 3 of the resistance change type memory according to the present embodiment, the fin portions $30_1$, $30_2$, $30_3$ as the components of the capacitor are p-type semiconductor regions containing an acceptor impurity (e.g., boron) or are otherwise n-type semiconductor regions containing a donor impurity (e.g., arsenic or phosphorus).

Furthermore, when the upper surface of the semiconductor substrate 100 functions as a capacitor electrode, an impurity is also preferably added to the surface layer of the semiconductor substrate 100. Thus, as shown in FIG. 14, an impurity diffusion layer 34 is provided on the surface layer of the semiconductor substrate 100. The impurity concentration of the impurity diffusion layer 34 may be the same value as or a different value from the impurity concentration of the fin portions $30_1$, $30_2$, $30_3$.

The capacitor electrode 31 has, for example, a interdigital-shaped sectional structure in a direction that intersects with the extending direction of the fin portions $30_1$, $30_2$, $30_3$. When the upper surface of the semiconductor substrate 100 is used as a capacitor electrode, the capacitor electrode including the fin portions $30_1$, $30_2$, $30_3$ and the semiconductor substrate 100 (impurity diffusion layer 34) also has a interdigital-shaped sectional structure.

The capacitor electrode 31 is formed substantially simultaneously with the gate electrode 21 of the FinFET, and made of the same material as the gate electrode 21. The upper surface and side surface of the capacitor electrode 31 are covered with, for example, a sidewall insulating film (not shown).

The contact plug 86 is provided, for example, on the impurity diffusion layer 34 on the surface layer of the semiconductor substrate 100. Thus, the contact plug 86 as the input/output terminal of the capacitor 3 is electrically connected to the semiconductor regions $30_1$, $30_2$, $30_3$, 34 as the components of the capacitor 3. However, the contact plug 86 has only to be electrically connected to one of the fin portions $30_1$, $30_2$, $30_3$ and semiconductor substrate 100 so that a potential can be applied to the capacitor electrode (semiconductor region). The contact plug 88 is provided on the capacitor electrode 31. Thus, the contact plug 88 as the input/output terminal of the capacitor is electrically connected to the capacitor electrode 31.

The fin width $W_{fin\_C}$ of the fin portions $30_1$, $30_2$, $30_3$ as the components of the capacitor 3 may be the same as or different from the fin width $W_{fin\_T}$ of the fin portion 20 (channel region 24) of the FinFET 2.

The dimension $W_{CE}$ of the capacitor electrode 31 in the extending direction (y-direction) of the fin portions $30_1$, $30_2$, $30_3$ may be different from the dimension (gate length) $W_G$ of the gate electrode 21 in the extending direction (y-direction) of the fin portion 20. When the dimension $W_{CE}$ is larger than the gate length $W_G$, the area in which the capacitor electrode 31 faces the fin portions $30_1$, $30_2$, $30_3$ as the components of the capacitor 3 can be larger.

It can be considered that a trench is formed in the semiconductor substrate 100 by two fin portions $30_1$, $30_2$, $30_3$ as the components of the capacitor that are adjacent in the x-direction and by the upper surface of the semiconductor substrate 100. Although the capacitor electrode 31 is continuous on the fin portions $30_1$, $30_2$, $30_3$ in this configuration example, the capacitor electrode 31 may be separated in conformity with the fin portions $30_1$, $30_2$, $30_3$. In this case, the structure including the fin portions $30_1$, $30_2$, $30_3$ as the components of the capacitor that make a pair and including the capacitor electrode 31 are the same as the structure of the FinFET as the select transistor, thereby facilitating the processing of the inside of the chip. Moreover, the capacitor may have a structure in which the capacitor electrode 31 is embedded in the trench between two fin portions $30_1$, $30_2$, $30_3$ adjacent in the x-direction so that the capacitor electrode 31 is electrically isolated between two fin portions. In this case, the upper end of the capacitor electrode 31 corresponds to the upper end of the mask layer 38. In addition, it should be appreciated that the number of the fin portions $30_1$, $30_2$, $30_3$ for forming one capacitor may be properly changed depending on the capacitance required for the capacitor.

As shown in FIG. 14, in the resistance change type memory according to the present embodiment, the peripheral transistor 4 is, for example, a planar field effect transistor. In FIG. 14, the sectional structure of the peripheral transistor in its channel length direction is shown.

The peripheral transistor 4 is provided on an active region 40 defined by the isolation insulating film 101.

Source/drain diffusion layers 43A, 43B are provided in the active region 40. A gate insulating film 42 is provided on the surface of the active region 40 between two source/drain diffusion layers 43A, 43B. A gate electrode 41 is provided on the gate insulating film 42.

Similarly to the select transistor, the FinFET may be used as the peripheral transistor.

Depending on the operation mode of the peripheral transistor 4, the active region 40 where the peripheral transistor 4 is provided may be a well region to which an impurity is added or may be an intrinsic semiconductor region to which no impurity is added.

In the resistance change type memory (e.g., MRAM) according to Configuration example 1 of the present embodiment shown in FIG. 12 to FIG. 15, the FinFET is used for the select transistor 2 in the memory cell.

In the FinFET 2 included in the memory according to configuration example, the gate electrode 21 makes a two-level crossing with respect to the fin portion 20 as the active region. Further, the side surface of the fin portion 20 having the channel region 24 faces the gate electrode 21 across the gate insulating film 22.

In the capacitor 3 included in the memory according to this configuration example, the capacitor electrode 31 faces the side surfaces of the fin portions $30_1$, $30_2$, $30_3$ as the components of the capacitor 3 across the capacitor insulating films $32_1$, $32_2$, $32_3$, $32_4$.

In this configuration example, the capacitance of the capacitor 3 is generated between the capacitor electrode 31 and the side surfaces of the fin portions $30_1$, $30_2$, $30_3$ as the components of the capacitor as well as the upper surface of the semiconductor substrate 100.

Furthermore, in this configuration example, one capacitor electrode 31 extends across a plurality of fin portions $30_1$, $30_2$, $30_3$. As a result, the capacitance of one capacitor 3 can be larger.

The dimension $W_{CE}$ of the capacitor electrode 31 in the extending direction (y-direction) of the fin portions $30_1$, $30_2$, $30_3$ is preferably larger than the dimension $W_G$ of the gate electrode 21 in the extending direction (y-direction) of the fin portion 20. In this case, the area in which the capacitor electrode 31 faces the fin portions $30_1$, $30_2$, $30_3$ as the components of the capacitor 3 can be larger, and the capacitance of the capacitor can be larger.

As a result, according to this configuration example, the increase in the area occupied by the capacitor 3 in the chip is inhibited, so that the capacitance of the capacitor 3 can be larger.

As will be described later, the fin portions $30_1$, $30_2$, $30_3$ as the components of the capacitor 3 can be formed in substantially the same process as the fin portion 20 which serves as the active region of the FinFET. Thus, there is no process in addition to the process of forming the memory cell or no excessive increase in processing difficulty in order to form a capacitor that uses the fin portion as an electrode.

Consequently, according to Configuration example 1 of the present embodiment, it is possible to provide a resistance change type memory including a capacitor with a large capacitance.

(b) Manufacturing Method

A method of manufacturing the resistance change type memory according to Configuration example 1 of the present embodiment is described with reference to FIG. 18 to FIG. 22. In FIG. 18 to FIG. 22, sectional process views in a direction (x-direction) that intersects with the extending direction of the fin portion in manufacturing steps are shown.

Figure 18:
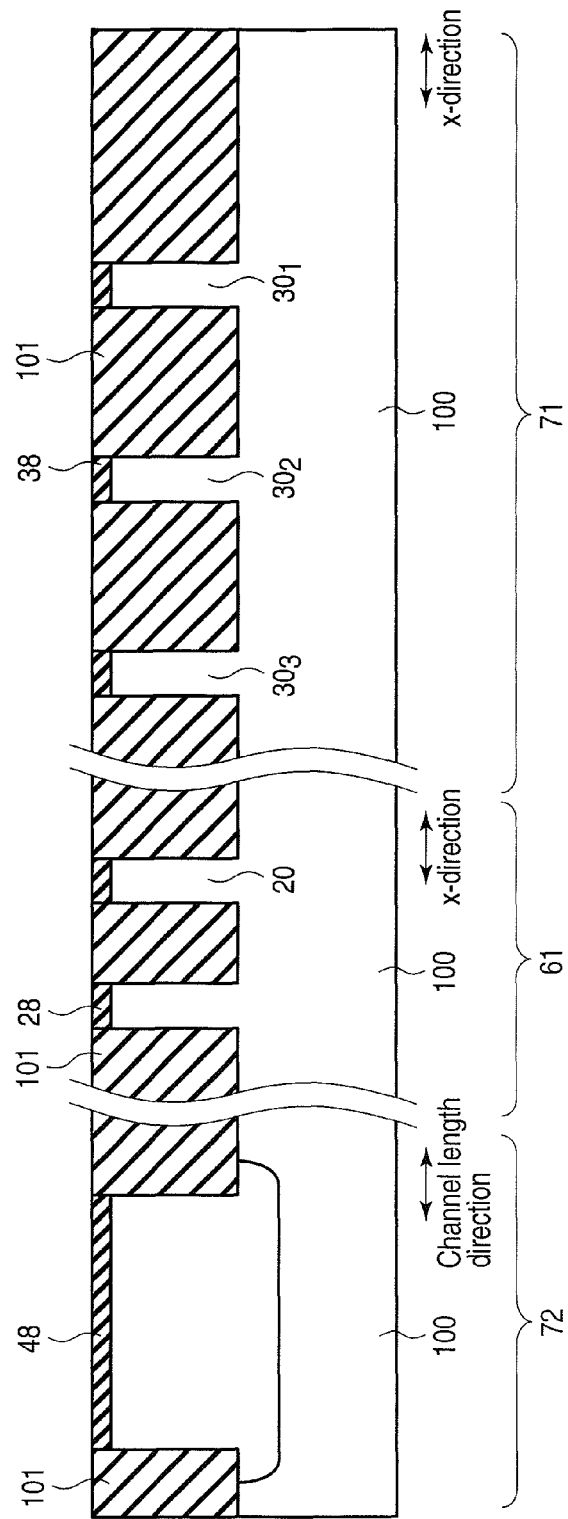
FIG. 18 is a sectional process view showing a step of a method of manufacturing the resistance change type memory according to the first embodiment.

FIG. 18 is a sectional view showing a step of the method of manufacturing the resistance change type memory according to the present embodiment.

As shown in FIG. 18, for example, a silicon nitride film is deposited on a semiconductor substrate 100 by a chemical vapor deposition (CVD) method. For example, before the silicon nitride film is formed, an impurity region (e.g., a well region) having a predetermined impurity concentration is properly formed in a predetermined domain of the semiconductor substrate 100 by ion implantation.

The silicon nitride film is processed into a predetermined shape by a pattern transfer technique and a reactive ion etching (RIE) method, and mask layers 28, 38, 48 are formed on the semiconductor substrate 100. For example, the mask layer 28 is patterned by a sidewall transfer technique at a position where a fin portion of the FinFET is formed in a memory cell array 61. The mask layer 48 is patterned by a photolithographic technique at a position where an active region of a peripheral transistor region 72 is formed. Further, the mask layer 38 is patterned by, for example, a sidewall processing technique at a position where the fin portion as a component of a capacitor is formed in a capacitor region 71.

The semiconductor substrate 100 is etched by the RIE method on the basis of the formed mask layers 28, 38, 48, and a trench is formed in the semiconductor substrate.

As a result of the formation of the trench, a fin portion 20 is formed in the semiconductor substrate 100 of the memory region (memory cell array) 61. Similarly to the memory region, fin portions $30_1$, $30_2$, $30_3$ are formed in the capacitor region 71. The fin portions 20, $30_1$, $30_2$, $30_3$ are rectangular semiconductor regions projecting from the semiconductor substrate.

The fin portion 20 formed in the memory region 6 serves as an active region of the FinFET. On the other hand, the fin portions $30_1$, $30_2$, $30_3$ formed in the capacitor region 71 serve as the components of the capacitor (or the electrodes of the capacitor).

When the fin width of the fin portions $30_1$, $30_2$, $30_3$ as the components of the capacitor may be different from the fin width of the fin portion 20 of the FinFET, the mask layer for forming the fin portions as the components of the capacitor may be patterned by the photolithographic technique.

A silicon oxide film is deposited on the semiconductor substrate 100 by, for example, the CVD method. The deposited silicon oxide film is planarized by chemical mechanical polishing (CMP) using the mask layers 28, 38, 48 as stoppers.

An isolation insulating film 101 is embedded into the trench of the semiconductor substrate 100. Thus, the peripheral transistor region 72 is defined by the isolation insulating film 101.

Figure 19:
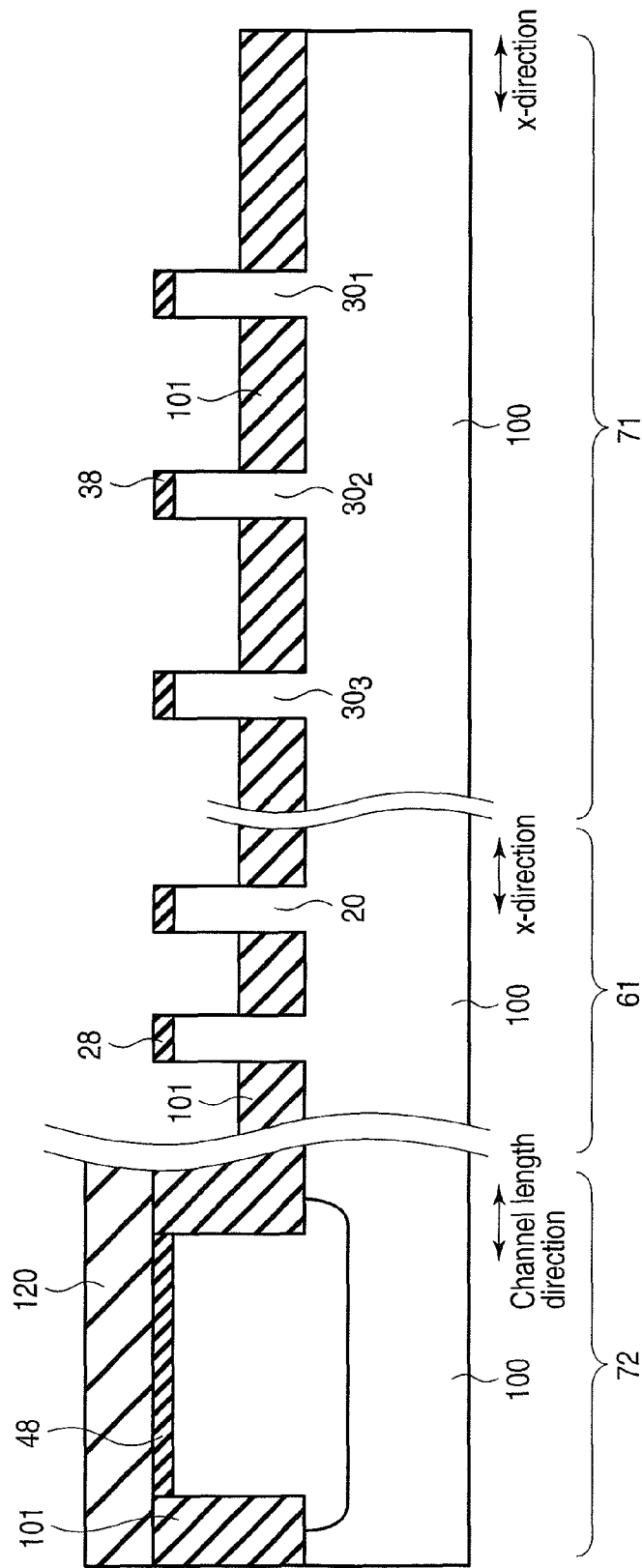
FIG. 19 is a sectional process view showing a step of the method of manufacturing the resistance change type memory according to the first embodiment.

FIG. 19 shows a step of the method of manufacturing the resistance change type memory according to the present embodiment.

As shown in FIG. 19, a resist mask 120 is formed by the photolithographic technique on the semiconductor substrate 100 and on the isolation insulating film 101 to cover the peripheral transistor region 72. Further, the isolation insulating film 101 in the memory cell array 61 and the capacitor region 71 is etched. This etching is carried out under the condition that ensures etching selectivity between the mask layers (silicon nitride) 28, 38 and the isolation insulating film (silicon oxide) 101.

As a result of the etching of the isolation insulating film 101, the upper surface of the isolation insulating film 101 retreats toward the semiconductor substrate in a region that is not covered with the resist mask 120.

Thus, the side surface of the fin portion 20 in the memory cell array 61 is exposed. At the same time, the side surfaces of the fin portions $30_1$, $30_2$, $30_3$ in the capacitor region 71 are exposed because the capacitor region 71 is not covered with the resist mask either.

FIG. 20 shows a step of the method of manufacturing the resistance change type memory according to the present embodiment.

For example, after the resist in the peripheral transistor region 72 is removed, a resist mask 121 is formed on the semiconductor substrate 100 and on the isolation insulating film 101 to cover the memory cell array 61 and the peripheral transistor region 72. An opening that exposes the capacitor region 71 is formed in the resist mask 121.

Furthermore, etching is carried out to remove the isolation insulating film in the capacitor region 71. As a result, the upper surface of the semiconductor substrate 100 is exposed in the capacitor region 71.

An impurity region 34 is formed at a predetermined place in the semiconductor substrate by, for example, ion implantation. The impurity region 34 may be formed simultaneously with the formation of the well region in the semiconductor substrate, or may be separately formed before the isolation insulating film is formed.

Figure 21:
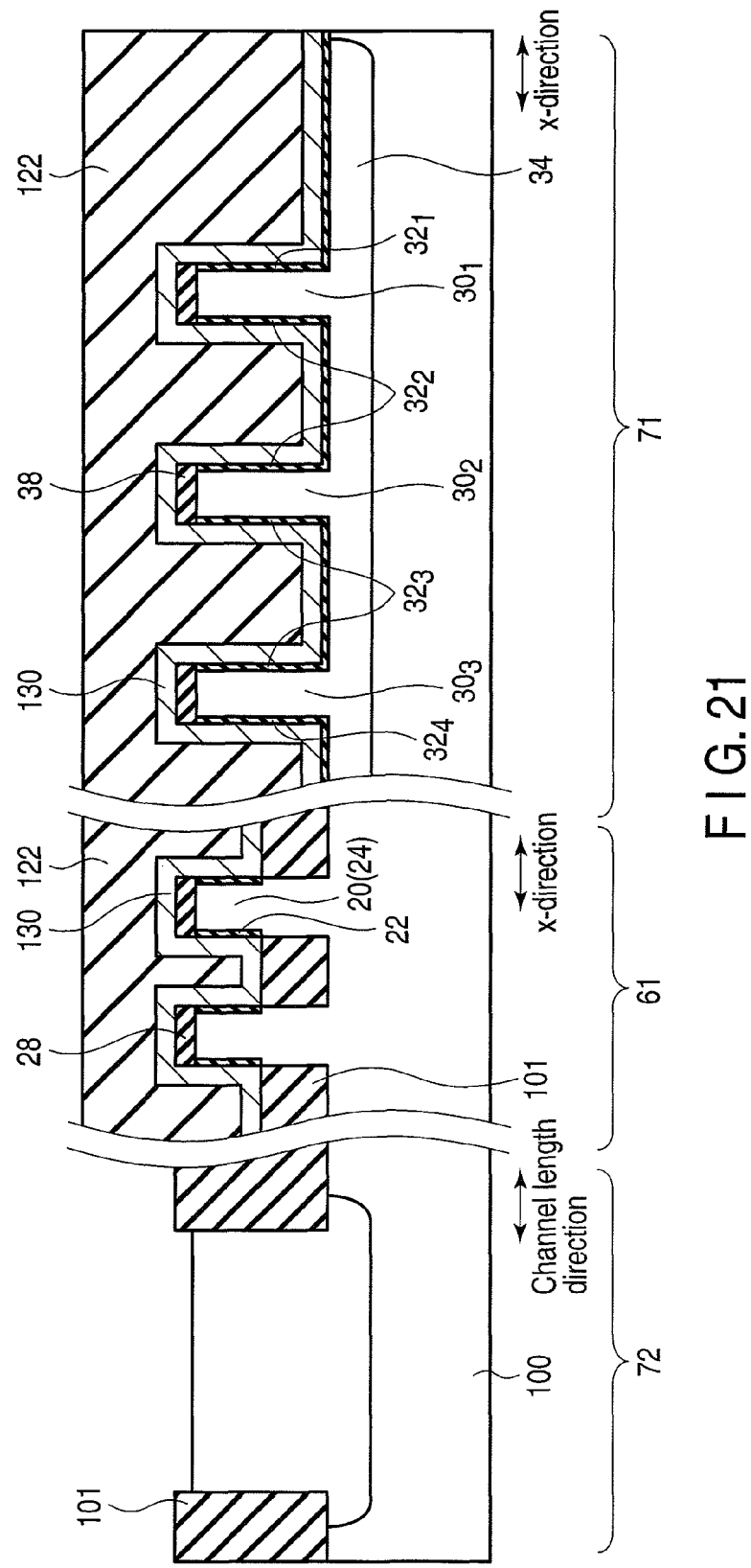
FIG. 21 is a sectional process view showing a step of the method of manufacturing the resistance change type memory according to the first embodiment.

FIG. 21 shows a step of the method of manufacturing the resistance change type memory according to the present embodiment.

After the resist mask is removed from the semiconductor substrate 100, insulating films 22, $32_1$, $32_2$, $32_3$, $32_4$ are formed on the exposed surface of the semiconductor region by, for example, a thermal oxidation method or the CVD method. As a result, a gate insulating film 22 of the FinFET as a select transistor is formed on the side surface of the fin portion 20 in the memory cell array 61. Capacitor insulating films $32_1, 32_2, 32_3, 32_4$ are also formed on the side surfaces of the fin portions $30_1, 30_2, 30_3$ in the capacitor region 71 and on the upper surface of the semiconductor substrate 100 in the capacitor region 71.

For example, polysilicon layers 28, 38 are deposited on the semiconductor substrate 100 by the CVD method. After the silicon layers are deposited, a resist mask 122 is formed to cover the memory cell array 61 and the capacitor region 71. An opening is formed in the resist mask 122 on the upper surface of the peripheral transistor region 72. The silicon layers and the mask layers are removed from the peripheral transistor region 72 on the basis of the pattern of the mask 122.

Figure 22:
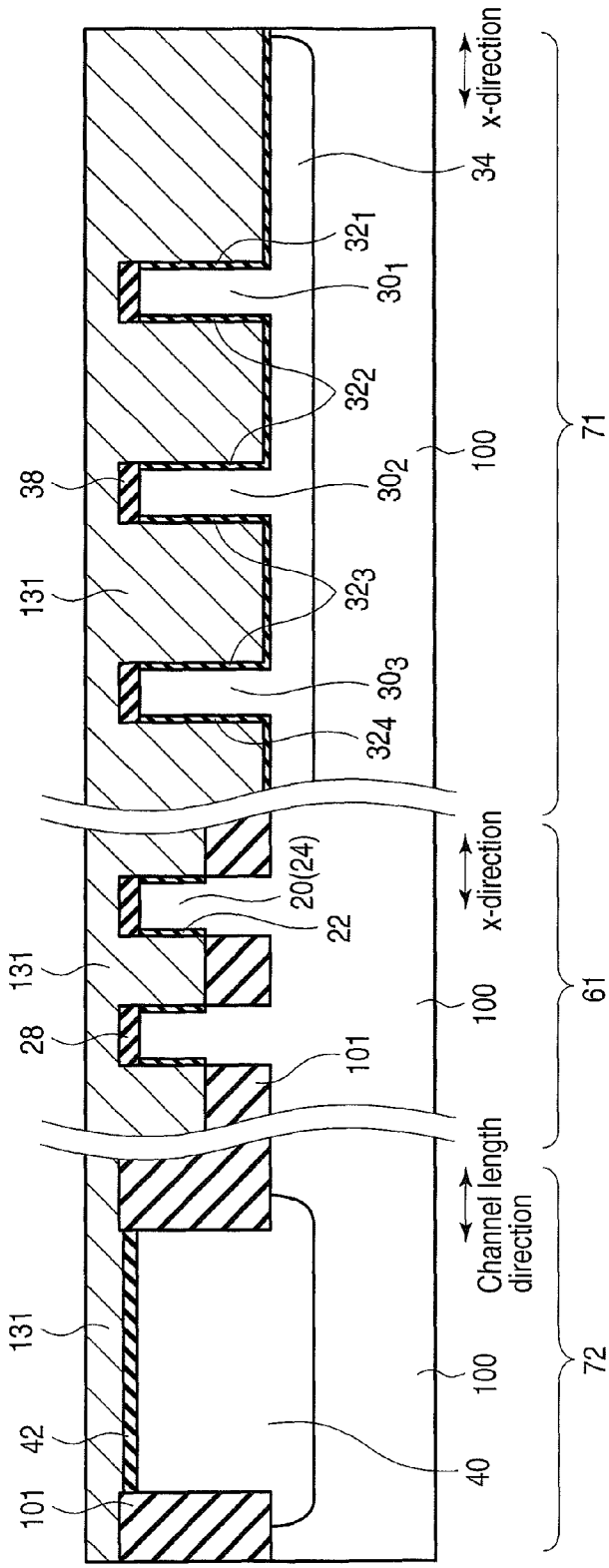
FIG. 22 is a sectional process view showing a step of the method of manufacturing the resistance change type memory according to the first embodiment.

FIG. 22 shows a step of the method of manufacturing the resistance change type memory according to the present embodiment.

A gate insulating film 42 of the transistor is formed in the peripheral transistor region 72 by, for example, the thermal oxidation method. After the resist mask is removed from the memory cell array 61 and the capacitor region 71, a polysilicon layer is deposited in the regions 61, 71, 72 by the CVD method. The upper surface of the a polysilicon layer 131 is planarized by, for example, the CMP.

Thus, the polysilicon layer 131 for forming the gate electrodes of the transistors and the electrode of the capacitor is formed in the memory cell array 61, the capacitor region 71 and the peripheral region 72.

The polysilicon layer 131 is processed into a predetermined shape by the photolithographic technique and the RIE method. As shown in FIG. 12 to FIG. 15, in the memory cell array 61, a gate electrode 22 of the FinFET 2 is formed to make a two-level crossing with respect to the fin portion 20 as the active region. The gate electrode 22 faces the side surface of the fin portion 20 via the gate insulating film 22.

Substantially simultaneously with the formation of the gate electrode of the FinFET 2, the polysilicon layer for forming the capacitor electrode is processed in the capacitor region 71 so that the polysilicon layer is not divided between the fin portions $30_1, 30_2, 30_3$ adjacent in the x-direction. As a result, the capacitance of the capacitor is formed between the fin portions $30_1, 30_2, 30_3$ and the capacitor electrode 31 across the capacitor insulating films $32_1, 32_2, 32_3$.

A gate electrode 21 and the capacitor electrode 31 are used as masks to carry out ion implantation. The impurity concentrations of the source/drain regions 23A, 23B and contact regions 29A, 29B in the fin portion 20 are adjusted. For example, at the same time, the capacitor electrode 31 is used as a mask to carry out ion implantation, and a diffusion region having substantially the same impurity concentration as the source/drain regions 23A, 23B is formed in the fin portions $30_1, 30_2, 30_3$ of the capacitor 3.

Subsequently, an interlayer insulating film (not shown) is deposited on the semiconductor substrate 100. Further, a contact plug, an interconnect and a bit line are formed at predetermined places in the regions 61, 71, 72 by, for example, a known multilevel interconnection technique such as a damascene method.

As described above, the resistance change type memory according to the first embodiment is manufactured.

Thus, according to the manufacturing method described above, the select transistor and the capacitor in the memory cell can be substantially simultaneously formed in the common process. Therefore, according to the method of manufacturing the resistance change type memory in the present embodiment, an excessive increase in the manufacturing steps or an increase in the complexity of the manufacturing process due to the formation of a capacitor having a large capacitance can be inhibited.

Furthermore, the capacitor 3 in the resistance change type memory according to the present embodiment uses, for the capacitor electrode, the semiconductor region (fin portions $30_1, 30_2, 30_3$) formed simultaneously with the fin portion 20 of the FinFET. The capacitance of the capacitor is formed on the side surface of the capacitor electrode configured by this semiconductor region (or channel).

Thus, a step extending from the upper ends of the fin portions $30_1, 30_2, 30_3$ as the components of the capacitor to the lower ends thereof is used. This ensures the area in which the semiconductor region and the capacitor electrode face each other.

Therefore, in the resistance change type memory according to the present embodiment, the capacitance of the capacitor can be increased without increasing the area occupied in the surface of the substrate.

Consequently, according to the method of manufacturing the resistance change type memory in the present embodiment, it is possible to relatively easily provide a resistance change type memory including a capacitor with a large capacitance.

CONFIGURATION EXAMPLE 2

Figure 23:
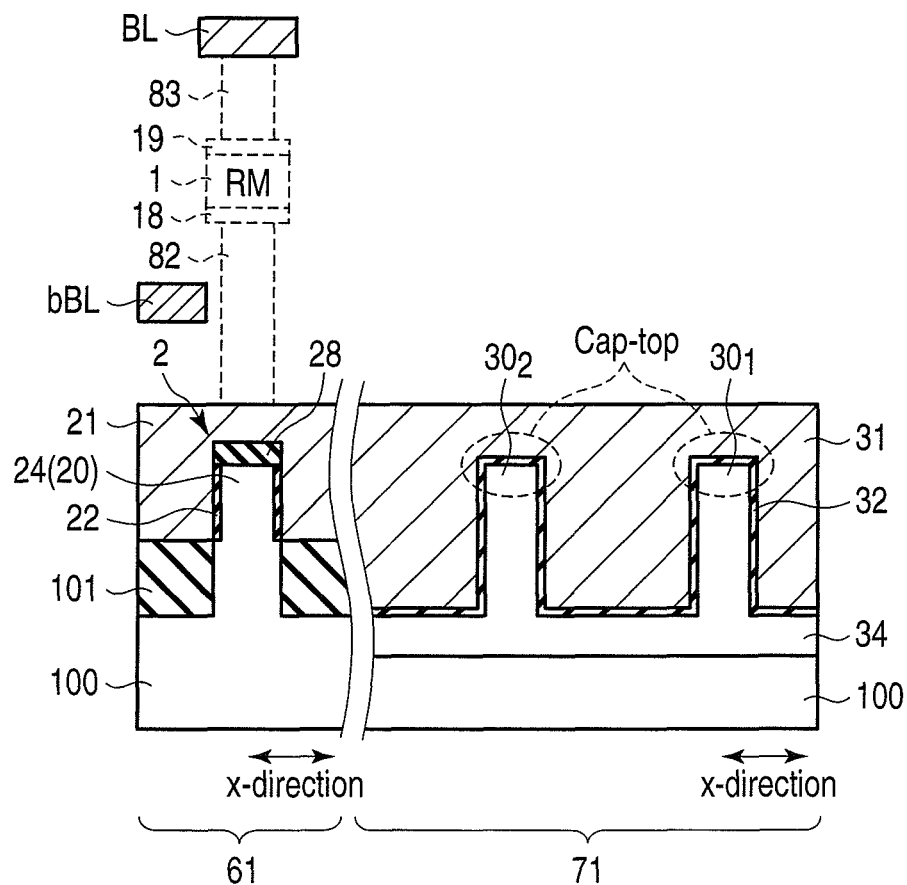
FIG. 23 is a sectional view for illustrating Configuration example 2 of the resistance change type memory according to the first embodiment.
Figure 24:
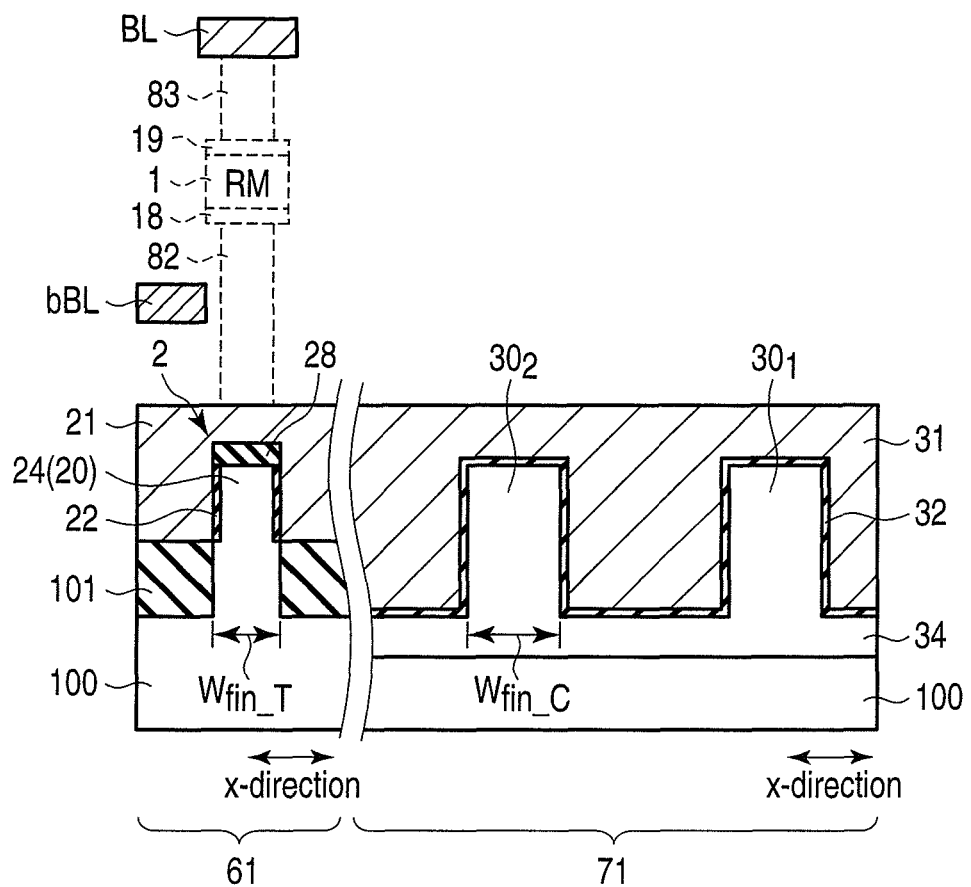
FIG. 24 is a sectional view for illustrating Configuration example 2 of the resistance change type memory according to the first embodiment.

Configuration example 2 of the resistance change type memory according to the present embodiment is described with reference to FIG. 23 and FIG. 24. FIG. 23 and FIG. 24 show the sectional structures of the memory cell and capacitor in the x-direction. In FIG. 23 and FIG. 24, the interlayer insulating films covering the elements on the chip are not shown. In FIG. 23 and FIG. 24, members located far or near in the depth direction of the diagram are indicated by broken lines.

When the upper part of the fin portion 20 of the FinFET 2 is used as the channel region, the upper part of the fin portion 20 tends to be a singularity in regard to the distribution of the electric field between the gate electrode 21 and the upper part of the channel region 24, as compared with the side surface of the fin portion 20. As a result, the FinFETs in the memory cell array vary in characteristics, and the operation of the resistance change type memory becomes unstable.

It is therefore not desirable for the FinFET to use the upper part of the fin portion 20 as a channel region.

On the contrary, in the capacitor 3 that uses the fin portions $30_1, 30_2, 30_3$ as the components of the element, the upper parts of the fin portions $30_1, 30_2, 30_3$ are used as pars of the capacitor. Thus, the adverse effect of the upper parts of the fin portions $30_1, 30_2, 30_3$ on the operation of the capacitor is much smaller than the effect on the operating characteristics of the transistor.

Therefore, as in Configuration example 2 of the present embodiment shown in FIG. 23, the mask layer covering the upper parts of the fin portions (semiconductor regions) $30_1, 30_2, 30_3$ as the components of the capacitor may be detached to use the upper parts of the fin portions $30_1, 30_2, 30_3$ as parts of the capacitor electrode.

As shown in FIG. 23, the capacitor insulating film 32 is provided instead of the mask layer on the upper surfaces of the fin portions $30_1, 30_2, 30_3$ as the components of the capacitor.

The mask layer in the capacitor region 71 is detached, for example, simultaneously with the step of detaching the mask layer in the peripheral transistor region 72.

For example, the capacitor insulating film 32 on the upper surfaces of the fin portions $30_1$, $30_2$, $30_3$ is formed simultaneously with the capacitor insulating film 32 on the side surfaces of the fin portions $30_1$, $30_2$, $30_3$. When the upper surface of the semiconductor substrate 100 (impurity diffusion region 34) between the adjacent fin portions $30_1$, $30_2$, $30_3$ is used as part of the capacitor electrode, the capacitor insulating film 32 is formed across the fin portions $30_1$, $30_2$, $30_3$. The capacitor insulating film 32 is continuous on the upper surfaces and side surfaces of the fin portions $30_1$, $30_2$, $30_3$ and on the semiconductor substrate 100.

The capacitor electrode 31 not only faces the side surfaces of the fin portions $30_1$, $30_2$, $30_3$ but also faces the upper surfaces of the fin portions $30_1$, $30_2$, $30_3$ via the capacitor insulating film 32.

A capacitance Cap top is formed between the upper surfaces of the fin portions $30_1$, $30_2$, $30_3$ as the components of the capacitor and the capacitor electrode 31 covering the fin portions $30_1$, $30_2$, $30_3$.

Thus, as compared with the case where the upper parts of the fin portions $30_1$, $30_2$, $30_3$ as the components of the capacitor are covered with the thick mask layer (see FIG. 14 and FIG. 15), the capacitor 3 according to this configuration example uses the upper surfaces of the fin portions $30_1$, $30_2$, $30_3$ as parts of the capacitor electrode, so that the area in which the semiconductor regions $30_1$, $30_2$, $30_3$ and the capacitor electrode 31 face each other can be larger, and the capacitance of the capacitor can be larger.

When the upper parts of the fin portions $30_1$, $30_2$, $30_3$ are used to form the capacitance, the fin width $W_{fin\_C}$ of the fin portions $30_1$, $30_2$, $30_3$ as the components of the capacitor may be larger than the fin width $W_{fin\_T}$ of the FinFET 2, as shown in FIG. 24. This enables a larger area in which the upper surfaces of the fin portions (capacitor electrode) $30_1$, $30_2$, $30_3$ and the capacitor electrode 31 face each other.

The fin width $W_{fin\_T}$ of the FinFET 2 as the select transistor is preferably set at a fin width at which the FinFET can be driven in a fully depleted mode. The impurity concentration of the fin portions $30_1$, $30_2$, $30_3$ as the components of the capacitor is preferably high to reduce the resistance value. However, the impurity concentration of the fin portion 20 (channel region 24) of the FinFET is preferably set at an impurity concentration at which the FinFET can be driven in the fully depleted mode.

As shown in FIG. 23 and FIG. 24, the upper surfaces of the fin portions $30_1$, $30_2$, $30_3$ as the components of the capacitor face the capacitor electrode 31 via the capacitor insulating film 32 so that the capacitance of the capacitor 3 can be larger.

Consequently, according to Configuration example 2 of the present embodiment, it is possible to provide a resistance change type memory including a capacitor with a large capacitance.

CONFIGURATION EXAMPLE 3

Configuration example 3 of the resistance change type memory according to the present embodiment is described with reference to FIG. 25 and FIG. 26. FIG. 25 and FIG. 26 show the sectional structures of the memory cell and capacitor according to this configuration example in the x-direction. In FIG. 25 and FIG. 26, the interlayer insulating films covering the elements on the chip are not shown. In FIG. 25 and FIG. 26, members located far or near in the depth direction of the diagram are indicated by broken lines.

In the FinFET 2 as the select transistor, the thickness of the gate insulating film 22 is reduced to enhance the current driving capability of the transistor. For the gate insulating film, it is preferable to use a material such as $SiO_2$ that can improve the mobility of a carrier in the channel region 24.

A direct-current high voltage is constantly applied to the capacitor 3 to stabilize the operation of the chip. Thus, the insulating film as the component of the capacitor 3 requires a high breakdown voltage.

In this configuration example, when the material of a capacitor insulating film 32A used in the capacitor 3 is the same as the material of the gate insulating film 22 used in the FinFET 2, the thickness t_ci of the capacitor insulating film 32A is preferably larger than the thickness t_gi of the gate insulating film 22, as shown in FIG. 25. In this case, the breakdown voltage of the capacitor insulating film 32A used in the capacitor 3 is improved.

As shown in FIG. 26, the material for forming a capacitor insulating film 32B may be different from the material for forming the gate insulating film 22. In this case, as compared with the gate insulating film 22, a material having a high dielectric constant and a structure which does not easily deteriorate in the breakdown voltage are applied to the capacitor insulating film 32B.

For example, when the material of the gate insulating film 22 is $SiO_2$, silicon nitride ($Si_mN_n$), aluminum oxide ($Al_mO_n$), hafnium oxide ($HfO_n$) or lanthanum oxide ($LaO_n$) is used as the material of the capacitor insulating film 32B. "m" and "n" in the composition formula in each of the above-mentioned materials are values larger than 0 based on the stoichiometric composition.

The capacitor insulating films 32A, 32B may have a stack structure for a higher dielectric breakdown voltage. For example, the insulating films 32A, 32B have a stack structure of $SiO_2$ and $Si_mN_n$. In the insulating film having the stack structure, a metal oxide film (high dielectric film) such as $Al_mO_n$ may be used instead of $Si_mN_n$.

A stack structure including an insulating film other than a silicon oxide film or a plurality of insulating films may also be applied to the gate insulating film 22 depending on the operation required for the select transistor.

In this configuration example, when the gate insulating film of the FinFET and the capacitor insulating film of the capacitor are formed by different structures as shown in FIG. 25 and FIG. 26, it is possible to provide a resistance change type memory including a capacitor with a large capacitance and obtain characteristics desirable for the select transistor and characteristics desirable for the capacitor.

As described above, according to Configuration example 3 of the present embodiment, it is possible to provide a resistance change type memory including a capacitor with a large capacitance.

CONFIGURATION EXAMPLE 4

Configuration example 4 of the resistance change type memory according to the present embodiment is described with reference to FIG. 27 to FIG. 31. FIG. 27 to FIG. 31 show the sectional structures of the memory cell and capacitor according to this configuration example in the x-direction. In FIG. 27 to FIG. 31, the interlayer insulating films covering the elements on the chip are not shown. In FIG. 27 to FIG. 31, members located far or near in the depth direction of the diagram are indicated by broken lines.

The capacitor 3 used in the resistance change type memory according to the present embodiment includes substantially the same configuration as the select transistor 2, and has a structure similar to that of the select transistor 2. In addition, as shown in FIG. 27 to FIG. 31, the capacitor used in the resistance change type memory according to the present embodiment may include the components of the resistance change type storage element.

Figure 27:
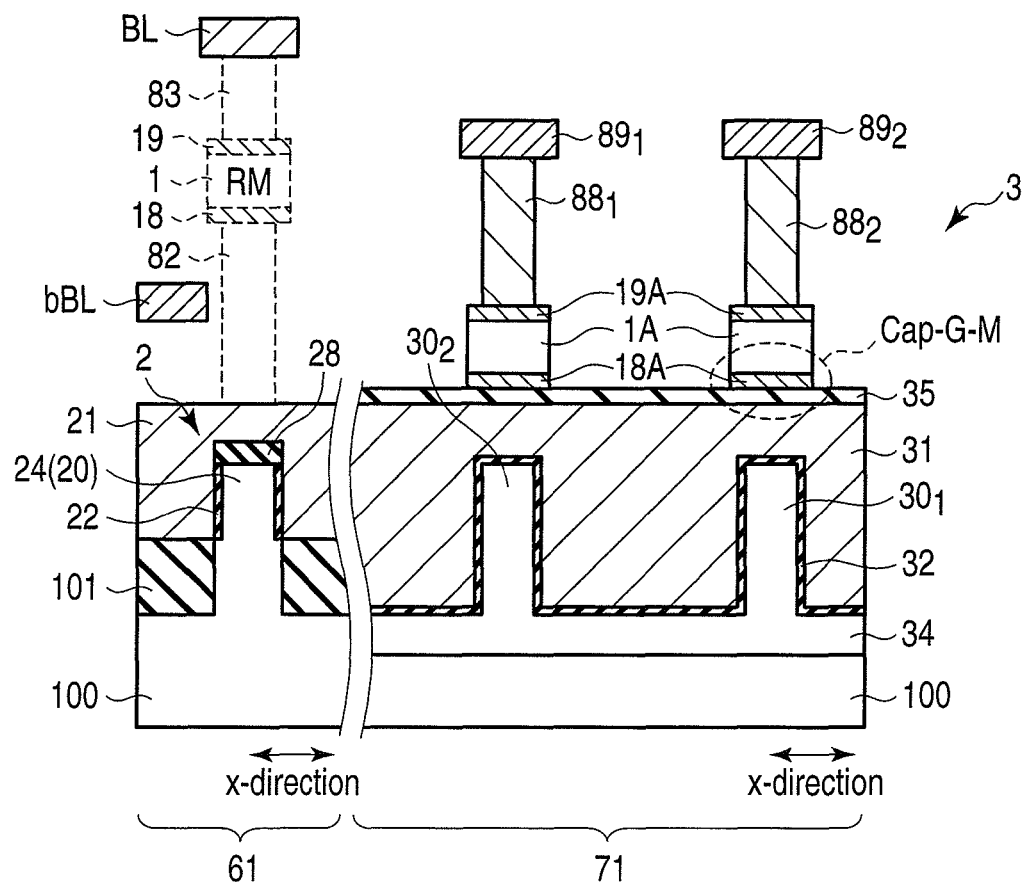
FIG. 27 is a sectional view for illustrating Configuration example 4 of the resistance change type memory according to the first embodiment.

As shown in FIG. 27, a conductor 1A is provided on the capacitor electrode 31 via an insulating film 35. The conductor 1A includes at least one component of the resistance change type storage element (here, MTJ element) 1.

Conducting layers 18A, 19A are provided on the bottom surface and upper surface of the conductor 1A. The conducting layers 18A, 19A are formed simultaneously with the electrode layers 18, 19 provided on the bottom surface and upper surface of the resistance change type storage element 1, and have substantially the same configuration (material, thickness) as the electrode layers 18, 19.

A contact plug $88_2$ is provided on the conducting layer 19A. An interconnect $89_2$ is provided on the contact plug $88_2$.

The insulating film (second capacitor electrode) 35 functions as a capacitor insulating film. A capacitance Cap_G-M is formed between the capacitor electrode 31 and the conductor 1A (as well as the conducting layers 18A, 19A) that sandwich the insulating film 35.

Thus, the capacitance Cap_G-M is formed between the capacitor electrode 31 made of the same material as the gate electrode 21 and the conductor 1A including the same configuration as the resistance change type storage element 1. As a result, in the resistance change type memory according to this configuration example, the capacitance of the capacitor 3 can be increased.

Here, the capacitor 3 has the whole configuration including the conductor 1A formed simultaneously with the resistance change type storage element 1, and the conducting layers 18A, 19A formed simultaneously with the two electrode layers 18, 19. However, at least one of the conductor 1A and the two conducting layers 18A, 19A has only to be formed on the capacitor insulating film 35. Moreover, the conductor 1A has only to include at least one of the components of the resistance change type storage element 1.

Figure 28:
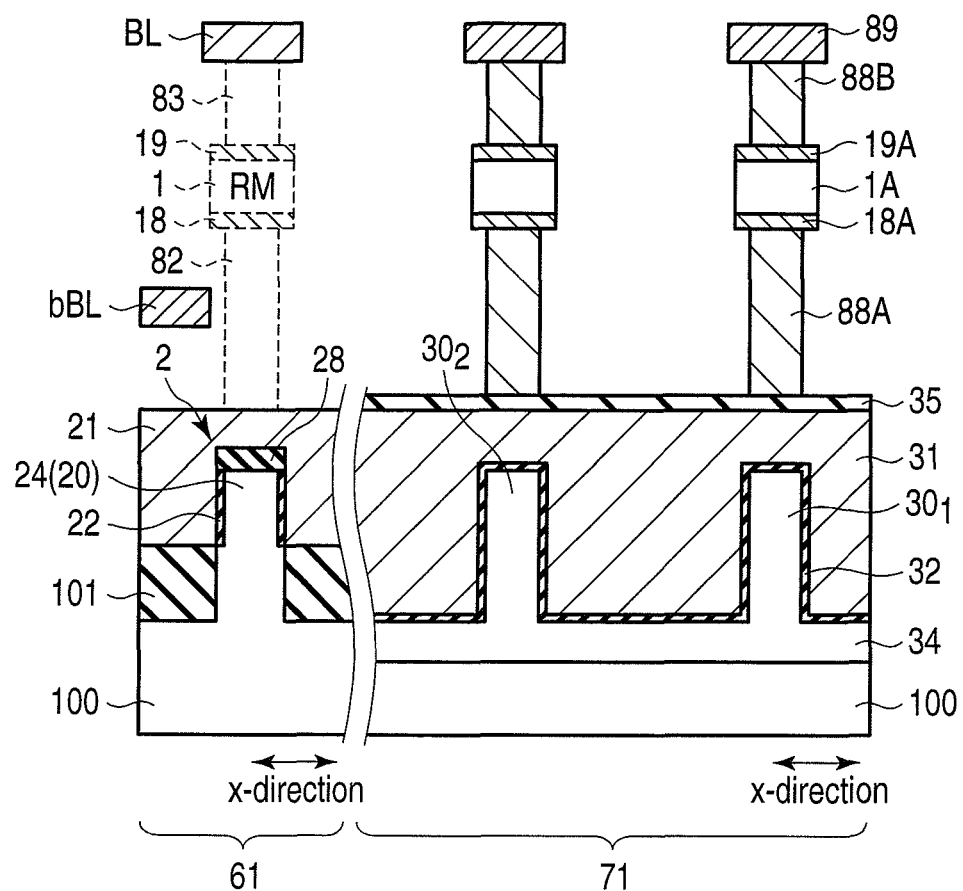
FIG. 28 is a sectional view for illustrating Configuration example 4 of the resistance change type memory according to the first embodiment.

As shown in FIG. 28, a contact plug 88A may be provided between the conductor 1A and the capacitor insulating film 35. This contact plug 88A is formed simultaneously with the contact plug 82 connected to the gate electrode or source/drain of the FinFET 2. A conducting layer formed simultaneously with the bit line bBL and other interconnects may be provided between the conductor 1A and the capacitor insulating film 35.

As shown in FIG. 29, a dimension $D_1$ of the conductor 1A in a direction parallel to the surface of the substrate may be different from a dimension $D_{RM}$ of the storage element 1 in a direction parallel to the surface of the substrate.

If the dimension $D_1$ is larger than the dimension $D_{RM}$, the area in which the capacitor electrode 31 and the conductor 1A face each other can be larger, and the capacitance of the capacitor 3 can be larger.

In this case, if the area (density rule) of the conductor 1A is set at about 25% to 70% of that of the capacitor electrode (or the capacitor region), CMP planarity and etching processing quality after the formation of the conductor 1A (MTJ element 1) are improved.

Moreover, the conductor 1A is not electrically divided into such a size as the resistance change type storage element 1, so that the processing of the components in the capacitor region 71 is easier.

As shown in FIG. 30 and FIG. 31, the patterns of the conductor 1A and the conducting layers 18A, 19A may be different from the patterns of the MTJ element 1 and the electrode layers 18, 19.

In the memory cell array 61, the electrode layers 18, 19 are electrically divided for each of the MTJ element 1.

On the other hand, as shown in FIG. 30, a conducting layer 19B on the upper side of the conductor 1A is continuous, on the plurality of conductors 1A, with a plurality of conductors 1A in the capacitor region 71. Moreover, as shown in FIG. 31, a conducting layer 18B on the bottom side of the conductor 1A is continuous on the capacitor insulating film 35 and is in contact with a plurality of conductors 1A.

Thus, at least one of the two conducting layers 18B, 19B is not divided for each of the conductors 1A and is one continuous layer, so that the processing of the components in the capacitor region 71 is easier.

As has been shown in FIG. 27 to FIG. 31, the capacitor 3 used in the resistance change type memory according to the present embodiment not only includes substantially the same configuration as the select transistor (FinFET) 2 but also includes substantially the same configuration as the resistance change type storage element (MTJ element) 1. Thus, the resistance change type memory according to configuration example 4 can have a larger capacitance of the capacitor 3.

As described above, according to Configuration example 4 of the present embodiment, it is possible to provide a resistance change type memory including a capacitor with a large capacitance.

CONFIGURATION EXAMPLE 5

Figure 33:
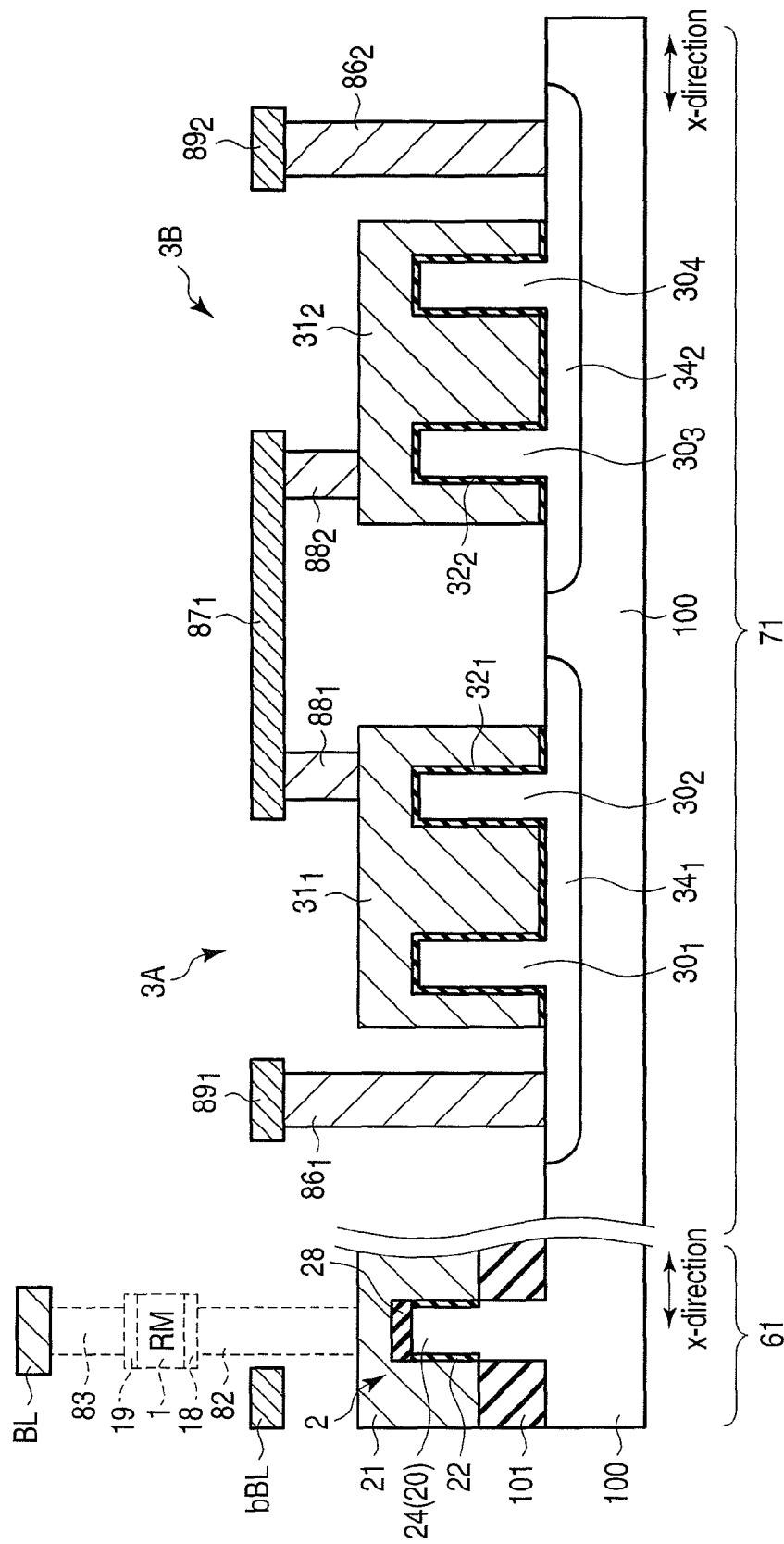
FIG. 33 is a sectional view for illustrating Configuration example 5 of the resistance change type memory according to the first embodiment.

Configuration example 5 of the capacitor used in the resistance change type memory according to the present embodiment is described with reference to FIG. 32 and FIG. 33. FIG. 32 and FIG. 33 show the sectional structures of the memory cell and capacitor according to this configuration example in the x-direction. In FIG. 32 and FIG. 33, the interlayer insulating films covering the elements on the chip are not shown. In FIG. 32 and FIG. 33, members located far or near in the depth direction of the diagram are indicated by broken lines.

As shown in FIG. 32, a contact plug 88B as an input/output terminal of the capacitor 3 is connected to one capacitor electrode 31. Also, the contact plug 88A as a terminal of the capacitor is connected, via the conductor 1A and the capacitor insulating film 35, to the same capacitor electrode 31 to which the contact plug 88B is connected.

Each of the contact plugs 88A, 88B makes an input/output terminal pair with a contact plug (not shown) connected to the fin portion as the component of the capacitor.

Thus, some of the components are shared by a plurality of capacitors, and the layout in the film stacking direction (in a direction perpendicular to the surface of the substrate) is changed. This makes it possible to form a plurality of capacitors having a predetermined capacitance without increasing a size (occupancy area) in a direction parallel to the surface of the substrate.

In the example shown in FIG. 33, two capacitors, 3A, 3B are connected in series via contact plugs $88_1$, $88_2$ and an interconnect $87_1$. Thus, even if a given potential is applied across input/output terminals $86_1$, $86_2$, $89_1$, $89_2$ of the capacitors 3A, 3B, the potential across the terminals $86_1$, $86_2$ is divided for the two capacitors 3A, 3B.

Therefore, according to the example shown in FIG. 33, the potential applied to one capacitor can be reduced and the dielectric breakdown of the capacitor insulating films $32_1$, $32_2$ can be inhibited without any process change. As a result, it is possible to form a highly reliable resistance change type memory.

Although the two capacitors 3A, 3B adjacent in the x-direction are connected in series in the example shown in FIG.

33, it is obvious that two capacitors adjacent in the y-direction may be connected in series. In addition, the number of capacitors connected in series may be three or more.

Although two or more capacitors are connected in series in the example shown, two or more capacitors may be connected in parallel. Two or more capacitors may be connected in series and in parallel depending on the required capacitance and circuit configuration.

As described above, according to Configuration example 5 of the present embodiment, it is possible to provide a resistance change type memory including a capacitor with a large capacitance.

<Second Embodiment>

A resistance change type memory according to the second embodiment is described with reference to FIG. 34 to FIG. 60. In the present embodiment, an MRAM is shown as an example of the resistance change type memory, as in the first embodiment. In the second embodiment, components identical to the components described in the first embodiment are provided with the same symbols and are described in detail when necessary. Moreover, in the second embodiment, connection of elements that is identical to that described in the first embodiment is described in detail as needed.

(Basic Example)

Basic structures of a memory cell and a capacitor included in the resistance change type memory according to the second embodiment are described with reference to FIG. 34 to FIG. 39.

Figure 35:
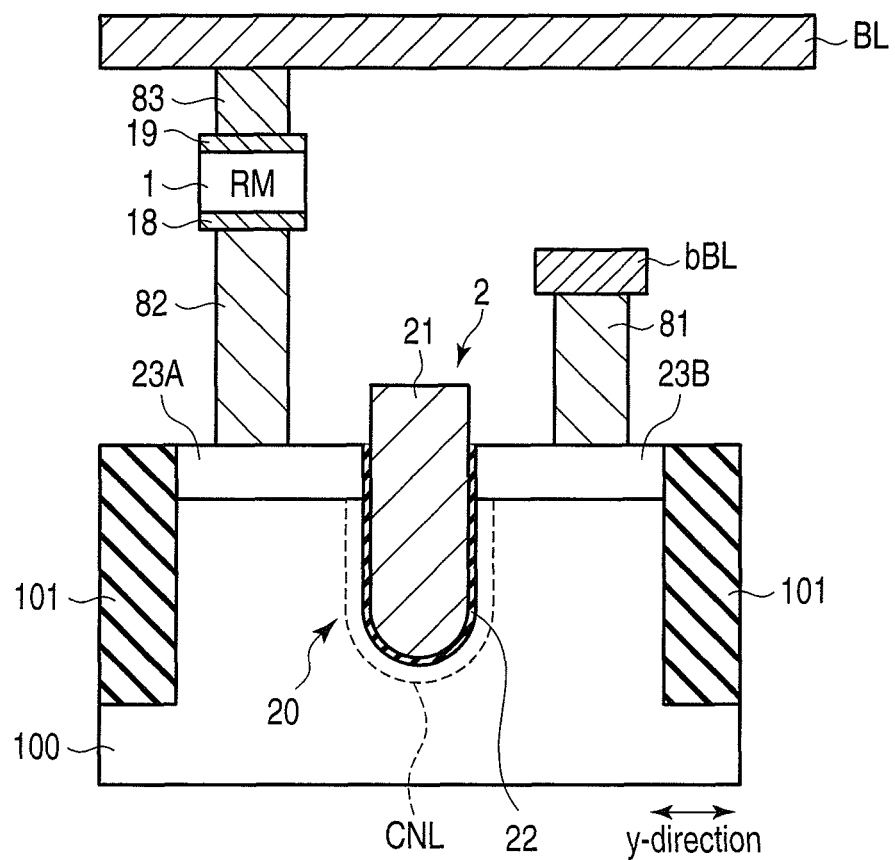
FIG. 35 is a sectional view showing the structure of the memory cell of the resistance change type memory according to the second embodiment.
Figure 38:
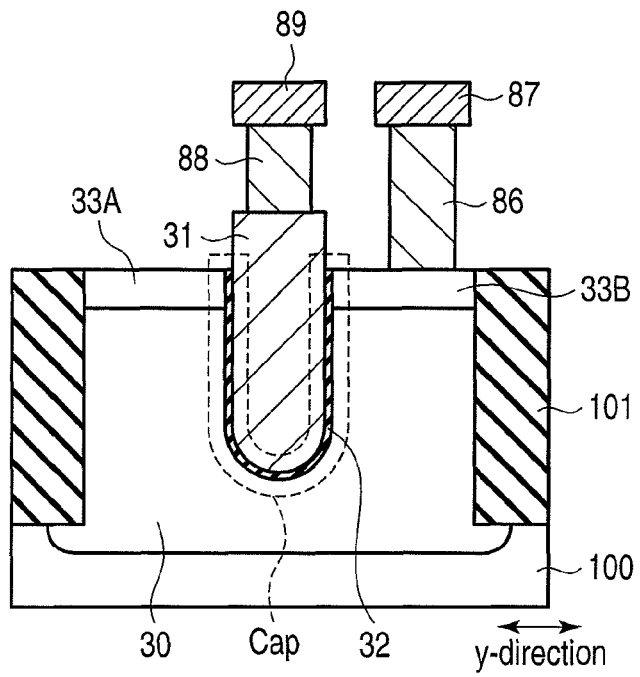
FIG. 38 is a sectional view showing the structure of the capacitor of the resistance change type memory according to the second embodiment.
Figure 39:
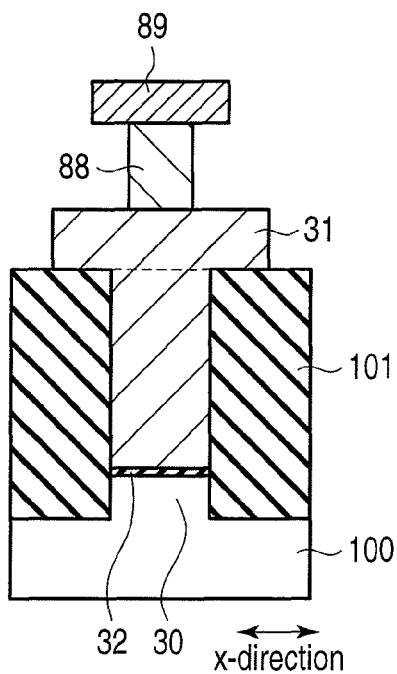
FIG. 39 is a sectional view showing the structure of the capacitor of the resistance change type memory according to the second embodiment.

FIG. 34 is a bird's eye view showing the structure of the memory cell of the resistance change type memory according to the present embodiment. FIG. 35 and FIG. 36 show the sectional structure of the memory cell. FIG. 37 is a bird's eye view showing the structure of the capacitor of the resistance change type memory according to the present embodiment. FIG. 38 and FIG. 39 show the sectional structure of the capacitor. In FIG. 34 to FIG. 39, the interlayer insulating films covering the elements are not shown for clarity. In FIG. 36, members located far or near in the depth direction of the diagram are indicated by broken lines.

In the present embodiment, a memory cell MC has the same circuit configuration as the configuration shown in FIG. 4 so that a resistance change type storage element 1 is connected to a select transistor 2.

As shown in FIG. 34 to FIG. 36, the select transistor 2 of the memory cell is an RCAT. FIG. 35 shows a sectional structure along the channel length direction of the RCAT. FIG. 36 shows a sectional structure along the channel width direction of the RCAT. For example, the channel length direction of the RCAT corresponds to the y-direction, and the channel width direction of the RCAT corresponds to the x-direction.

An isolation insulating film 101 is embedded in a semiconductor substrate 100, and an active region (also referred to as an element formation region or semiconductor region) 20 is defined.

A trench is provided in the active region 20. A gate insulating film 22 is provided in the trench. The gate insulating film 22 is formed on the side surface and upper surface of the active region 20 along the trench. A gate electrode 21 is embedded in the trench.

The gate electrode 21 has a lower gate electrode portion 21a embedded in the trench, and an upper gate electrode portion 21b extending on the lower gate electrode portion 21a in the x-direction. For example, the lower gate electrode portion 21a is in contact with the side surface of the isolation insulating film 101 in the extending direction of the upper gate electrode portion 21b. The upper gate electrode portion 21b is connected to the lower gate electrode portion 21a and is in contact with the side surface of the isolation insulating film 101.

In the present embodiment, the trench in which the gate electrode 21 is embedded is also referred to as a recess.

Adjacent to an opening of the trench, two diffusion layers 23A, 23B as a source and a drain are provided in the active region 20.

A channel region CNL of the transistor is provided in a region where the gate electrode 21 and the active region 20 face each other across the gate insulating film 22 between the source/drain diffusion layers 23A, 23B. The channel region CNL of the transistor 2 is formed in the active region 20 along the side surface of the trench. Thus, the dimension of the channel region in the depth direction of the substrate is larger, and a channel length effective for the area occupied by the gate electrode 21 in the surface of the substrate is larger. Therefore, even if the area occupied by the select transistor is reduced, the short channel effect of the select transistor 2 can be suppressed.

Furthermore, the increase of the area occupied by the gate electrode due to the increase of the channel length can be inhibited. Therefore, the areas of the source/drain diffusion layers 23A, 23B can be larger. As a result, the contact area between contact plugs 81, 82 and the source/drain diffusion layers 23A, 23B can be larger, and contact resistance can be reduced.

One end of the resistance change type storage element 1 is connected to the source/drain diffusion layer 23A via the contact plug 82. The other end of the resistance change type storage element 1 is connected to a bit line BL via a via plug 83. The source/drain diffusion layer 23B of the RCAT is connected to a bit line bBL via a contact plug.

FIG. 37 to FIG. 39 show a capacitor 3 used in the resistance change type memory according to the present embodiment. This capacitor 3 is provided in the same semiconductor substrate (chip) 100 as the memory cells MC shown in FIG. 34 to FIG. 36. The capacitor 3 has a structure closely resembling that of an RCAT 2 as the select transistor.

As shown in FIG. 37 to FIG. 39, a semiconductor region 30 as a component (capacitor electrode) of the capacitor has a trench.

A capacitor electrode 31 is embedded in the trench formed in the semiconductor region 30. The capacitor electrode 31 has a lower capacitor electrode portion 31a embedded in the trench, and an upper capacitor electrode portion 31b on the lower capacitor electrode portion 31a.

A capacitor insulating film 32 is provided in the trench of the semiconductor region 30 as the component of the capacitor along the shape of the trench. The semiconductor region 30 and the capacitor electrode 31 face each other across the capacitor insulating film 32.

The lower capacitor electrode portion 31a is in contact with the side surface of the isolation insulating film 101 in a direction (extending direction of the trench) that intersects with the direction in which the capacitor electrode 31 is in contact with the capacitor insulating film 32. The side surface of the upper capacitor electrode portion 31b is not in contact with the capacitor insulating film 32, and is covered with, for example, a sidewall insulating film.

Adjacent to the opening of the trench, a contact region (diffusion layer) 33B is provided on the upper surface of the semiconductor region 30. A contact plug 86 is provided on the contact region 33B. A contact plug 88 is provided on the upper surface of the capacitor electrode 31.

The contact plugs 86, 88 are used as input/output terminals of the capacitor 3. The contact plugs 86, 88 are respectively connected to interconnects 87, 89 for forming a circuit.

The capacitor electrode 31 is made of the same material as the gate electrode 21 of the RCAT 2 and formed simultaneously with the gate electrode 21. Moreover, the trench of the semiconductor region 30 is formed simultaneously with the trench in which the gate electrode 21 of the RCAT 2 is embedded. The contact region 33B is formed simultaneously with the source/drain diffusion layers 23A, 23B of the RCAT 2.

The resistance change type memory according to the second embodiment includes the resistance change type storage element 1, the RCAT 2 as the select transistor, and the capacitor 3 as a component of a peripheral circuit.

The RCAT 2 has the gate electrode 21 embedded in the trench within the active region 20. The gate electrode 21 faces the side surface of the active region 20 along the trench and the upper surface of the semiconductor region along the bottom surface of the trench. The channel region CNL of the RCAT 2 is formed in the semiconductor region 20 so that the gate insulating film 22 intervenes therebetween.

In the resistance change type memory according to the present embodiment, a capacitance Cap of the capacitor 3 is formed in a region where the capacitor electrode (semiconductor region) 30 having a trench faces the capacitor electrode 31 embedded in this trench across the capacitor insulating film 32. The area in which the semiconductor region 30 as the component of the capacitor faces the capacitor electrode 31 is mainly ensured between the side surface of the semiconductor region 30 and the side surface of the capacitor electrode 31. That is, the area in which the semiconductor region 30 and the capacitor electrode 31 face each other depends on the depth of the trench.

The capacitance Cap of the capacitor 3 according to the present embodiment is formed by embedding the capacitor electrode 31 in the trench. Thus, the area in which the semiconductor region 30 and the capacitor electrode 31 face each other can be larger than the area occupied by the capacitor electrode 31 in the surface of the substrate.

Thus, in the resistance change type memory according to the second embodiment, the trench is formed in the semiconductor substrate 100, and a step is thereby formed in the semiconductor region 30 within the semiconductor substrate 100. This step is used to form a capacitance of the capacitor 3 between the side surface of the semiconductor region 30 as the component of the capacitor 3 and the capacitor electrode 31 facing the side surface of the semiconductor region 30.

Therefore, the capacitor 3 used in the resistance change type memory according to the present embodiment allows a large capacitance to be formed with a small occupancy area.

Moreover, the capacitor 3 included in the resistance change type memory according to the present embodiment can be simultaneously formed in substantially the same manufacturing process as the RCAT 2 as the select transistor.

Consequently, according to the second embodiment, it is possible to provide a resistance change type memory including a capacitor with a large capacitance, as in the first embodiment.

CONFIGURATION EXAMPLE 1

Configuration example 1 of the resistance change type memory according to the second embodiment is described with reference to FIG. 40 to FIG. 46.

(a) Structure

The structure of the resistance change type memory (e.g., MRAM) according to Configuration example 1 of the present embodiment is described with reference to FIG. 40 to FIG. 43.

In the present embodiment, for example, as has been described with reference to FIG. 11, the memory cell is provided in a memory cell array 61 defined in the semiconductor substrate, and the capacitor is provided in a peripheral region (capacitor region 71) defined in the semiconductor substrate adjacent to the memory cell array 61, in order to stabilize the operation of the resistance change type memory.

Figure 42:
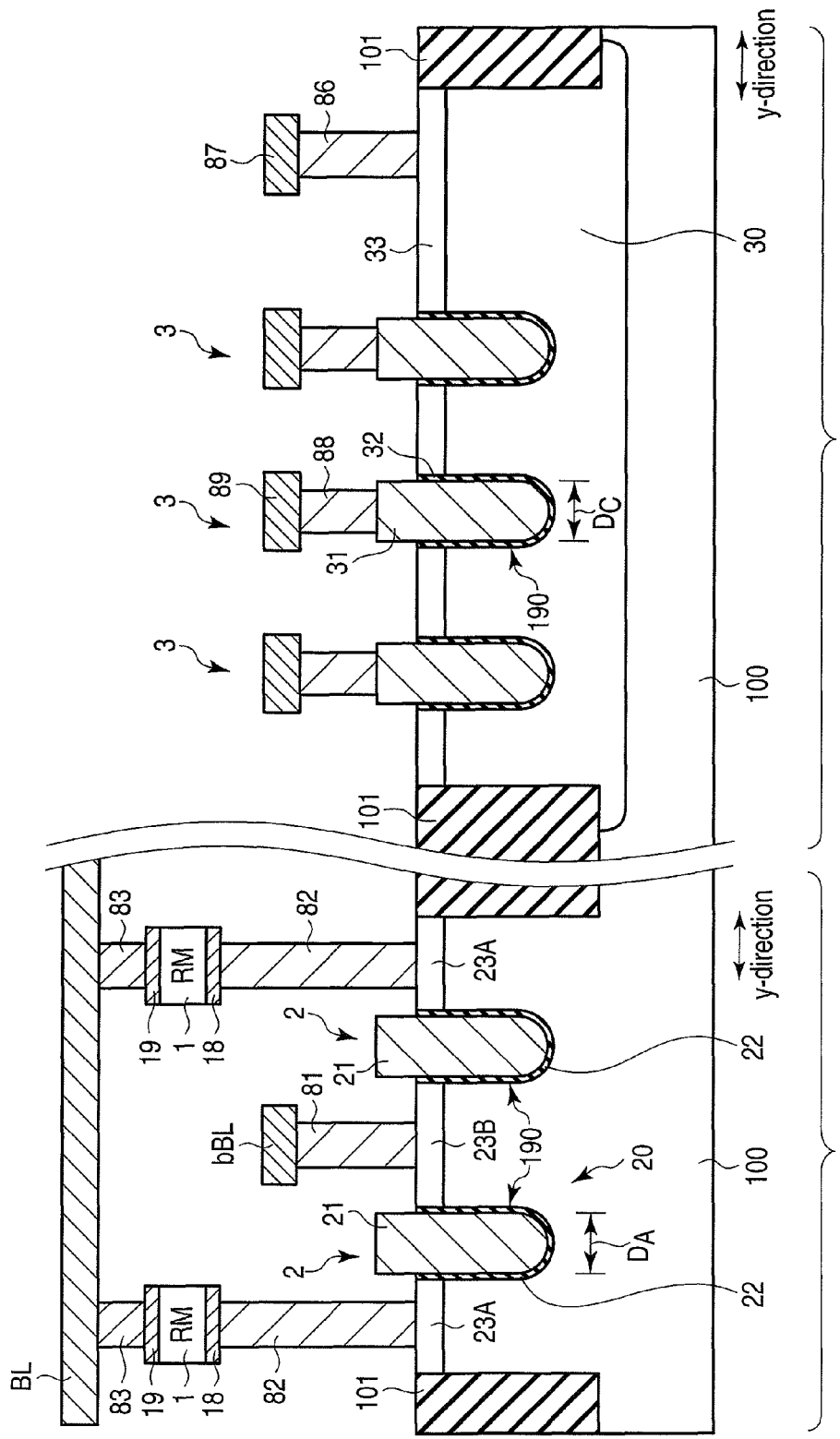
FIG. 42 is a sectional view for illustrating Configuration example 1 of the resistance change type memory according to the second embodiment.

FIG. 40 shows an example of the layout in the memory cell array 61. FIG. 41 shows an example of the layout in the capacitor region 71. FIG. 42 and FIG. 43 show the sectional structures of the memory cell and capacitor in the resistance change type memory according to this configuration example. In FIG. 41, for clearer explanation, the extending direction of the semiconductor region 30 as the component of the capacitor 3 is defined as the y-direction, and a direction that intersects with the y-direction is defined as the x-direction. However, the extending direction of the component of the capacitor 3 is not limited to this.

In the present embodiment, a peripheral transistor is an FET having a planar structure, similarly to the peripheral transistor shown in the first embodiment. Therefore, in the present embodiment, a peripheral transistor 2 is neither shown nor described. However, it is obvious that the peripheral transistor may be an RCAT similarly to the select transistor.

In the resistance change type memory according to this configuration example, a plurality of memory cells are arranged in the memory cell array 61 in accordance with a layout substantially similar to that in the resistance change type memory according to the first embodiment. One memory cell includes one RCAT 2 as the select transistor, and one resistance change type storage element (e.g., MTJ element) 1.

In the memory cell of the resistance change type memory according to the present embodiment, the RCATs as the select transistors adjacent in the x-direction share a word line WL, similarly to the select transistors (FinFET) described in the first embodiment.

One active region (semiconductor region) 20 is defined by the isolation insulating film 101. One active region 20 has a quadrangular planar shape.

Two RCATs 2 are provided in one active region 20. The two RCATs 2 in one active region 20 share one source/drain diffusion layer 23B. The two RCATs 2 are connected to the same bit line bBL via the shared diffusion layer 23B.

One resistance change type storage element (e.g., MTJ element) 1 is provided in one RCAT 2 as the select transistor. The resistance change type storage element 1 is disposed above the source/drain diffusion layer 23A.

One end of the resistance change type storage element 1 is connected to the current path (source/drain diffusion layer) 23A of the select transistor. The other end of the resistance change type storage element is provided in the bit line BL.

As shown in FIG. 41, in the capacitor region 71, one semiconductor region 30 is defined by the isolation insulating film 101 embedded in the semiconductor substrate 100. A plurality of (here, three) capacitors 3 are provided in one semiconductor region 30.

The semiconductor region 30 is used as the component of the capacitor 3. The semiconductor region 30 as the component of the capacitor 3 extends in, for example, the y-direction.

The capacitor electrode 31 is provided in the semiconductor region 30. The capacitor electrode 31 is held between the capacitor insulating films 32 in the extending direction of the semiconductor region 30. A plurality of capacitor electrodes 31 are provided in one semiconductor region 30. The capacitor electrodes 31 are arranged along the extending direction of the semiconductor region 30.

The contact plug 86 as the input/output terminal of the capacitor 3 is provided on the semiconductor region 30 as the component of the capacitor. The contact plug 88 as the input/output terminal of the capacitor 3 is provided on the capacitor electrodes 31.

FIG. 42 shows the sectional structure along the line XLII-XLII in FIG. 40 and FIG. 41. FIG. 43 shows the sectional structure along the line XLIII-XLIII in FIG. 40 and FIG. 41. In FIG. 42 and FIG. 43, the interlayer insulating films covering the elements on the chip are not shown. In FIG. 43, members located far or near in the depth direction of the diagram are indicated by broken lines.

In the memory cell array 61, two trenches 190 are provided in one active region 20. The gate electrode 21 is embedded in each of the trenches 190 via the gate insulating film 22. In the present embodiment, the trench 190 in which the gate electrode of the RCAT is embedded is referred to as an RCAT trench.

Adjacent to the upper part (opening) of the RCAT trench, the source/drain diffusion layers 23A, 23B of the transistor are provided.

The bottom of the RCAT trench is, for example, bent. Therefore, the bottom of the gate electrode 21 has a curvature dependent on the bending of the bottom of the trench.

In the capacitor region 71, for example, three trenches 190 are provided in the semiconductor region 30 as the component of one capacitor. The capacitor electrode 31 is embedded in each of the trenches 190 via the capacitor insulating film 32. The capacitor electrodes 31 embedded in the trenches 190 are separate from one another.

The capacitor electrodes 31 embedded in the trenches share one semiconductor region 30 as the component of the capacitor 3. As a result, the layout of the capacitor and the manufacturing process of the semiconductor region (capacitor electrode) 30 are simplified. Moreover, a plurality of capacitor electrodes share one semiconductor region, so that there is no need to form the isolation insulating film to surround each of the trenches 190. Thus, the increase of the area of the capacitor region 71 to ensure the region for forming the isolation insulating film can be inhibited.

In the present embodiment, the trench 190 in which the capacitor electrode 31 of the capacitor 3 is embedded is referred to as a capacitor trench.

Adjacent to the opening of the capacitor trench, a diffusion layer 33 formed simultaneously with the source/drain diffusion layers 23A, 23B is provided.

Similarly to the RCAT trench, the bottom of the capacitor trench 190 is bent. Accordingly, the bottom of the capacitor electrode has a curvature dependent on the bending of the bottom of the capacitor trench 190.

A dimension $W_{Cap}$ of the semiconductor region 30 as the component of the capacitor in the x-direction may be the same as or different from a dimension $W_R$ of the active region 20 of the RCAT in the x-direction. However, for a larger area in which the semiconductor region 30 and the capacitor electrode 31 face each other, the dimension $W_{Cap}$ of the semiconductor region 30 is preferably larger than the dimension $W_R$ of the active region 20 in the y-direction. The dimension $W_{Cap}$ of the semiconductor region 30 substantially corresponds to the dimension of the capacitor trench in the x-direction.

When the dimension $W_{Cap}$ of the semiconductor region 30 is increased to increase the area in which the semiconductor region 30 and the capacitor electrode 31 face each other, the capacitor trench has a linear shape extending in the x-direction (or y-direction). As a result, the capacitor electrode 31 embedded in the capacitor trench also has a linear structure.

A maximum dimension (third dimension) $D_C$ of the capacitor electrode 31 embedded in the trench in the y-direction may be the same as or different from a maximum dimension (first dimension) $D_A$ of the gate electrode 21 in the y-direction. When the dimension $D_C$ is larger, the area in which the bottom of the capacitor electrode 31 faces the semiconductor region 30 is larger. As a result, the capacitance of the capacitor is larger. The dimensions $D_A$, $D_C$ of the electrodes 21, 31 are substantially equal to the dimension of the opening of each of the trenches 190. The dimensions $D_A$, $D_C$ of the electrodes 21, 31 are adjusted by the size of the trench formed in the semiconductor regions 20, 30.

In this configuration example, as has been described with reference to FIG. 25 and FIG. 26 in the first embodiment, the material and thickness of the capacitor insulating film 32 may be different from the material and thickness of the gate insulating film 22 depending on the characteristics required for the RCAT 2 and the capacitor 3.

The impurity concentration of the semiconductor region 30 as the component of the capacitor is set at, for example, a value of about $10^{19}/cm^3$ to $10^{21}/cm^3$. The impurity concentration of the active region is set at, for example, about $10^{17}/cm^3$. The semiconductor region 30 as the component of the capacitor may have a p-type conductivity or n-type conductivity.

As described above, the resistance change type memory according to Configuration example 1 of the present embodiment includes the RCAT 2 as the select transistor, and the capacitor 3.

In the RCAT 2 as the select transistor, the gate electrode 21 is embedded in the RCAT trench 190 in the active region 20 via the gate insulating film 22. The gate electrode 21 faces the side surface and upper surface of the active region 20 along the trench. The channel region of the RCAT is formed on the side surface of the semiconductor region 30 along the trench by way of the semiconductor region at the bottom of the RCAT trench.

In the capacitor 3 according to this configuration example, the semiconductor region 30 is a semiconductor region 30 having the capacitor trench 190, and the capacitor electrode 31 is embedded in the capacitor trench 190. The capacitance of the capacitor is formed between the side surface of the semiconductor region 30 as the component of the capacitor and the capacitor electrode 31 embedded in the trench.

Thus, the increase of the area occupied in the chip is suppressed, and the area in which the semiconductor region and the capacitor electrode face each other can be larger. As a result, the capacitance of the capacitor can be increased without increasing the area for forming the capacitor 3.

Moreover, the capacitor 3 included in the resistance change type memory according to the present embodiment is formed by the common manufacturing process substantially simultaneously with the RCAT 2 as the select transistor in accordance with a manufacturing method described later. Thus, the resistance change type memory according to the present embodiment needs no additional process to form the capacitor 3.

As described above, according to Configuration example 1 of the present embodiment, it is possible to provide a resistance change type memory including a capacitor with a large capacitance.

(b) Manufacturing Method

A method of manufacturing the resistance change type memory according to Configuration example 1 of the present embodiment is described with reference to FIG. 40 to FIG.

46. In FIG. 40 to FIG. 46, sectional process views of manufacturing steps in the x-direction are shown.

FIG. 44 is a sectional view showing a step of the method of manufacturing the resistance change type memory according to the second embodiment.

As shown in FIG. 44, an isolation insulating film 101 is embedded in a semiconductor substrate 100, and a memory cell array 61, an active region 40 in the memory cell array, and a capacitor region 71 are defined. For example, a well region (not shown) is formed in the memory cell array 61. For example, an impurity is added to the capacitor region 71, and an impurity region 30 is formed. The well region and the impurity region 30 may be formed before the isolation insulating film 101 is formed.

After an insulating film or resist is deposited on the semiconductor substrate 100, a mask layer 125 having a predetermined pattern is formed. The mask layer 125 has openings at positions where an RCAT trench and a capacitor trench are formed. When a peripheral transistor is a planar FET, a peripheral transistor region is covered with a mask layer having no openings.

The RIE method is carried out in conformity with the formed mask layer 125. As a result, in the memory cell array 61 and the capacitor region 71, a trench 190 is formed at a predetermined position in the semiconductor substrate 100.

Figure 45:
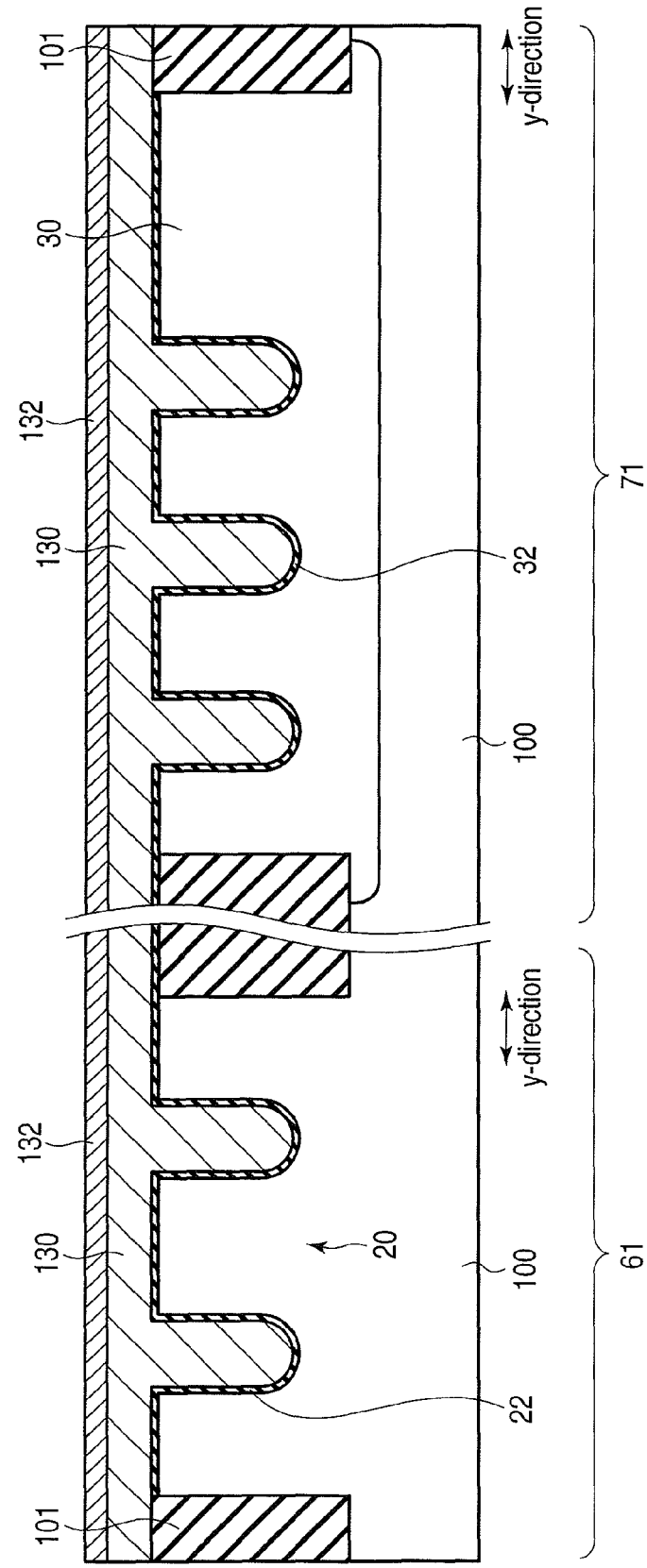
FIG. 45 is a sectional process view showing a step of the method of manufacturing the resistance change type memory according to the second embodiment.

FIG. 45 is a sectional view showing a step of the method of manufacturing the resistance change type memory according to the present embodiment.

As shown in FIG. 45, after the mask layer is detached from the semiconductor substrate 100, a gate insulating film 22 and a capacitor insulating film 32 are formed on the semiconductor substrate 100 by, for example, the thermal oxidation method. The gate insulating film 22 and the capacitor insulating film 32 are formed along the side surfaces of the trenches 190 in the memory cell array 61 and the capacitor region 71.

After the gate insulating film 22 and the capacitor insulating film 32 are formed, a polysilicon layer 130 is formed in the trench 190 and on the semiconductor substrate 100 by, for example, the CVD method. The trench 190 is filled with the polysilicon layer 130.

After the upper surface of the polysilicon layer 130 is planarized, for example, a metal layer 132 is deposited on the polysilicon layer 130 by, for example, a sputtering method. The metal layer 132 serves to form a silicide layer by a chemical reaction (silicide treatment) between silicon and a metal. For example, tungsten, titanium or a nickel-palladium alloy is used for the metal layer 132. The step of forming the metal layer 132 may be omitted. In addition, in the first embodiment, the gate electrode 21 of the FinFET and the capacitor electrode 31 of the capacitor may be formed by a silicide treatment.

FIG. 46 is a sectional view showing a step of the method of manufacturing the resistance change type memory according to the present embodiment.

As shown in FIG. 46, after the silicide layer is formed by a heat treatment of the polysilicon layer and the metal layer, a mask layer 126 such as a silicon nitride film is deposited on the silicide layer. The mask layer 126 is processed into a predetermined shape by the photolithographic technique and the RIE method. The mask layer 126 is patterned to remain above the trench in the semiconductor substrate 100.

The silicide layer is processed in accordance with the patterned mask layer 126, and the gate electrode 21 of the RCAT and the capacitor electrode 31 of the capacitor are formed. Simultaneously with the formation of the gate electrode 21 and the capacitor electrode 31, a gate electrode of the peripheral transistor having a planar structure is formed.

Subsequently, the formed gate electrode 21 is used as a mask to carry out ion implantation, and source/drain diffusion layers 23A, 23B of an RCAT 2 are formed in the semiconductor substrate 100, as shown in FIG. 40 to FIG. 43. In this case, if a capacitor region 71 is not covered with a mask (e.g., resist mask), a diffusion layer (contact region) 33 is formed on the surface layer of the semiconductor substrate 100 in the capacitor region 71 at the same time.

After the source/drain diffusion layers 23A, 23B are formed, a sidewall insulating film (not shown) is formed on the side surfaces and upper surfaces of the gate electrode 21 and the capacitor electrode 31.

Furthermore, a contact plug, an interconnect and a bit line are formed at predetermined places in the regions 61, 71 by a known multilevel interconnection technique such as a damascene method.

Consequently, the resistance change type memory according to the second embodiment is manufactured.

As described above, in the resistance change type memory according to the second embodiment, the capacitor 3 included in the resistance change type memory is formed in the same manufacturing process substantially simultaneously with the RCAT as the select transistor of the memory.

Thus, according to the method of manufacturing the resistance change type memory in the present embodiment, even if the capacitor 3 that includes the semiconductor region 30 having the trench and the capacitor electrode 31 embedded in the trench is provided in the same chip as the memory cell, there are no excessive additions of manufacturing steps and no increase in the complexity of the manufacturing process due to the formation of the capacitor 3.

Furthermore, in the resistance change type memory according to the present embodiment, the capacitance of the capacitor 3 is formed between the semiconductor region 30 as the component of the capacitor and the capacitor electrode 31 embedded in the capacitor trench 190 of the semiconductor region 30.

In the present embodiment, a step formed in the semiconductor region within the semiconductor substrate is also used to ensure, on the side surface of the step, the area in which the semiconductor region 30 and the capacitor electrode 31 face each other, as in the resistance change type memory according to the first embodiment. Thus, a small occupancy area allows for a large area in which the semiconductor region 30 and the capacitor electrode 31 face each other.

Thus, according to the method of manufacturing the resistance change type memory in the second embodiment, it is possible to form a capacitor having a large capacitance without increasing the area of the capacitor occupied in the surface of the substrate.

Consequently, according to the method of manufacturing the resistance change type memory in the present embodiment, it is possible to relatively easily provide a resistance change type memory including a capacitor with a large capacitance.

CONFIGURATION EXAMPLE 2

Figure 47:
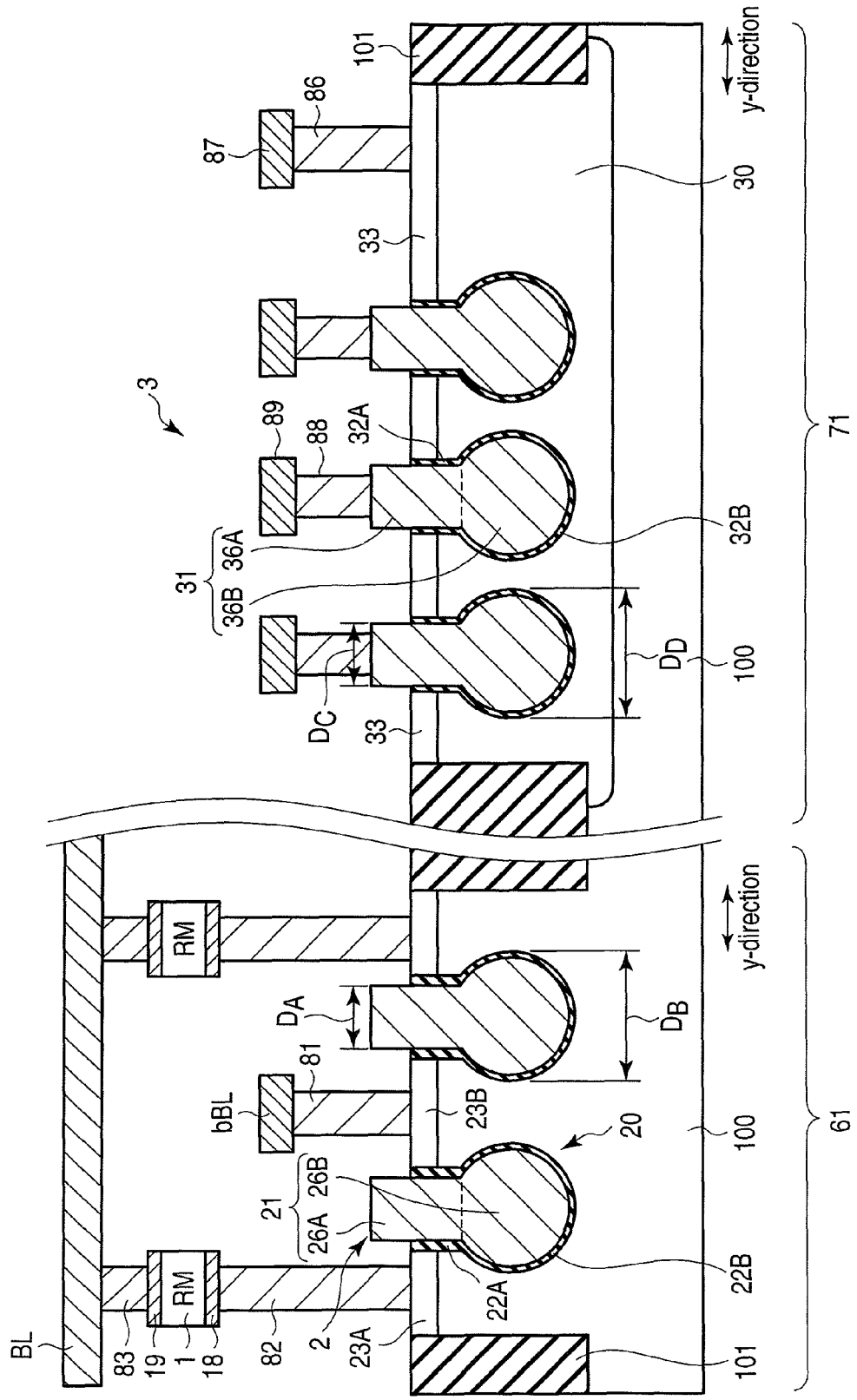
FIG. 47 is a sectional view for illustrating Configuration example 2 of the resistance change type memory according to the second embodiment.

Configuration example 2 of the resistance change type memory according to the second embodiment is described with reference to FIG. 47 and FIG. 50.

(a) Structure

The structure of the resistance change type memory according to Configuration example 2 of the present embodiment is described with reference to FIG. 47. FIG. 47 shows the sectional structures of the memory cell and the capacitor along the y-direction. In FIG. 47, the interlayer insulating films covering the elements on the chip are not shown.

The resistance change type memory according to this configuration example is configured in its sectional structure along the y-direction so that the bottoms of the RCAT trench and the capacitor trench have a circular sectional shape. In this configuration example, the circular shape includes elliptical shapes.

The gate electrode 21 of the RCAT 2 is embedded into the RCAT trench having the circular bottom. Therefore, in accordance with this shape, the bottom of the gate electrode 21 has a circular sectional structure. Thus, the gate electrode 21 of the RCAT according to this configuration example has a circular lower gate electrode portion 26B and an upper gate electrode portion 26A provided thereon.

When formed in substantially the same process as the RCAT trench, the capacitor trench in which the capacitor electrode 31 is embedded also has a circular sectional shape in its bottom. Therefore, the capacitor electrode 31 has a circular lower capacitor electrode portion 36B and an upper capacitor electrode portion 36A provided thereon.

The circular lower electrode portions 26B, 36B of the gate electrode 21 and the capacitor electrode 31 are referred to as rounding portions 26B, 36B. The diameters (maximum dimensions, second dimensions) $D_B$, $D_D$ of the rounding portions 26B, 36B are larger than the diameters (first dimensions) $D_A$, $D_C$ of the openings of the trench above the rounding portion 26B.

In this way, in the RCAT 2 as the select transistor, the RCAT trench and the bottom 26B of the gate electrode 21 have circular structures, so that a channel region is formed in a region along the circumference of the circle (rounding portion). As a result, the effective channel length of the RCAT 2 having the bottom 26B is larger than that of a gate structure having no rounding portion. Therefore, the short channel effect can be suppressed even if the memory cell and the peripheral transistor 2 are further miniaturized.

Furthermore, the capacitor electrode 31 has the circular bottom, so that the area in which the capacitor electrode 31 and the semiconductor region 30 face each other is increased. Thus, the capacitance of the capacitor 3 having the rounding portion 36B can be larger than that of a capacitor having no rounding portion.

In the RCAT 2 as the select transistor according to this configuration example, the thickness of a gate insulating film 22A between the source/drain diffusion layers 23A, 23B and the upper gate electrode portion 26A is larger than the thickness of a gate insulating film 22B between the rounding portion 26B and the active region 20. The thickness of the gate insulating film 22A is large so that a parasitic capacitance generated in the part where the source/drain diffusion layer 23A and the gate electrode 21 face each other can be reduced. Thus, characteristic deterioration of the RCAT 2 as the select transistor can be inhibited, and the operation of the select transistor and the resistance change type memory including this transistor can be stabilized.

On the other hand, the thickness of a capacitor insulating film 32B between the rounding portion 36B of the capacitor electrode 31 and the semiconductor region 30 is the same as the thickness of a capacitor insulating film 32A between a portion 36A of the capacitor electrode 31 except for the rounding portion 36B and the semiconductor regions (diffusion layers) 30, 33.

The thickness of the capacitor insulating films 32A, 32B is the same as, for example, the thickness of the gate insulating film 22B covering the rounding portion 26B of the gate electrode 21.

Thus, in the capacitor 3 according to this configuration example, there is no decrease of a capacitance due to the increase in the thickness of the capacitor insulating films 32A, 32B.

As described above, according to Configuration example 2 of the present embodiment, it is possible to provide a resistance change type memory including a capacitor with a large capacitance.

(b) Manufacturing Method

A method of manufacturing the resistance change type memory according to Configuration example 2 of the present embodiment is described with reference to FIG. 47 to FIG. 50. In FIG. 47 to FIG. 50, sectional process views of manufacturing steps in the x-direction are shown. The steps identical to those in the previously-described manufacturing method are not described in detail below.

FIG. 48 is a sectional view showing a step of the method of manufacturing the resistance change type memory according to the present embodiment.

After the manufacturing step shown in FIG. 44, an insulating film is formed on the side surface of the trench 190 by, for example, the thermal oxidation method. Further, an oxide film formed on the bottom of the trench is removed by anisotropic etching such as the RIE method.

Since the oxide film is removed by the anisotropic etching, an insulating film 22 remains on the side surface of the trench 190, as shown in FIG. 48. At the bottom of the trench 190, the surface of the semiconductor substrate (silicon substrate) is exposed.

Subsequently, isotropic etching such as a CDE method is carried out under a condition in which silicon is selectively etched. Silicon oxide and silicon nitride are hardly etched even under the same etching condition.

Therefore, as shown in FIG. 48, the semiconductor substrate at the bottom of the trench 190 is etched, and a circular portion (rounding portion) 191 is formed in the semiconductor substrate 100 at the bottom of the trench.

Immediately after this, the semiconductor substrate may be again thermally oxidized in a condition where the side surface of the trench is covered with the oxide film 22, in order to form a silicon oxide film on the side surfaces of the trench 190 and the rounding portion 191. However, as described above, the thickness of the oxide film is increased due to the history of a plurality of oxidation treatments, so that a parasitic capacitance between the gate electrode in the RCAT and the source/drain diffusion layer can be reduced, leading to improved element characteristics. Similarly, when the thickness of with the capacitor insulating film 32 is smaller, the capacitance of the capacitor is reduced. This means that the capacitor cannot obtain a predetermined large capacitance.

It is therefore desirable for the characteristic improvement of both the RCAT and capacitor used in the resistance change type memory according to the present embodiment to carry out the manufacturing process shown in FIG. 49 and FIG. 50.

FIG. 49 is a sectional view showing a step of the method of manufacturing the resistance change type memory according to the present embodiment.

After the rounding portion 191 is formed at the bottom of the trench 190, a mask layer 127 having a predetermined mask pattern is formed on the semiconductor substrate 100 by the photolithographic technique. The mask layer 127 covers the entire upper surface of the memory cell array 61. On the other hand, the mask layer 127 has an opening that exposes the trench 190 and the rounding portion 191 in the capacitor region 71.

After the mask layer 127 is formed, the oxide film on the side surface of the trench 190 in the capacitor region 71 is removed by, for example, wet etching.

Since the memory cell array 61 is covered with the mask layer 127, the oxide film 22 on the side surface of the trench 190 is not removed even if the semiconductor substrate 100 is wet-etched.

FIG. 50 is a sectional view showing a step of the method of manufacturing the resistance change type memory according to the present embodiment.

After the mask layer is removed, the semiconductor substrate 100 is thermally oxidized. As a result, in the memory cell array 61 and the capacitor region 71, the insulating films 22A, 22B, 32A, 32B are formed in the trench 190 and the rounding portion 191.

In the capacitor region 71, the insulating films 32A, 32B are formed so that the surface of the semiconductor region 30 is exposed in the trench 190 and the rounding portion 191.

Similarly, in the memory cell array 61, the insulating film 22B is formed so that that the surface of the semiconductor region (active region) 20 in the rounding portion 191 is exposed.

Therefore, the thickness of the insulating film 22B in the memory cell array 61 is the same as that of the oxide films 32A, 32B in the capacitor region 71.

On the other hand, the insulating film 22A in the memory cell array 61 is formed in a condition where the side surface of the trench 190 is covered with the insulating film. Since the side surface of the trench 190 covered with the insulating film is oxidized, the insulating film 22A on the side surface of the trench 190 in the memory cell array 61 is thicker than the insulating films 22B, 32B, 33B in other trenches 190 and rounding portions 191.

Thus, in the memory cell array 61, the thickness of the insulating film 22A in a part where a parasitic capacitance is generated can be larger, and the capacitor insulating films 32A, 32B having a small thickness can be formed in the capacitor region 71.

This makes it possible to inhibit the characteristic deterioration of the RCAT originating in the parasitic capacitance without the reduction of the capacitance of the capacitor.

Subsequently, for example, polysilicon is embedded into the formed trenches 190, 191, and a gate electrode 21 and a capacitor electrode 31 having rounding portions 26B, 36B are formed.

As described above, according to the method of manufacturing the resistance change type memory in Configuration example 2 of the present embodiment, it is possible to relatively easily provide a resistance change type memory including a capacitor with a large capacitance.

CONFIGURATION EXAMPLE 3

The structure of the resistance change type memory according to Configuration example 3 of the present embodiment is described with reference to FIG. 51. FIG. 51 shows the sectional structures of the memory cell and the capacitor along the y-direction. In FIG. 51, the interlayer insulating films covering the elements on the chip are not shown.

In the capacitor region 71, the dimension (third dimension) $D_D$ of the opening of the capacitor trench 190 is the same dimension $D_B$ (second dimension) as the diameter of the rounding portion, and the capacitor trench 190 having the dimension $D_D$ extends in a direction perpendicular to the substrate (depth direction).

Thus, the capacitor trench and the capacitor electrode embedded in this trench are not constricted due to the rounding portion 92. Thus, according to this configuration example, the oxide film at the junction of the upper capacitor electrode portion and the rounding portion is not discontinuous, and failure in the breakdown voltage of the capacitor insulating film 22 or local electric field concentration can be reduced.

In addition, the memory cell and the capacitor shown in FIG. 51 are manufactured in the following manner.

In the manufacturing step shown in FIG. 48, after the insulating film at the bottom of the trench 190 are removed, a mask layer having an opening for exposing the capacitor region 71 is formed on the semiconductor substrate 100 without the implementation of the CDE method for forming the rounding portion 191.

Subsequently, the insulating film 32 on the side surface of the trench 190 in the capacitor region 71 is selectively removed by, for example, wet etching. As the memory cell array 61 is covered with the mask layer, the insulating film 22 on the side surface of the trench 190 is not removed.

After the insulating film 32 on the side surface of the trench 190 in the capacitor region 71 is removed, isotropic etching for forming the rounding portion 191 is carried out as in the manner described in the manufacturing step shown in FIG. 48. Thus, the surfaces of the semiconductor regions 20, 30 which are exposed in the trench 190 are etched.

In the memory cell array 61, the side surface of the semiconductor region 20 located in the vicinity of the opening of the trench 190 is covered with the insulating film 22. Thus, the semiconductor region 20 in the upper part of the trench 190 is not etched. Therefore, in the memory cell array 61, the bottom of the trench 190 is only etched, and the rounding portion 191 is formed.

On the contrary, in the capacitor region 71, the insulating film on the bottom and side surface of the trench 190 is removed, so that not only the bottom of the trench 190 but also the side surface of the semiconductor region 30 located in the vicinity of the opening of the trench 190 is etched. The opening of the capacitor trench 190 has the dimension $D_D$, and the capacitor trench 190 extends, with the dimension $D_D$, in the depth direction of the semiconductor substrate 100. Therefore, the dimension $D_D$ of the capacitor trench 190 of the capacitor region 71 in a direction parallel to the surface of the substrate is larger than the dimension $D_A$ of the opening of the RCAT trench 190 in the memory cell array 61 in a direction parallel to the surface of the substrate. The dimension $D_D$ is substantially the same as the maximum dimension (diameter) $D_B$ of the rounding portion 191 in a direction parallel to the surface of the substrate.

Subsequently, as in the manufacturing step shown in FIG. 50, an insulating film is formed in the trench 190 and the rounding portion 191, and the gate electrode and the capacitor electrode are embedded into the trench 190 and the rounding portion 191.

Consequently, according to Configuration example 3 of the present embodiment, it is possible to provide a resistance change type memory including a capacitor with a large capacitance, and improve the characteristics of the select transistor and the capacitor.

CONFIGURATION EXAMPLE 4

The structure of the resistance change type memory according to Configuration example 4 of the present embodiment is described with reference to FIG. 52. FIG. 52 shows the sectional structures of the memory cell and the capacitor along the x-direction. In FIG. 52, the interlayer insulating films covering the elements on the chip are not shown. In FIG. 52, members located far or near in the depth direction of the diagram are indicated by broken lines.

In the RCAT 2 as the select transistor, the bottom of the trench and the bottom of the gate electrode 21 may have a saddle structure 20S. The saddle structure is such a structure that, in the structure of the bottom of the gate electrode in the channel width direction, the gate electrode 21 not only covers the upper surface of the channel region (active region) but also covers both side surfaces of the channel region in the channel width direction (x-direction) via the gate insulating film. In other words, the saddle structure is a structure in which the active region has a fin portion at the bottom of the trench. This fin portion has a first side surface, a second side surface facing the first side surface, and an upper surface that connects the first side surface and second side surface.

The RCAT having such a gate electrode-channel region structure is also referred to as a saddle fin transistor.

Thus, the structure between the bottom of the gate electrode 21 and the channel region has the saddle structure 20S, so that the substantial channel length and channel width of the transistor is increased, and leakage characteristics of the RCAT can be improved.

In the capacitor 3, the bottom of the capacitor electrode 31 has a saddle structure 30S. This makes it possible to increase the area in which the semiconductor region 30 as the component of the capacitor faces the capacitor electrode 31. Thus, the capacitance of the capacitor 3 having the capacitor electrode 31 of the saddle structure is increased.

The gate electrode 21 and the capacitor electrode 31 having the saddle structure are formed, for example, in the following manner: After the trench 190 for embedding the electrode is formed in the semiconductor substrate, the side surface of the isolation insulating film embedded in the semiconductor substrate is etched via the formed trench. As a result, the side surface of the semiconductor substrate is exposed at the bottom of the groove. Further, as in the manufacturing process described above, the insulating film 22 and the capacitor insulating film 32 are formed along the side surface of the trench, and the gate electrode and the capacitor electrode are embedded into the trenches. Thus, the gate electrode having the saddle structure is formed.

As described above, according to Configuration example 4 of the present embodiment, it is possible to provide a resistance change type memory including a capacitor with a large capacitance, and improve the characteristics of the select transistor and the capacitor.

CONFIGURATION EXAMPLE 5

Figure 53:
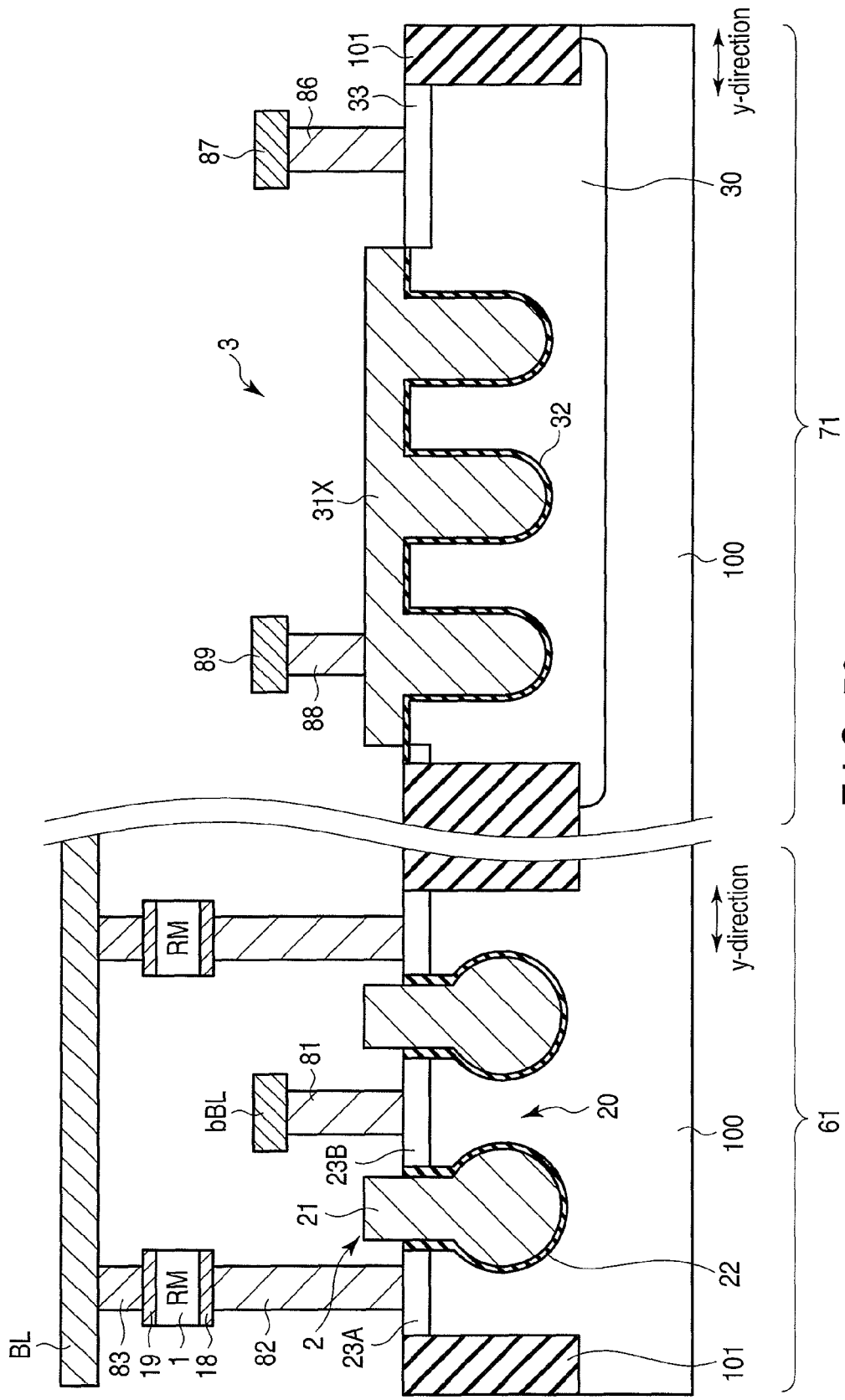
FIG. 53 is a sectional view for illustrating Configuration example 5 of the resistance change type memory according to the second embodiment.

The structure of the resistance change type memory according to Configuration example 5 of the present embodiment is described with reference to FIG. 53 and FIG. 54. FIG. 53 and FIG. 54 show the sectional structures of the memory cell and the capacitor along the x-direction. In FIG. 53 and FIG. 54, the interlayer insulating films covering the elements on the chip are not shown.

In the example described above, the separate capacitor electrode is embedded in each capacitor trench in the capacitor region 71. In this case, the capacitor has substantially the same structure as the RCAT which serves as the select transistor. Therefore, the capacitor and the memory cell conform well with each other from the perspective of the layout on the substrate and the manufacturing process. Moreover, a breakdown voltage across the semiconductor region and the capacitor electrode for one capacitor is satisfactory.

However, when the capacitor requires a large capacitance, the common capacitor electrode 31 may be embedded in a plurality of capacitor trenches as shown in FIG. 53. In this case, the semiconductor region 30 and a capacitor electrode 31X that make a pair have a interdigital sectional shape.

The capacitor electrode 31X extends across a plurality of capacitor trenches in the capacitor region 71, and is continuous within the capacitor trench and on the upper surface of the semiconductor region 30. Similarly, the capacitor insulating film 32 is also continuous within a plurality of capacitor trenches and on the semiconductor region.

A potential is supplied to the capacitor electrode 31X via the contact plug 88 and the interconnect 89. Therefore, a common potential is supplied to parts of the capacitor electrode 31X embedded in the trenches.

The capacitor 3 shown in FIG. 53 can not only ensure the area in which the electrodes face each other along the side surface and bottom surface of the trench but can also ensure the area in which the semiconductor region and the capacitor electrode face each other between the capacitor electrode 31X and the upper surface of the semiconductor region 30 that is located between adjacent capacitor trenches. Thus, the capacitance of the capacitor 3 can be increased.

As shown in FIG. 54, a corner 195 in the upper part of the semiconductor region 30 as the component of the capacitor may be rounded at the upper end of the trench. In this case, the electric field concentration in the upper part of the semiconductor region 30 is eased as compared with the case where the upper part of the semiconductor region 30 is sharp as shown in FIG. 53. Thus, deterioration of the breakdown voltage can be suppressed in the capacitor 3 having the capacitor electrode 31X which is continuous over a plurality of capacitor trenches.

For example, as shown in FIG. 54, the corner in the upper part of the semiconductor region 30 is rounded by the following manufacturing step.

In the step shown in FIG. 48, after the oxide film on the bottom of the trench 190 is removed, the mask layer in the capacitor region 71 is removed without the implementation of the isotropic etching for forming the rounding portion 191.

Furthermore, the insulating film on the side surface of the trench 190 in the capacitor region 71 is removed. In this case, since the mask layer in the capacitor region 71 is removed, the insulating film (e.g., a native oxide film or bird's beak) on the upper part of the semiconductor region 30 is removed.

Subsequently, isotropic etching for forming a rounding portion at the bottom of the capacitor trench is carried out. As a result of this isotropic etching, the rounding portion 191 is formed at the bottom of the trench 190 in the memory cell array 61, and at the same time, the upper part (the opening of the capacitor trench) of the semiconductor region 30 in the capacitor region 71 is etched. Thus, the corner in the upper part of the semiconductor region 30 as the component of the capacitor is rounded in the capacitor region 71.

In addition, the capacitor electrode 31X extending across a plurality of capacitor trenches is formed by forming a mask pattern so that the conducting layer is not divided between adjacent capacitor trenches.

As described above, according to Configuration example 5 of the present embodiment, it is possible to provide a resistance change type memory including a capacitor with a large capacitance.

CONFIGURATION EXAMPLE 6

The structure of the resistance change type memory according to Configuration example 6 of the present embodiment is described with reference to FIG. 55 to FIG. 59. FIG. 55 to FIG. 59 show the sectional structures of the memory cell and the capacitor along the x-direction. In FIG. 55 to FIG. 59, the interlayer insulating films covering the elements on the chip are not shown.

As in the case described with reference to FIG. 27 to FIG. 31 in the first embodiment, the capacitor 3 according to the present embodiment may include the same components as the components of the resistance change type storage element 1 and the electrode layers 18, 19.

That is, as shown in FIG. 55, a second capacitor insulating film 35 is formed on the capacitor electrode 31 which is made of the same material as the gate electrode 21.

For example, a conducting layer 18A, a conductor 1A and a conducting layer 19A are stacked in order on the second capacitor insulating film 35. A contact plug $88_1$ is provided on the conducting layer 19A. The contact plug $88_1$ is connected to an interconnect $89_1$.

As described above, the conducting layer 18A is formed simultaneously with a lower electrode layer 18 using the same material, and the conducting layer 19A is formed simultaneously with an upper electrode layer 19 using the same material. The conductor 1A is formed simultaneously with the resistance change type storage element 1 using the same material. In addition, the conductor 1A does not necessarily have to include all the components of the resistance change type storage element 1.

Thus, the capacitance of the capacitor is formed so that the capacitor insulating film 35 intervenes between the capacitor electrode 31 made of the same material as the gate electrode 21 and the conductor 1A made of the same material as the resistance change type storage element 1 (or electrode layer).

Figure 56:
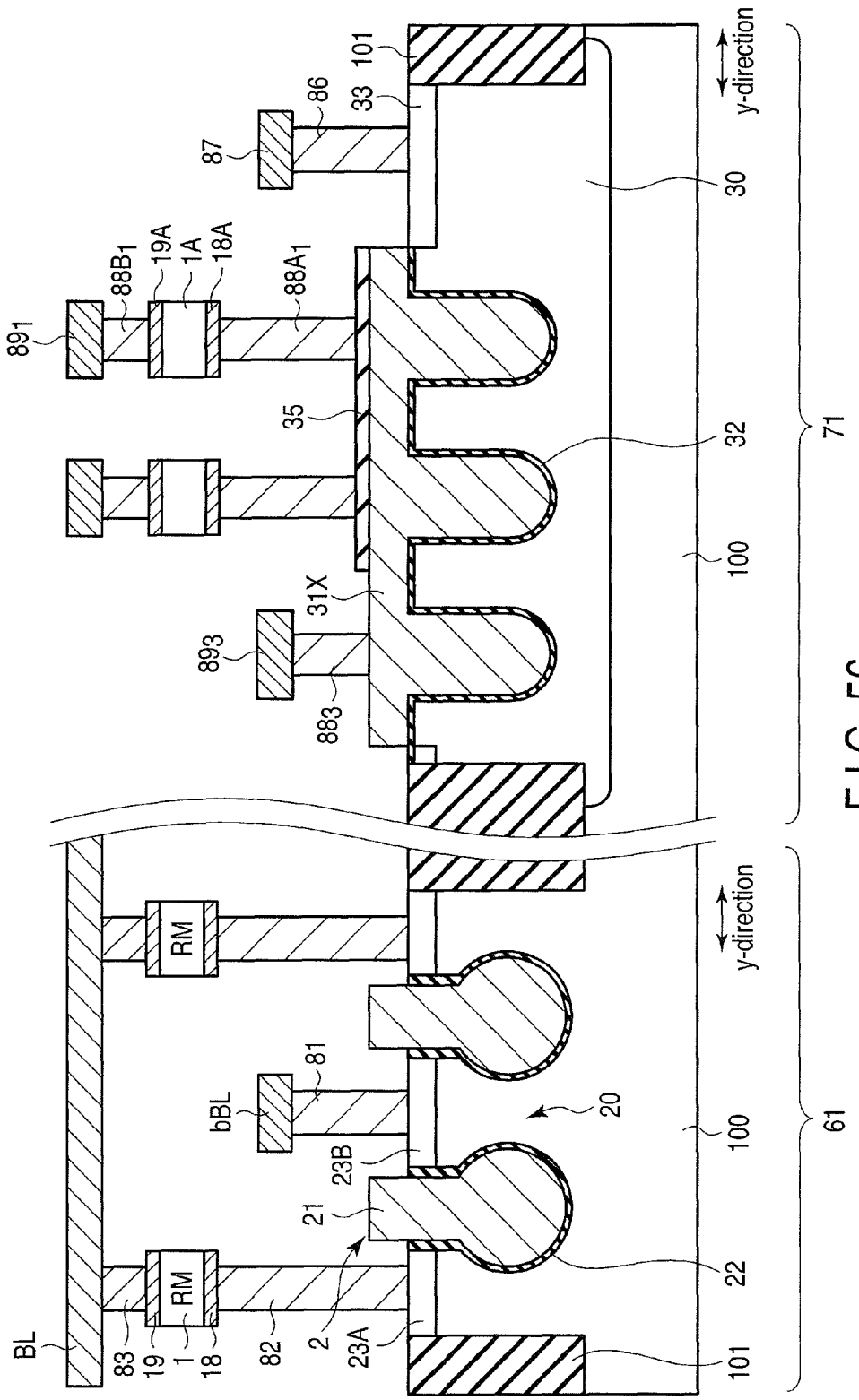
FIG. 56 is a sectional view for illustrating Configuration example 6 of the resistance change type memory according to the second embodiment.

As shown in FIG. 56, the same member $88_{A1}$ as the contact plug or interconnect may be provided between the capacitor insulating film 35 and the conductor 1A, as in the example described with reference to FIG. 28.

Figure 57:
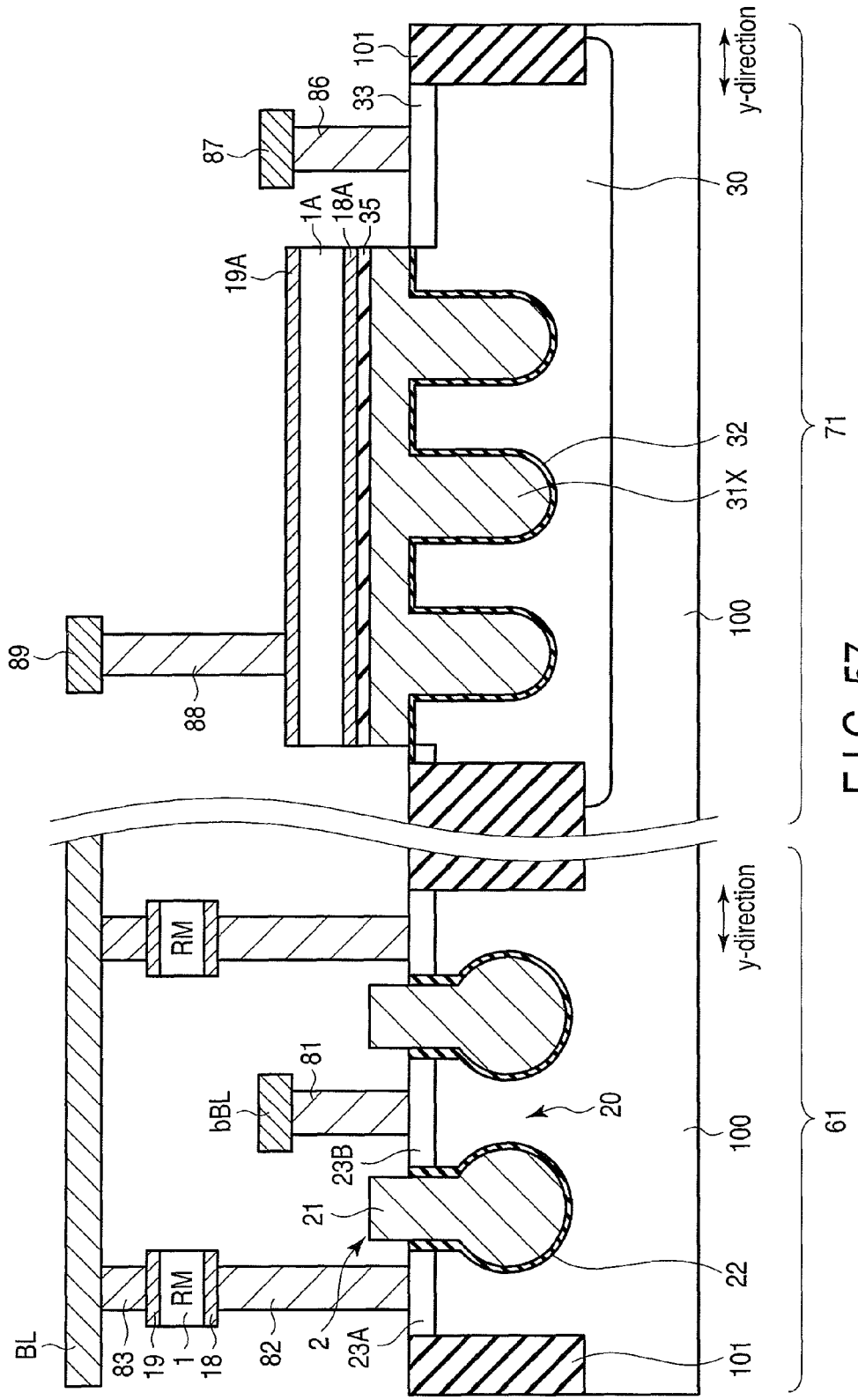
FIG. 57 is a sectional view for illustrating Configuration example 6 of the resistance change type memory according to the second embodiment.

As shown in FIG. 57, the dimension of the conductor 1A in a direction parallel to the surface of the substrate may be larger than the dimension of the resistance change type storage element 1 in a direction parallel to the surface of the substrate, as in the example described with reference to FIG. 29. Thus, the area in which the capacitor insulating film 35 and the conductor 1A face each other can be larger, and the capacitance generated between the capacitor insulating film 35 and the conductor 1A can be increased. If the planarity and etching difficulty of the conductor 1A are taken into consideration, the density rule of the conductor 1A in relation to the capacitor region 72 is preferably set at 25% to 70%.

As in the example described with reference to FIG. 30 and FIG. 31, the plane patterns of the conductor 1A and the conducting layers 18A, 19A may be different from the plane patterns of the resistance change type storage element 1 and the electrode layers 18, 19 in the memory cell array 61.

Figure 58:
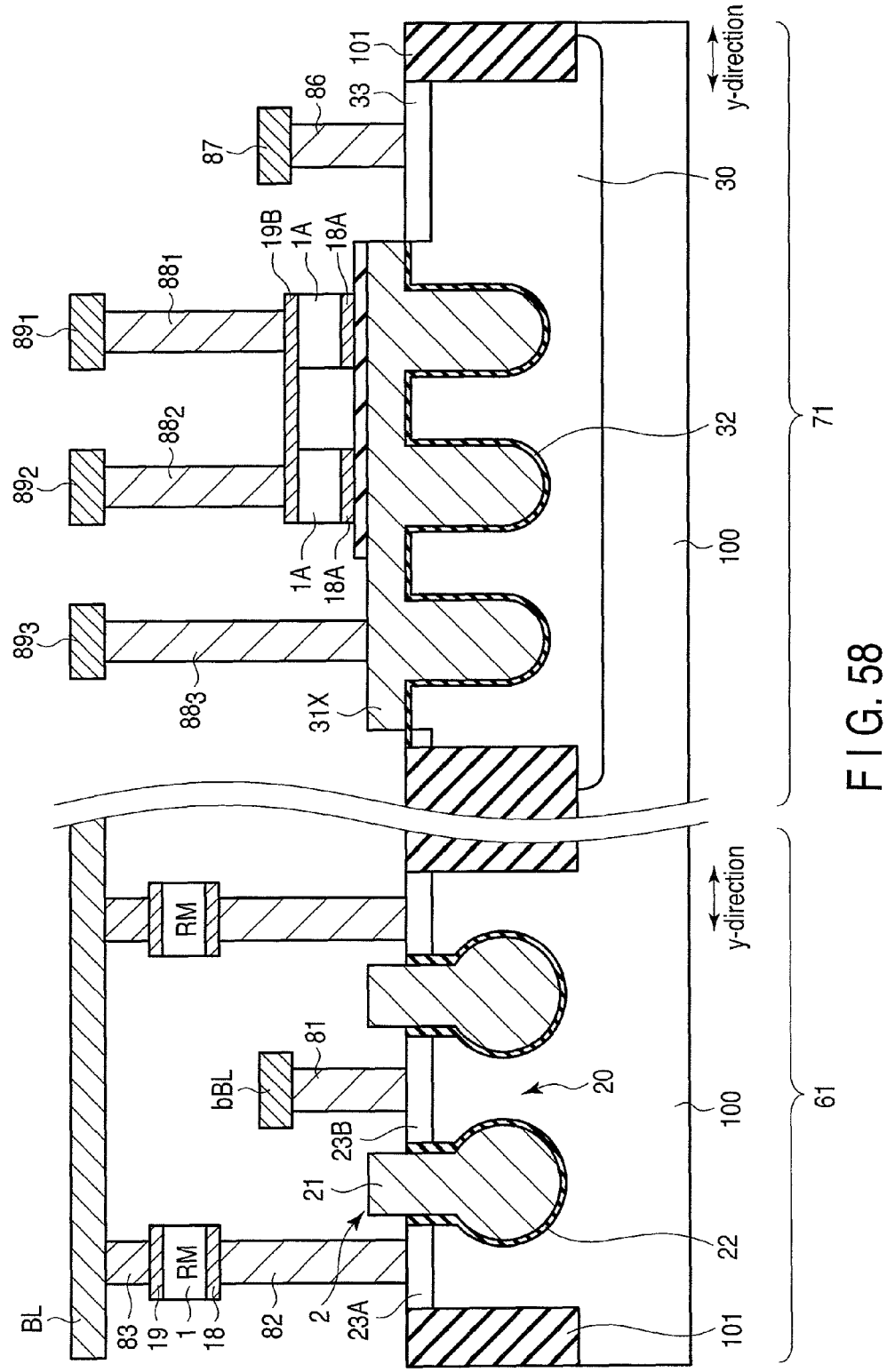
FIG. 58 is a sectional view for illustrating Configuration example 6 of the resistance change type memory according to the second embodiment.

That is, as shown in FIG. 58, a conducting layer 19B may be continuous on a plurality of conductors 1A. Also, as shown in FIG. 59, a conducting layer 18B may be continuous on the capacitor insulating film 35, and one common conducting layer 18B may be connected to a plurality of conductors 1A. This facilitates the step of forming the capacitor that includes the same configuration as the resistance change type storage element 1 and the electrode layers 18, 19.

Consequently, according to Configuration example 6 of the present embodiment, it is possible to provide a resistance change type memory including a capacitor with a large capacitance.

CONFIGURATION EXAMPLE 7

The structure of the resistance change type memory according to Configuration example 7 of the present embodiment is described with reference to FIG. 60.

Figure 60:
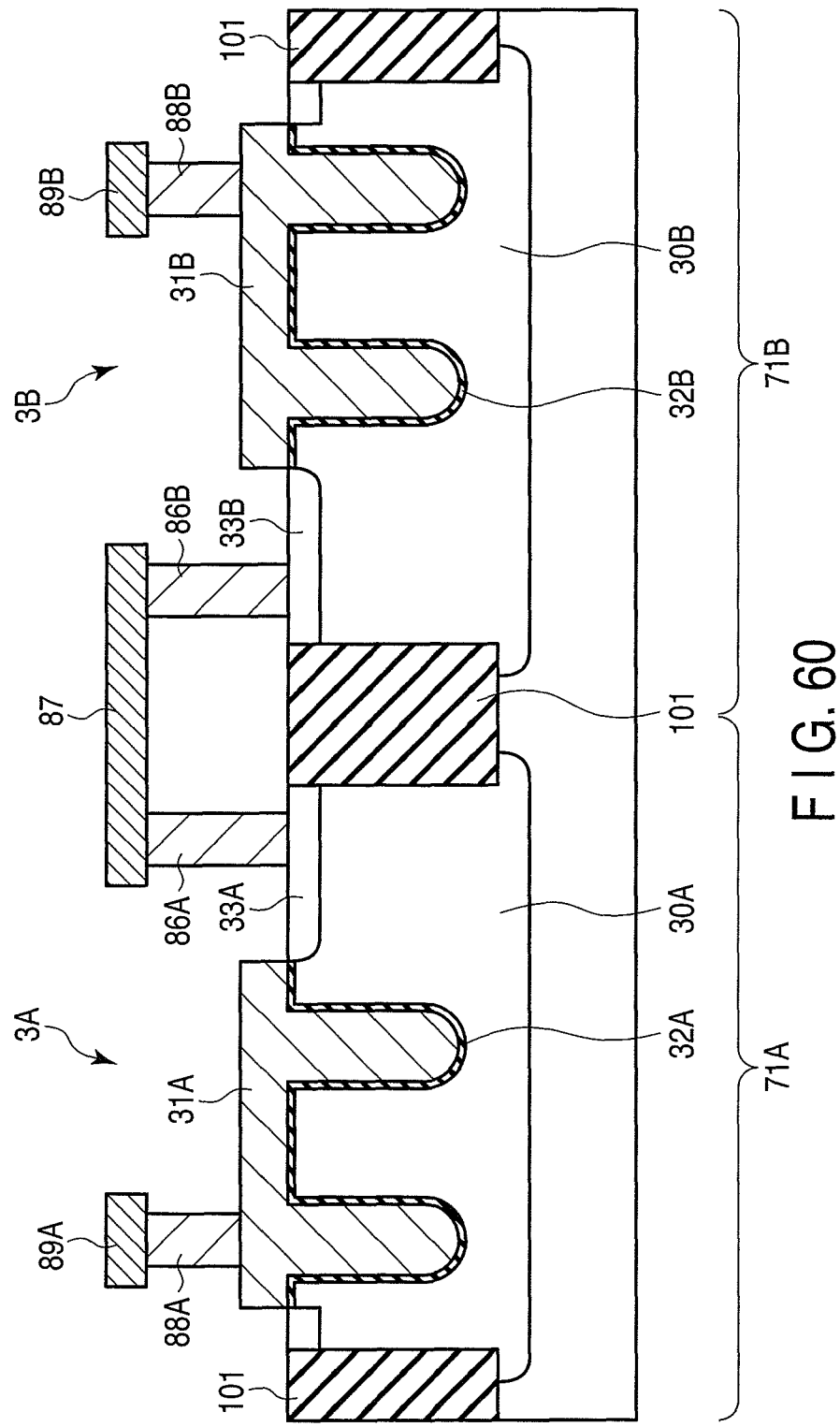
FIG. 60 is a sectional view for illustrating Configuration example 7 of the resistance change type memory according to the second embodiment.

As in the case described in the first embodiment, an effective area in which capacitors 3A, 3B are formed in capacitor regions 71A, 71B having a predetermined area, for example, the density rule of capacitor electrodes 31A, 31B in the capacitor regions 71A, 71B is preferably set at about 25% to 70%, as shown in FIG. 60. That is, the capacitor electrodes 30A, 30B, 31A, 31B are preferably processed into predetermined sizes to satisfy the above-mentioned density rule.

As a result, the planarity of the components of the capacitor can be improved. Moreover, the difficulty of the processing of the capacity can be reduced in the manufacturing process of the resistance change type memory.

Furthermore, in FIG. 60, two capacitors, 3A, 3B are connected in series. Thus, the dielectric breakdown of the capacitor insulating films 32A, 32B can be inhibited, as in the case described with reference to FIG. 33. Therefore, a highly reliable resistance change type memory can be formed.

As described above, according to Configuration example 6 of the present embodiment, it is possible to provide a resistance change type memory including a capacitor with a large capacitance.

<Modification>

A modification of the resistance change type memory according to the first and second embodiments is described with reference to FIG. 61 and FIG. 62.

In the first and second embodiments, the MRAM is shown as an example of the resistance change type memory. However, it should be appreciated that the first and second embodiments are applicable to any other resistance change type memory as well as the MRAM, such as a resistive RAM (ReRAM) or a phase change RAM (PCRAM), as long as the resistance change type memory includes a select transistor having a gate electrode that faces the side surface of a semiconductor region, and a capacitor provided with an insulator between the side surface of the semiconductor region and a conducting layer.

For example, a variable resistive element is used for a memory element in the ReRAM. The memory element used in the ReRAM reversibly changes its resistance value due to energy such as a voltage, a current or heat, and retains the state with the changed resistance value in a nonvolatile manner.

FIG. 61 shows a structure example of the memory element (variable resistive element) used in the ReRAM.

FIG. 61 is a schematic diagram showing the configuration of a resistance change type storage element 1 used in the ReRAM. The resistance change type storage element (variable resistive element) 1 includes a lower electrode 13A, an upper electrode 13B, and a storage layer 14 intervening therebetween. The lower and upper electrodes 13A, 13B may be the electrode layers 18, 19 described above, or may be different in configuration from the electrode layers 18, 19.

The storage layer 14 is made of a transition metal oxide such as a perovskite-like metal oxide or a binary metal oxide. The perovskite-like metal oxide includes, for example, PCMO ($Pr_{0.7}Ca_{0.3}MnO_3$), Nb-added $SrTi(Zr)O_3$ and Cr-added $SrTi(Zr)O_3$. The binary metal oxide includes, for example, $NiO$, $TiO_2$ and $Cu_2O$.

The variable resistive element 1 includes an element of an operation mode called a bipolar type and an element of an operation mode called a unipolar type. The bipolar type element 1 changes its resistance value in accordance with the change of the polarity of a voltage applied thereto. The unipolar type element 1 changes its resistance value in accordance with the change of the absolute value and/or pulse width of a voltage applied thereto. Thus, the resistance change type storage element 1 is set at a low resistance state or a high resistance state by the control of the applied voltage. Whether the element is the bipolar type or the unipolar type depends on the material of the storage layer 14 to be selected.

For example, when the bipolar type resistance change type storage element 1 is used, a voltage for shifting the resistance change type storage element 1 from the high resistance state (reset state) to the low resistance state (set state) is a set voltage Vset, while a voltage for shifting the element from the low resistance state (set state) to the high resistance state (reset state) is a reset voltage Vreset.

The set voltage Vset is set to a positive bias for applying a positive voltage to the upper electrode 13B as opposed to the lower electrode 13A, while the reset voltage Vreset is set to a negative bias for applying a negative voltage to the upper electrode 13B as opposed to the lower electrode 13A. Further, the low resistance state and the high resistance state are matched with data "0" and data "1", respectively, such that the variable resistive element 1 as the resistance change type storage element can store one-bit data.

For reading data, a sufficiently low read voltage which is about 1/1000 to 1/4 of the reset voltage Vreset is applied to the resistance change type storage element 1. Then, a current presently running through the resistance change type storage element 1 of the ReRAM is detected such that data can be read.

In the PCRAM, a phase change element is used for a memory element. The crystalline phase of the phase change element reversibly changes from a crystalline state to a noncrystalline state or from a noncrystalline state to a crystalline state due to externally applied energy. As a result of the change of the crystalline phase, the resistance value (impedance) of the phase change element changes. The condition in which the crystalline phase of the phase change element has changed is retained in a nonvolatile manner until energy necessary to change the crystalline phase is provided.

FIG. 62 shows a structure example of the memory element (phase change element) used in the PCRAM. A resistance change type storage element 1 includes a lower electrode 15A, a heater layer 16, a storage layer 17 and an upper electrode 15B that are stacked in order. The lower and upper electrodes 15A, 15B may be the electrode layers 18, 19 described above, or may be different in configuration from the electrode layers 18, 19.

The storage layer 17 is made of a phase-change material, and is set into a crystalline state and noncrystalline state by heat generated during writing. The material of the storage layer 17 includes chalcogen compounds such as Ge—Sb—Te, In—Sb—Te, Ag—In—Sb—Te and Ge—Sn—Te. These materials are preferable in ensuring high-velocity switching characteristics, repeated recording stability and high reliability.

The heater layer 16 is in contact with the bottom surface of the storage layer 17. The area of contact of the heater layer 16 with the storage layer 17 is preferably smaller than the area of the bottom surface of the storage layer 17. The purpose of this is to decrease a write current or voltage by reducing the contact part between the heater layer 16 and the storage layer 17 to reduce a heated part. The heater layer 16 is made of a conducting material, and is preferably made of, for example, a material selected from the group consisting of TiN, TiAlN, TiBN, TiSiN, TaN, TaAlN, TaBN, TaSiN, WN, WAlN, WBN, WSiN, ZrN, ZrAlN, ZrBN, ZrSiN, MoN, Al, Al—Cu, Al—Cu—Si, WSi, Ti, Ti—W and Cu. Moreover, the heater layer 16 may be made of the same material as the lower electrode 15A described later.

The area of the lower electrode 15A is larger than the area of the heater layer 16. The upper electrode 15B has, for example, the same planar shape as the storage layer 17. The material of the lower electrode 15A and the upper electrode 15B includes a high melting point metal such as Ta, Mo or W.

The heating temperature of the storage layer 17 changes by controlling the intensity of a current pulse applied thereto or the width of the current pulse, such that the storage layer 17 changes into the crystalline state or noncrystalline state. Specifically, in writing, a voltage or current is applied across the lower electrode 15A and the upper electrode 15B, and a current is passed to the lower electrode 15A from the upper electrode 15B via the storage layer 17 and the heater layer 16. If the storage layer 17 is heated to near the melting point, the storage layer 17 changes into a noncrystalline phase (high-resistance phase), and maintains the noncrystalline state even when the application of the voltage or current is stopped.

On the other hand, a voltage or current is applied across the lower electrode 15A and the upper electrode 15B. If the storage layer 17 is heated to near a temperature suitable for crystallization, the storage layer 17 changes into a crystalline phase (low-resistance phase), and maintains the crystalline state even when the application of the voltage or current is stopped. When the storage layer 17 is changed into the crystalline state, the set intensity of the current pulse applied to the storage layer 17 is lower and the set width of the current pulse is larger than, for example, when the storage layer 17 is changed into the noncrystalline state. Thus, a voltage or current is applied across the lower electrode 15A and the upper electrode 15B to heat the storage layer 17, such that the resistance value of the storage layer 17 can be changed.

Whether the storage layer 17 is in the crystalline phase or the noncrystalline phase can be known by applying, across the lower electrode 15A and the upper electrode 15B, such a low voltage or low current that does not cause the storage layer 17 to be crystalline or noncrystalline and reading the voltage or current across the 15A and the upper electrode 15B. Thus, the low resistance state and the high resistance state are matched with data "0" and data "1", respectively, such that one-bit data can be read from the resistance change type storage element 1 of the PCRAM.

As described above, in the resistance change type memory according to the present embodiment, the variable resistive element or phase change element may be used as the resistance change type storage element 1 instead of the magnetoresistive effect element (MTJ element).

[Addition]

The capacitor in the resistance change type memory according to the present embodiment is applied to, for example, a chip stabilizing circuit or charge pump circuit.

In the present embodiment, the memory cell of the resistance change type memory has a configuration (1R+1Tr) in which one select transistor is connected to one resistance change type storage element. However, the present embodiment is not limited to the 1R+1Tr type memory cell. It should be appreciated that the memory cell may have, for example, a configuration 1R+2Tr in which two select transistors are connected to one resistance change storage element or may have a 2R+2Tr type configuration.

Furthermore, it should be appreciated that the resistance change type memory according to the present embodiment is not limited to the layout of the memory cells in the memory cell array described above or the layout of the bit lines that make a bit line pair.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change type memory comprising:
a memory cell and a capacitor which are provided on a semiconductor substrate;
the memory cell including a resistance change type memory and a select transistor, the resistance change type storage element which changes in resistance value in accordance with data to be stored, and the select transistor including a first semiconductor region provided in the semiconductor substrate, and a gate electrode facing the side surface of the first semiconductor region via a gate insulating film;
the capacitor including a second semiconductor region provided in the semiconductor substrate, a capacitor electrode facing the side surface of the second semiconductor region, and a first capacitor insulating film provided between the second semiconductor region and the capacitor electrode.

2. The resistance change type memory of claim 1, wherein
the first and second semiconductor regions are first and second fin portions, respectively,
the gate electrode makes a two-level crossing with respect to the first fin portion to cover both side surfaces of the first fin portion, and
the capacitor electrode makes a two-level crossing with respect to the second fin portion to cover both side surfaces of the second fin portion.

3. The resistance change type memory of claim 2, wherein
the gate electrode covers the upper surface of the first fin portion via an insulating film thicker than the gate insulating film, and
the capacitor electrode covers the upper surface of the second fin portion via the capacitor insulating film.

4. The resistance change type memory of claim 1, wherein
the first semiconductor region includes a first trench,
the second semiconductor region includes a second trench,
the gate electrode is embedded in the first trench via the gate insulating film, and
the capacitor electrode is embedded in the second trench via the capacitor insulating film.

5. The resistance change type memory of claim 4, wherein
the gate electrode includes a first gate electrode portion having a first dimension in a direction parallel to the surface of the semiconductor substrate, and a second gate electrode portion which has a circular sectional shape and which has a second dimension larger than the first dimension in a direction parallel to the surface of the semiconductor substrate, and
the capacitor electrode includes a first electrode portion having a third dimension in a direction parallel to the surface of the semiconductor substrate, and a second electrode portion having a fourth dimension equal to or more than the first dimension in a direction parallel to the surface of the semiconductor substrate.

6. The resistance change type memory of claim 1, wherein
the capacitor further includes a second capacitor insulating film on the capacitor electrode, and a conductor including part of the same component as the resistance change type storage element on the second capacitor insulating film.

7. A resistance change type memory comprising:
a memory cell and a capacitor which are provided on a semiconductor substrate;
the memory cell including a resistance change type storage element and a select transistor, the resistance change type storage element which stores data in accordance with a change in resistance state, and the select transistor including a first fin portion which is a first semiconductor region, and a gate electrode which makes a two-level crossing with respect to the fin portion via a gate insulating film;
the capacitor including at least one second fin portion which is a second semiconductor region, a first capacitor insulating film provided on the side surface of the second fin portion, and a capacitor electrode which makes a two-level crossing with respect to the second fin portion via the first capacitor insulating film.

8. The resistance change type memory of claim 7, wherein
an isolation insulating film is provided between the bottom of the gate electrode and the semiconductor substrate, and
the first capacitor insulating film is provided between the bottom of the capacitor electrode and the semiconductor substrate.

9. The resistance change type memory of claim 7, wherein
the capacitor electrode makes a two-level crossing with respect to a plurality of second fin portions via the upper surface of the semiconductor substrate.

10. The resistance change type memory of claim 7, wherein
the gate electrode covers the upper part of the first fin portion via an insulating film thicker than the gate insulating film, and
the capacitor electrode covers the upper part of the second fin portion via the first capacitor insulating film.

11. The resistance change type memory of claim 7, wherein
the capacitor further includes a second capacitor insulating film on the capacitor electrode, and a conductor including part of the same component as the resistance change type storage element on the second capacitor insulating film.

12. A resistance change type memory comprising:
a memory cell and a capacitor which are provided on a semiconductor substrate;
the memory cell including a resistance change type storage element and a select transistor, the a resistance change type storage element which stores data in accordance with a change in resistance state, and the select transistor including a first semiconductor region provided with a first trench, and a gate electrode embedded in the first trench via a gate insulating film;
the capacitor including a second semiconductor region provided with at least one second trench, a first capacitor insulating film provided on the second semiconductor region along the trench, and a capacitor electrode embedded in the second trench via the first capacitor insulating film.

13. The resistance change type memory of claim 12, wherein
the first trench includes
a first portion having a first dimension in a direction parallel to the surface of the semiconductor substrate and extending in a depth direction of the semiconductor substrate, and
a second portion which is connected to the bottom of the first portion and which has a circular sectional shape of a second dimension larger than the first dimension, and
the gate electrode includes
an upper gate electrode portion embedded in the first portion, and
a lower gate electrode portion having a circular sectional shape and embedded in the second portion.

14. The resistance change type memory of claim 13, wherein
the second trench includes
a third portion having a first dimension in a direction parallel to the surface of the semiconductor substrate and extending in the depth direction of the semiconductor substrate, and
a fourth portion which is connected to the bottom of the third portion and which has a circular sectional shape of a second dimension larger than the first dimension, and
the capacitor electrode includes
an upper capacitor electrode portion embedded in the third portion, and
a lower capacitor electrode portion having a circular sectional shape and embedded in the fourth portion.

15. The resistance change type memory of claim 14, wherein
a portion of the gate insulating film in contact with the lower gate electrode portion has a first thickness,
a portion of the gate insulating film in contact with the upper gate electrode portion has a second thickness larger than the first thickness, and
the capacitor insulating film has a third thickness smaller than the second thickness.

16. The resistance change type memory of claim 13, wherein
the second trench has the second dimension to extend in the depth direction of the semiconductor substrate.

17. The resistance change type memory of claim 12, wherein
the gate electrode has a saddle structure at the bottom of the first trench, and
the capacitor electrode has a saddle structure at the bottom of the second trench.

18. The resistance change type memory of claim 12, wherein
the capacitor electrode is provided on the second semiconductor region across the plurality of second trenches.

19. The resistance change type memory of claim 18, wherein
the end of the upper part of the second semiconductor region adjacent to an opening of the second trench is rounded.

20. The resistance change type memory of claim 12, wherein
the capacitor further includes a second capacitor insulating film on the capacitor electrode, and a conductor including part of the same component as the resistance change type storage element on the second capacitor insulating film.

* * * * *